(12) United States Patent
Lin et al.

(10) Patent No.: US 12,167,608 B2
(45) Date of Patent: Dec. 10, 2024

(54) METHODS OF FORMING THREE-DIMENSIONAL MEMORY DEVICES

(71) Applicant: Taiwan Semiconductor Manufacturing Co., Ltd., Hsinchu (TW)

(72) Inventors: Meng-Han Lin, Hsinchu (TW); Han-Jong Chia, Hsinchu (TW); Sheng-Chen Wang, Hsinchu (TW); Feng-Cheng Yang, Zhudong Township (TW); Yu-Ming Lin, Hsinchu (TW); Chung-Te Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 46 days.

(21) Appl. No.: 17/981,608

(22) Filed: Nov. 7, 2022

(65) Prior Publication Data
US 2023/0076806 A1    Mar. 9, 2023

Related U.S. Application Data

(63) Continuation of application No. 17/112,606, filed on Dec. 4, 2020, now Pat. No. 11,495,618.
(Continued)

(51) Int. Cl.
*H10B 51/20* (2023.01)
*G11C 11/22* (2006.01)
(Continued)

(52) U.S. Cl.
CPC .......... *H10B 51/20* (2023.02); *G11C 11/2255* (2013.01); *H01L 23/5226* (2013.01);
(Continued)

(58) Field of Classification Search
CPC .......... H01L 23/5226; H01L 29/66666; H01L 29/66787; H01L 29/66833;
(Continued)

(56) References Cited

U.S. PATENT DOCUMENTS

| | | |
|---|---|---|
| 1,152,386 A | 8/1915 | Smith |
| 8,203,884 B2 | 6/2012 | Kito et al. |

(Continued)

FOREIGN PATENT DOCUMENTS

| | | |
|---|---|---|
| CN | 102971797 A | 3/2013 |
| CN | 103165617 A | 6/2013 |

(Continued)

OTHER PUBLICATIONS

Park, J. et al., "A hybrid ferroelectric-flash memory cells," J. Appl. Phys. 116, 124512, Sep. 29, 2014, 8 pages.

(Continued)

*Primary Examiner* — Matthew E Warren
(74) *Attorney, Agent, or Firm* — Slater Matsil, LLP

(57) ABSTRACT

In an embodiment, a device includes: a source line extending in a first direction; a bit line extending in the first direction; a back gate between the source line and the bit line, the back gate extending in the first direction; a channel layer surrounding the back gate; a word line extending in a second direction, the second direction perpendicular to the first direction; and a data storage layer extending along the word line, the data storage layer between the word line and the channel layer, the data storage layer between the word line and the bit line, the data storage layer between the word line and the source line.

20 Claims, 49 Drawing Sheets

Related U.S. Application Data

(60) Provisional application No. 63/058,628, filed on Jul. 30, 2020.

(51) Int. Cl.
  *H01L 23/522* (2006.01)
  *H01L 29/66* (2006.01)
  *H01L 29/78* (2006.01)
  *H10B 43/20* (2023.01)
  *H10B 43/27* (2023.01)
  *H10B 51/10* (2023.01)
  *H10B 51/30* (2023.01)

(52) U.S. Cl.
  CPC .. *H01L 29/66666* (2013.01); *H01L 29/66787* (2013.01); *H01L 29/66833* (2013.01); *H01L 29/78391* (2014.09); *H10B 43/20* (2023.02); *H10B 43/27* (2023.02); *H10B 51/10* (2023.02); *H10B 51/30* (2023.02)

(58) Field of Classification Search
  CPC ... H01L 29/78391; H10B 43/20; H10B 43/27; H10B 51/10; H10B 51/20; H10B 51/30; G11C 11/2255
  See application file for complete search history.

(56) References Cited

U.S. PATENT DOCUMENTS

| | | | |
|---|---|---|---|
| 8,470,671 B1 | 6/2013 | Lin et al. | |
| 8,847,302 B2 | 9/2014 | Alsmeier et al. | |
| 9,015,561 B1 | 4/2015 | Hu | |
| 9,240,420 B2 | 1/2016 | Rabkin et al. | |
| 9,355,727 B1 | 5/2016 | Zhang et al. | |
| 9,455,262 B2 | 9/2016 | Widjaja | |
| 9,502,265 B1* | 11/2016 | Jiang | H01L 29/42392 |
| 9,520,407 B2 | 12/2016 | Fukuzumi et al. | |
| 9,601,497 B1 | 3/2017 | Chen et al. | |
| 9,634,023 B2 | 4/2017 | Lee | |
| 9,640,547 B2 | 5/2017 | Mizukami et al. | |
| 9,806,202 B2 | 10/2017 | Yamazaki et al. | |
| 9,997,631 B2 | 6/2018 | Yang et al. | |
| 10,043,819 B1 | 8/2018 | Lai et al. | |
| 10,256,247 B1 | 4/2019 | Kanakamedala et al. | |
| 10,490,571 B2 | 11/2019 | Yoo et al. | |
| 10,515,981 B2 | 12/2019 | Or-Bach et al. | |
| 10,553,604 B2 | 2/2020 | Lu et al. | |
| 10,720,441 B2 | 7/2020 | Kam et al. | |
| 10,777,566 B2 | 9/2020 | Lue | |
| 10,868,042 B1 | 12/2020 | Zhang et al. | |
| 10,998,447 B2 | 5/2021 | Onuki et al. | |
| 11,011,529 B2 | 5/2021 | Ramaswamy | |
| 11,069,697 B1* | 7/2021 | Or-Bach | G11C 7/18 |
| 11,152,386 B2 | 10/2021 | Or-Bach et al. | |
| 11,171,157 B1 | 11/2021 | Lai et al. | |
| 11,205,659 B2 | 12/2021 | Zhu et al. | |
| 11,211,395 B2* | 12/2021 | Lung | G06F 7/5443 |
| 11,404,091 B2 | 8/2022 | Lin et al. | |
| 11,423,966 B2 | 8/2022 | Lin et al. | |
| 2006/0228859 A1 | 10/2006 | Willer | |
| 2007/0072439 A1 | 3/2007 | Akimoto et al. | |
| 2008/0265235 A1 | 10/2008 | Kamigaichi et al. | |
| 2011/0266604 A1 | 11/2011 | Kim et al. | |
| 2011/0298013 A1 | 12/2011 | Hwang et al. | |
| 2013/0148398 A1 | 6/2013 | Baek et al. | |
| 2014/0048868 A1 | 2/2014 | Kim et al. | |
| 2014/0264532 A1 | 9/2014 | Dennison et al. | |
| 2014/0264718 A1 | 9/2014 | Wada et al. | |
| 2015/0294977 A1 | 10/2015 | Kim et al. | |
| 2015/0380418 A1 | 12/2015 | Zhang et al. | |
| 2016/0012901 A1 | 1/2016 | Hsu et al. | |
| 2016/0086970 A1 | 3/2016 | Peng | |
| 2016/0086972 A1 | 3/2016 | Zhang et al. | |
| 2016/0163389 A1 | 6/2016 | Zhang et al. | |
| 2016/0181259 A1 | 6/2016 | Van Houdt et al. | |
| 2016/0204117 A1 | 7/2016 | Liu et al. | |
| 2016/0284811 A1 | 9/2016 | Yu et al. | |
| 2016/0322368 A1 | 11/2016 | Sun et al. | |
| 2017/0117290 A1 | 4/2017 | Lee et al. | |
| 2017/0148517 A1 | 5/2017 | Harari | |
| 2017/0154894 A1 | 6/2017 | Yoshimizu et al. | |
| 2017/0213843 A1 | 7/2017 | Choi | |
| 2017/0213846 A1 | 7/2017 | Lee | |
| 2017/0236831 A1 | 8/2017 | Kim | |
| 2017/0301684 A1 | 10/2017 | Park et al. | |
| 2018/0083018 A1 | 3/2018 | Yamakita et al. | |
| 2018/0130823 A1 | 5/2018 | Kim | |
| 2018/0269210 A1 | 9/2018 | Tezuka et al. | |
| 2018/0301415 A1 | 10/2018 | Mizukami et al. | |
| 2018/0315794 A1 | 11/2018 | Kamalanathan et al. | |
| 2019/0027493 A1* | 1/2019 | Kimura | H10B 41/41 |
| 2019/0058109 A1 | 2/2019 | Chen et al. | |
| 2019/0067325 A1 | 2/2019 | Yano | |
| 2019/0102104 A1 | 4/2019 | Righetti et al. | |
| 2019/0123061 A1 | 4/2019 | Liu | |
| 2019/0148286 A1 | 5/2019 | Or-Bach et al. | |
| 2019/0148393 A1 | 5/2019 | Lue | |
| 2019/0295626 A1 | 9/2019 | Ikeda et al. | |
| 2019/0312050 A1 | 10/2019 | Lai et al. | |
| 2019/0326308 A1 | 10/2019 | Pu et al. | |
| 2020/0006433 A1 | 1/2020 | Majhi et al. | |
| 2020/0013791 A1 | 1/2020 | Or-Bach et al. | |
| 2020/0013799 A1 | 1/2020 | Herner et al. | |
| 2020/0026990 A1 | 1/2020 | Lue | |
| 2020/0035701 A1 | 1/2020 | Huang et al. | |
| 2020/0058673 A1 | 2/2020 | Nishikawa et al. | |
| 2020/0075631 A1 | 3/2020 | Dong et al. | |
| 2020/0083248 A1* | 3/2020 | Uchida | H10B 43/27 |
| 2020/0098774 A1 | 3/2020 | Yeh et al. | |
| 2020/0105773 A1 | 4/2020 | Morris et al. | |
| 2020/0111920 A1 | 4/2020 | Sills et al. | |
| 2020/0119025 A1 | 4/2020 | Jiang et al. | |
| 2020/0185409 A1 | 6/2020 | Baek et al. | |
| 2020/0185411 A1 | 6/2020 | Herner et al. | |
| 2020/0194451 A1 | 6/2020 | Lee et al. | |
| 2020/0203329 A1 | 6/2020 | Kanamori et al. | |
| 2020/0227439 A1 | 7/2020 | Sato | |
| 2020/0295033 A1 | 9/2020 | Sakamoto et al. | |
| 2020/0303300 A1 | 9/2020 | Kato | |
| 2020/0343252 A1 | 10/2020 | Lai et al. | |
| 2020/0402890 A1 | 12/2020 | Chary et al. | |
| 2021/0036009 A1 | 2/2021 | Jung et al. | |
| 2021/0036019 A1 | 2/2021 | Sharangpani et al. | |
| 2021/0065805 A1 | 3/2021 | Choi et al. | |
| 2021/0066344 A1* | 3/2021 | Son | H01L 29/4916 |
| 2021/0335805 A1 | 10/2021 | Kai et al. | |
| 2021/0375847 A1 | 12/2021 | Chibvongodze et al. | |
| 2021/0375917 A1 | 12/2021 | Lu et al. | |
| 2021/0375927 A1 | 12/2021 | Chia et al. | |
| 2021/0375932 A1 | 12/2021 | Wang et al. | |
| 2021/0376153 A1 | 12/2021 | Lu et al. | |
| 2021/0391355 A1 | 12/2021 | Lill et al. | |
| 2021/0398593 A1* | 12/2021 | Song | G11C 16/0483 |
| 2021/0407569 A1 | 12/2021 | Young et al. | |
| 2021/0407845 A1 | 12/2021 | Wang et al. | |
| 2021/0407980 A1 | 12/2021 | Young et al. | |
| 2021/0408038 A1 | 12/2021 | Lin et al. | |
| 2021/0408044 A1 | 12/2021 | Chiang et al. | |
| 2021/0408045 A1 | 12/2021 | Chiang et al. | |
| 2021/0408046 A1 | 12/2021 | Chang et al. | |
| 2022/0005821 A1 | 1/2022 | Or-Bach et al. | |
| 2022/0036931 A1 | 2/2022 | Lin et al. | |
| 2022/0037253 A1 | 2/2022 | Yang et al. | |
| 2022/0037361 A1 | 2/2022 | Lin et al. | |
| 2022/0037362 A1 | 2/2022 | Lin et al. | |

FOREIGN PATENT DOCUMENTS

| | | |
|---|---|---|
| CN | 104112748 A | 10/2014 |
| CN | 104170061 A | 11/2014 |
| CN | 105359270 A | 2/2016 |
| CN | 106158877 A | 11/2016 |
| CN | 107871520 A | 4/2018 |

(56) References Cited

FOREIGN PATENT DOCUMENTS

| | | | |
|---|---|---|---|
| CN | 108401468 A | 8/2018 |
| CN | 108962902 A | 12/2018 |
| CN | 110114881 A | 8/2019 |
| CN | 110268523 A | 9/2019 |
| CN | 110416223 A | 11/2019 |
| CN | 110520985 A | 11/2019 |
| CN | 110800107 A | 2/2020 |
| CN | 111048518 A | 4/2020 |
| JP | 2007281199 A | 10/2007 |
| JP | 2009016400 A | 1/2009 |
| JP | 2011060958 A | 3/2011 |
| JP | 2017103328 A | 6/2017 |
| JP | 2019504479 A | 2/2019 |
| KR | 20080096432 A | 10/2008 |
| KR | 20140024632 A | 3/2014 |
| KR | 20150118648 A | 10/2015 |
| KR | 20170089378 A | 8/2017 |
| KR | 20170093099 A | 8/2017 |
| KR | 20180126323 A | 11/2018 |
| KR | 20180131118 A | 12/2018 |
| KR | 20190057065 A | 5/2019 |
| KR | 20190058157 A | 5/2019 |
| TW | 201114021 A | 4/2011 |
| TW | 201205576 A | 2/2012 |
| TW | 201624708 A | 7/2016 |
| TW | 201803131 A | 1/2018 |
| TW | I643317 B | 12/2018 |
| TW | I643318 B | 12/2018 |
| TW | 201909386 A | 3/2019 |
| TW | 201913963 A | 4/2019 |
| TW | 201926642 A | 7/2019 |
| TW | 201931577 A | 8/2019 |
| TW | 201944543 A | 11/2019 |
| TW | I681548 B | 1/2020 |
| TW | I692038 B | 4/2020 |
| TW | 202029353 A | 8/2020 |
| WO | 2016093947 A1 | 6/2016 |
| WO | 2017091338 A1 | 6/2017 |
| WO | 2019125352 A1 | 6/2019 |
| WO | 2019152226 A1 | 8/2019 |

OTHER PUBLICATIONS

Wu, B. et al., "High aspect ratio silicon etch: A review," J. Appl. Phys. 108, 051101 (2010): https://doi.,Jrg/10.1063/1.3474652, Sep. 9, 2010, 21 pages.

Karouta, F., "A practical approach to reactive ion etching," J. Phys. D: Appl. Phys. 47 (2014) 233501, May 8, 2014, 15 pages.

* cited by examiner

METHODS OF FORMING THREE-DIMENSIONAL MEMORY DEVICES

PRIORITY CLAIM AND CROSS-REFERENCE

This application is a continuation of U.S. patent application Ser. No. 17/112,606, filed on Dec. 4, 2020, entitled "Three-Dimensional Memory Device and Method," which claims the benefit of U.S. Provisional Application No. 63/058,628, filed on Jul. 30, 2020, which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FeRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
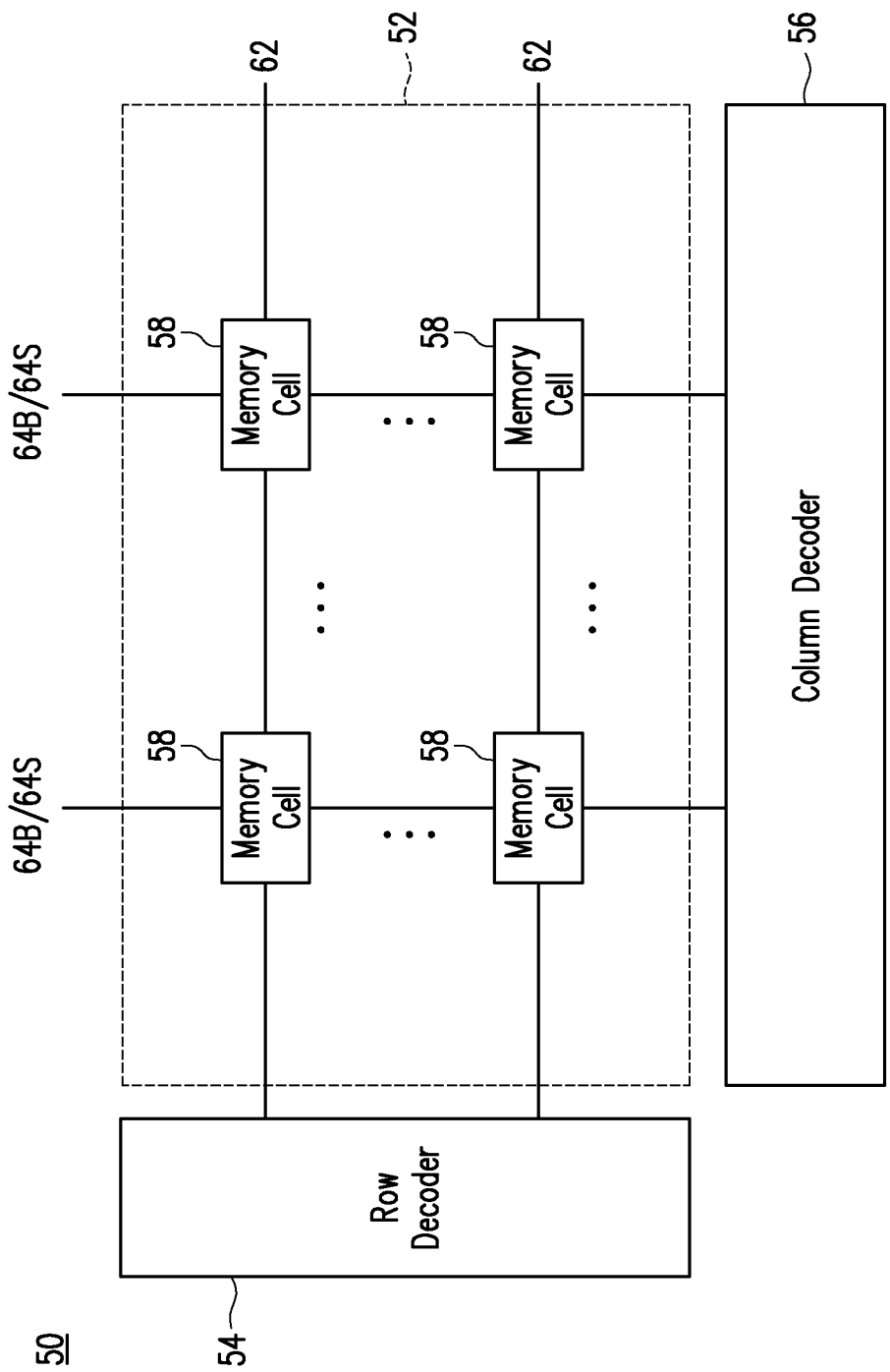
FIG. 1 is a block diagram of a random-access memory.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a three-dimensional memory array is formed of programmable thin film transistors (TFTs) having back gates. The data storage layers of the TFTs are disposed between the back gates and the word lines for the TFTs. During a write operation (e.g., an erase or programming operation) for a TFT, a biasing voltage is applied to the back gate of the TFT, thereby increasing the write voltage applied across the data storage layer of the TFT during the write operation. Increasing the write voltage applied across the data storage layer during the write operation can help increase the speed and accuracy of the write operation. The performance of the memory array may thus be improved.

FIG. 1 is a block diagram of a random-access memory 50. The random-access memory 50 includes a memory array 52, a row decoder 54, and a column decoder 56. The memory array 52, the row decoder 54, and the column decoder 56 may each be part of a same semiconductor die, or may be parts of different semiconductor dies. For example, the memory array 52 can be part of a first semiconductor die, while the row decoder 54 and the column decoder 56 can be parts of a second semiconductor die.

The memory array 52 includes memory cells 58, word lines 62, bit lines 64B, and source lines 64S. The memory cells 58 are arranged in rows and columns. The word lines 62, the bit lines 64B, and the source lines 64S are electrically connected to the memory cells 58. The word lines 62 are conductive lines that extend along the rows of the memory cells 58. The bit lines 64B and the source lines 64S are conductive lines that extend along the columns of the memory cells 58.

The row decoder 54 may be, e.g., a static CMOS decoder, a pseudo-NMOS decoder, or the like. During operation, the row decoder 54 selects desired memory cells 58 in a row of the memory array 52 by activating the word line 62 for the row. The column decoder 56 may be, e.g., a static CMOS decoder, a pseudo-NMOS decoder, or the like, and may include writer drivers, sense amplifiers, combinations thereof, or the like. During operation, the column decoder 56 selects the desired memory cells 58 from columns of the memory array 52 in the selected row, and reads data from or writes data to the selected memory cells 58 with the bit lines 64B and the source lines 64S.

Figure 2A:
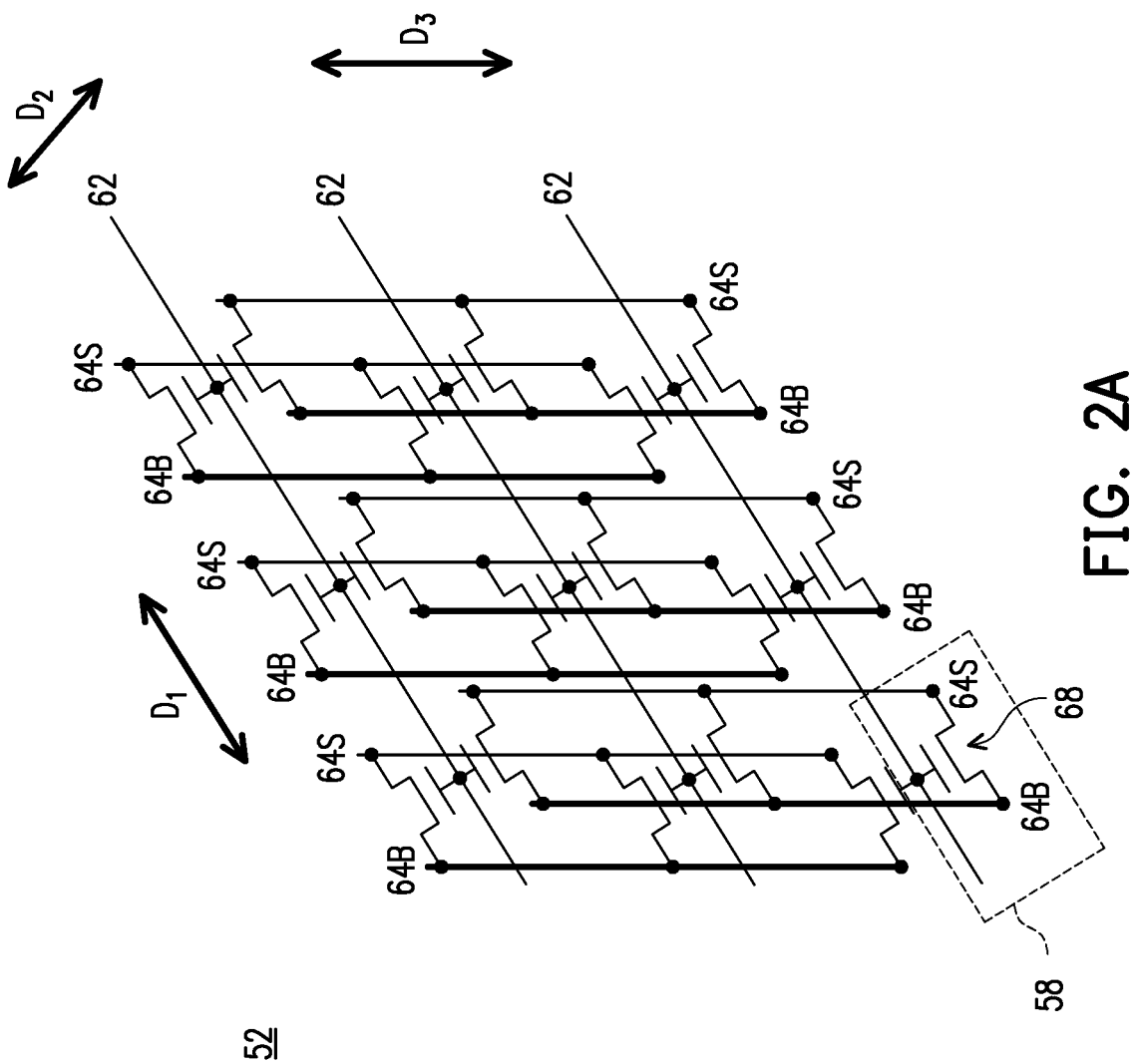
FIGS. 2A and 2B are various views of a memory array.
Figure 2B:
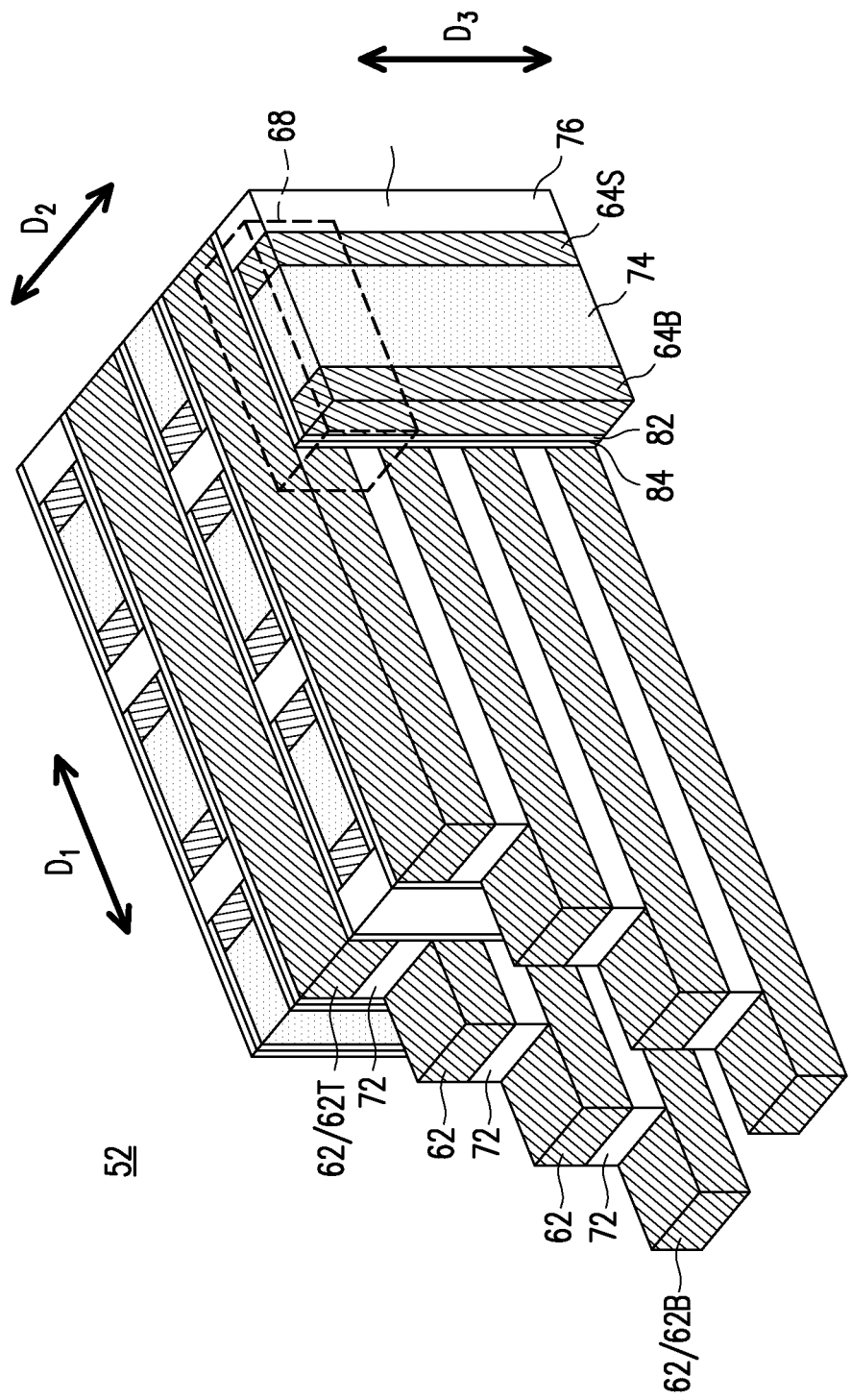

FIGS. 2A and 2B are various views of a memory array 52. FIG. 2A is a circuit diagram of the memory array 52. FIG. 2B is a three-dimensional view of a portion of the memory array 52, and is described in conjunction with FIG. 2A. Each memory cell 58 of the memory array 52 is a flash memory cell that includes a programmable TFT.

FIGS. 2A and 2B illustrate three perpendicular directions $D_1$, $D_2$, and $D_3$, which subsequent figures refer to for clarity of illustration. The first direction $D_1$ is parallel to a major surface of an underlying substrate. The second direction $D_2$ is perpendicular to the first direction $D_1$ and is parallel to the major surface of the underlying substrate. The third direction $D_3$ is perpendicular to the first direction $D_1$, the second direction $D_2$, and the major surface of the underlying substrate.

In some embodiments, the memory array 52 is a flash memory array, such as a NOR flash memory array. In some embodiments, the memory array 52 is another type of non-volatile memory array, such as a magnetoresistive random-access memory (MRAM) array, a resistive random-access memory (RRAM) array, or the like. Each of the memory cells 58 is a flash memory cell that includes a TFT 68. The gate of each TFT 68 is electrically connected to a respective word line 62, a first source/drain region of each TFT 68 is electrically connected to a respective bit line 64B, and a second source/drain region of each TFT 68 is electrically connected to a respective source line 64S (which are each electrically connected to ground). The memory cells 58 in a same row of the memory array 52 share a common word line 62 while the memory cells in a same column of the memory array 52 share a common bit line 64B and a common source line 64S.

The memory array 52 includes multiple horizontally arranged conductive lines (e.g., the word lines 62) with each of the word lines 62 disposed between dielectric layers 72. The word lines 62 extend in the first direction $D_1$. The word lines 62 may have a staircase arrangement such that lower word lines 62 are longer than and extend laterally past endpoints of upper word lines 62. For example, in FIG. 2B, multiple, stacked layers of word lines 62 are illustrated with the topmost word lines 62T being the shortest lines and the bottommost word lines 62B being the longest lines. Respective lengths of the word lines 62 increase in a direction extending towards the underlying substrate. In this manner, a portion of each word line 62 may be accessible from above the memory array 52, so that conductive contacts may be formed to an exposed portion of each word line 62.

The bit lines 64B and the source lines 64S are vertically arranged conductive lines. The bit lines 64B and the source lines 64S extend in the third direction $D_3$. An isolation region 74 is disposed between and isolates adjacent ones of the bit lines 64B and the source lines 64S. The boundaries of each memory cell 58 are defined by pairs of the bit lines 64B and the source lines 64S along with an intersecting word line 62. An isolation region 76 is disposed between and isolates adjacent TFTs 68 (e.g., adjacent pairs of the bit lines 64B and the source lines 64S). Although FIGS. 2A and 2B illustrate a particular placement of the bit lines 64B relative the source lines 64S, it should be appreciated that the placement of the bit lines 64B and the source lines 64S may be flipped in other embodiments.

The memory array 52 further includes semiconductor strips 82 and tunneling strips 84. The tunneling strips 84 are in contact with the word lines 62. The semiconductor strips 82 are disposed between the tunneling strips 84 and the isolation regions 74. In this embodiment, the semiconductor strips 82 are also disposed between the tunneling strips 84 and each of the bit lines 64B and the source lines 64S. In another embodiment (discussed in greater detail below for FIGS. 20A through 20C), the semiconductor strips 82 are disposed between the isolation regions 74 and each of the bit lines 64B and the source lines 64S.

The semiconductor strips 82 provide channel regions for the TFTs 68 of the memory cells 58, and can also be referred to as channel layers. For example, when an appropriate voltage (e.g., higher than a respective threshold voltage of a corresponding TFT 68) is applied through a corresponding word line 62, a portion of a semiconductor strip 82 that intersects the word line 62 may allow current to flow from a bit line 64B to a corresponding source line 64S (e.g., in the first direction $D_1$). In the illustrated embodiment, each semiconductor strip 82 contacts one surface of each corresponding word line 62, thus providing planar channel regions for the TFTs 68. In another embodiment, the word lines 62 are formed so that each semiconductor strip 82 contacts multiple surfaces of each corresponding word line 62, thus providing three-dimensional channel regions for the TFTs 68.

The tunneling strips 84 can be polarized in one of two different directions by applying an appropriate voltage across the tunneling strips 84, and can also be referred to as data storage layers. Depending on a polarization direction of a particular portion of a tunneling strip 84, a threshold voltage of a corresponding TFT 68 varies and a digital value (e.g., 0 or 1) can be stored. For example, when a portion of a tunneling strip 84 has a first electrical polarization direction, the corresponding TFT 68 may have a relatively low threshold voltage, and when the portion of the tunneling strip 84 has a second electrical polarization direction, the corresponding TFT 68 may have a relatively high threshold voltage. The difference between the two threshold voltages may be referred to as the threshold voltage shift. A larger threshold voltage shift makes it easier (e.g., less error prone) to read the digital value stored in the corresponding memory cell 58. In some embodiments, the tunneling strips 84 are formed of a high-k ferroelectric material, and thus the memory array 52 may also be referred to as a ferroelectric random access memory (FeRAM) array.

To perform a write operation on a particular memory cell 58, a write voltage is applied across a portion of the tunneling strip 84 corresponding to the memory cell 58. The write voltage can be applied, for example, by applying appropriate voltages to the word line 62, the bit line 64B, and the source line 64S corresponding to the memory cell 58. By applying the write voltage across the portion of the tunneling strip 84, a polarization direction of the portion of the tunneling strip 84 can be changed. As a result, the corresponding threshold voltage of the corresponding TFT 68 can be switched from a low threshold voltage to a high threshold voltage (or vice versa), so that a digital value can be stored in the memory cell 58. Because the word lines 62 and the bit lines 64B intersect in the memory array 52, individual memory cells 58 may be selected and written to.

To perform a read operation on a particular memory cell 58, a read voltage (a voltage between the low and high threshold voltages) is applied to the word line 62 corresponding to the memory cell 58. Depending on the polarization direction of the corresponding portion of the tunneling strip 84, the TFT 68 of the memory cell 58 may or may not be turned on. As a result, the bit line 64B may or may not be discharged (e.g., to ground) through the source line 64S, so that the digital value stored in the memory cell 58 can be determined. Because the word lines 62 and the bit lines 64B intersect in the memory array 52, individual memory cells 58 may be selected and read from.

As will be discussed in greater detail below, back gates (not shown in FIGS. 2A and 2B, see FIGS. 20A through 20C) will be formed extending through the isolation regions 74. Applying the write voltage during a write operation for a memory cell 58 also includes applying a biasing voltage to the back gate corresponding to the memory cell 58. Applying the biasing voltage to the back gate increases the write voltage applied across the portion of the tunneling strip 84 corresponding to the memory cell 58. Increasing the write voltage applied during the write operation can help increase the speed and accuracy of the write operation. Further, because a biasing voltage is applied, the voltages applied to the word line 62, the bit line 64B, and the source line 64S during the write operation may be decreased, reducing complexity of the row decoder and/or the column decoder for the memory array 52. The back gates are not used during read operations, and can be left floating during read operations.

FIGS. 3A through 20C are various views of intermediate stages in the manufacturing of a memory array 52, in accordance with some embodiments. Each memory cell 58 of the memory array 52 is a flash memory cell that includes a programmable TFT 68 (see FIGS. 20A through 20C). FIGS. 3A, 4A, 5A, 6A, 7A, 8A. 9A, 10A, 11A, 12A, 13A, 14A, 15A, 16A, 17A, 18A, 19A, and 20A are three-dimensional views. FIGS. 3B, 4B, 5B, 6B, 7B, 8B, 9B, 10B. 11B, 12B, 13B, 14B, 15B, 16B, 17B, 18B, 19B, and 20B are cross-sectional views shown along reference cross-section B-B in FIG. 19A. FIG. 20C is a cross-sectional view shown along reference cross-section C-C in FIG. 19A. A portion of the memory array 52 is illustrated. Some features, such as the staircase arrangement of the word lines (see FIG. 2B), are not shown for clarity of illustration.

Figure 3A:
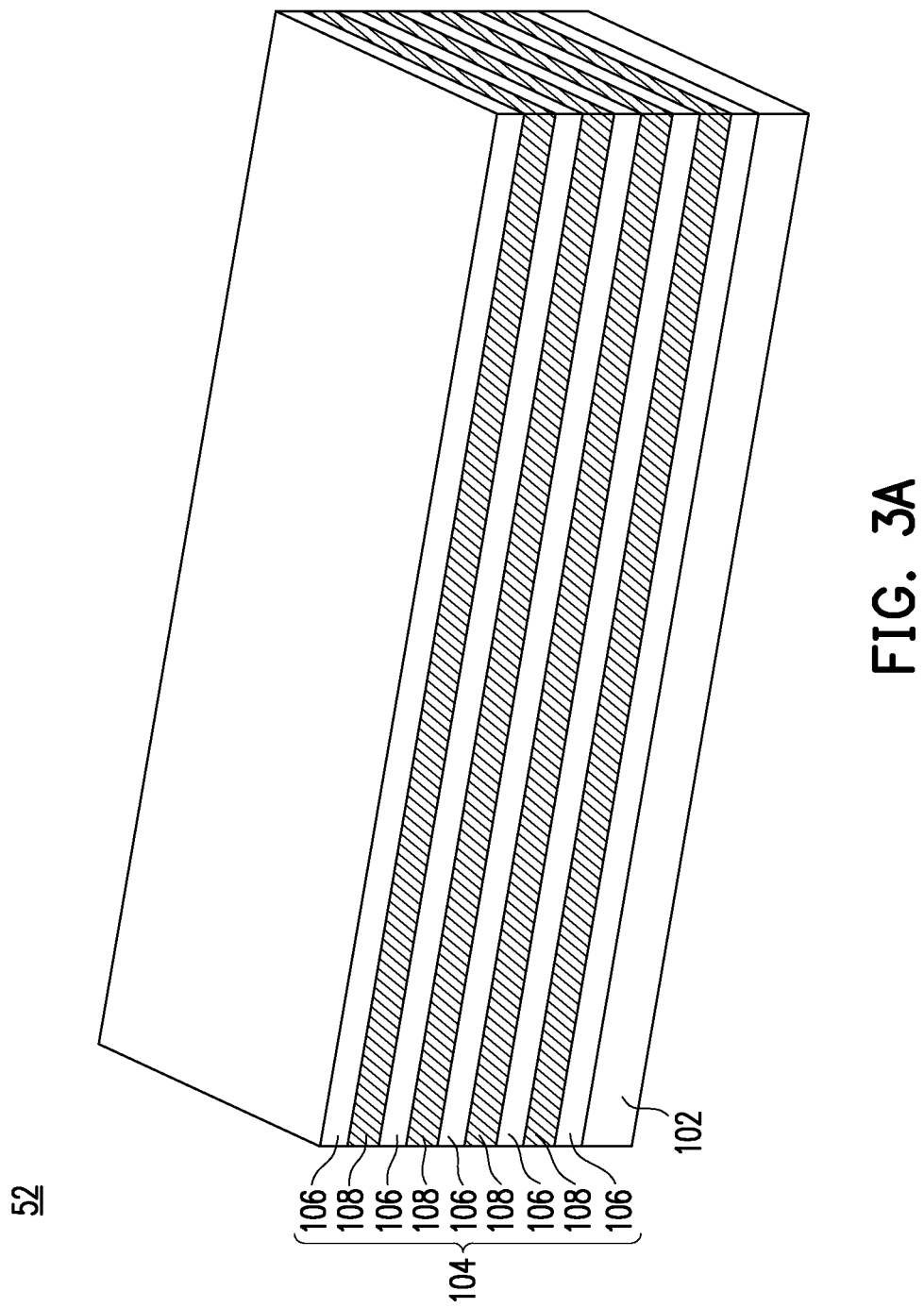
FIGS. 3A through 20C are various views of intermediate stages in the manufacturing of a memory array, in accordance with some embodiments.
Figure 3B:
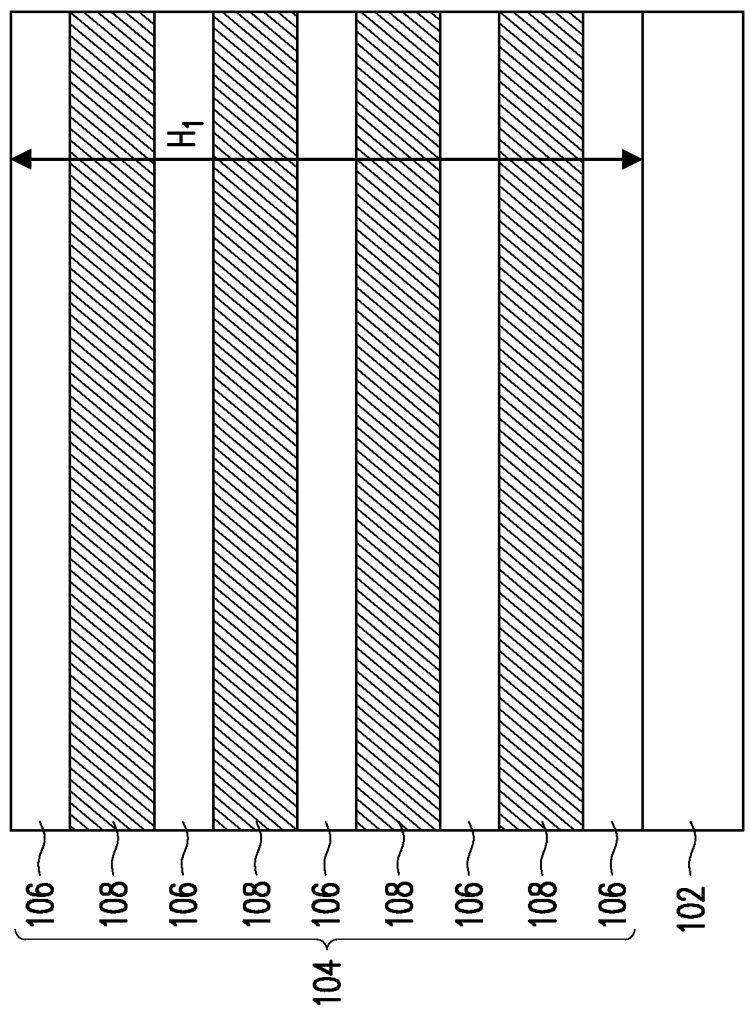

In FIGS. 3A and 3B, a substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multilayered or gradient substrate may also be used. In some embodiments, the semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. The substrate 102 may include a dielectric material. For example, the substrate 102 may be a dielectric substrate, or may include a dielectric layer on a semiconductor substrate. Acceptable dielectric materials for the substrate 102 include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. In some embodiments, the substrate 102 is formed of silicon carbide.

A multilayer stack 104 is formed over the substrate 102. The multilayer stack 104 includes alternating dielectric layers 106 and sacrificial layers 108. The dielectric layers 106 are formed of a first dielectric material, and the sacrificial layers 108 are formed of a second dielectric material. The dielectric materials may each be selected from the candidate dielectric materials of the substrate 102.

The multilayer stack 104 will be patterned in subsequent processing. As such, the dielectric materials of the dielectric layers 106 and the sacrificial layers 108 both have a high etching selectivity from the etching of the substrate 102. The patterned dielectric layers 106 will be used to isolate subsequently formed TFTs. The patterned sacrificial layers 108 may also be referred to as dummy layers, and will be selectively replaced with word lines for the TFTs in subsequent processing. As such, the second dielectric material of the sacrificial layers 108 also has a high etching selectivity from the etching of the first dielectric material of the dielectric layers 106. In embodiments where the substrate 102 is formed of silicon carbide, the dielectric layers 106 can be formed of silicon oxide, and the sacrificial layers 108 can be formed of silicon nitride. Other combinations of dielectric materials having acceptable etching selectivity from one another may also be used.

Each layer of the multilayer stack 104 may be formed by an acceptable deposition process such as chemical vapor deposition (CVD), atomic layer deposition (ALD), or the like. A thickness of each of the layers may be in the range of about 40 nm to about 50 nm. In some embodiments, the dielectric layers 106 are formed to a different thickness than the sacrificial layers 108. For example, the sacrificial layers 108 can be formed to a greater thickness than the dielectric layers 106. In the illustrated embodiment, the multilayer stack 104 includes five of the dielectric layers 106 and four of the sacrificial layers 108. It should be appreciated that the multilayer stack 104 may include other quantities of the dielectric layers 106 and the sacrificial layers 108. The multilayer stack 104 can have an overall height $H_1$ in the range of about 1000 nm to about 10000 nm.

As will be discussed in greater detail below, FIGS. 4A through 11B illustrate a process in which a multiple-patterning process is used to form some of the features of the TFTs. The multiple-patterning process may be a double patterning process, a quadruple patterning process, or the like. FIGS. 4A through 11B illustrate a double patterning process. In a double patterning process, trenches 110A (see FIGS. 4A and 4B) are patterned in portions of the multilayer stack 104 with a first etching process, and features for a first subset of the TFTs are formed in the trenches 110A. Trenches 110B (see FIGS. 8A and 8B) are then patterned in other portions of the multilayer stack 104 with a second etching process, and features for a second subset of the TFTs are formed in the trenches 110B. Forming the features of the TFTs with a multiple-patterning process allows each patterning process to be performed with a low pattern density, which can help reduce defects while still allowing the memory array 52 to have sufficient memory cell density. Further, forming the features of the TFTs with a multiple-patterning process also allows each patterned portion of the multilayer stack 104 to avoid having an excessively large aspect ratio, thereby improving the structural stability of the resulting memory array.

Figure 4A:
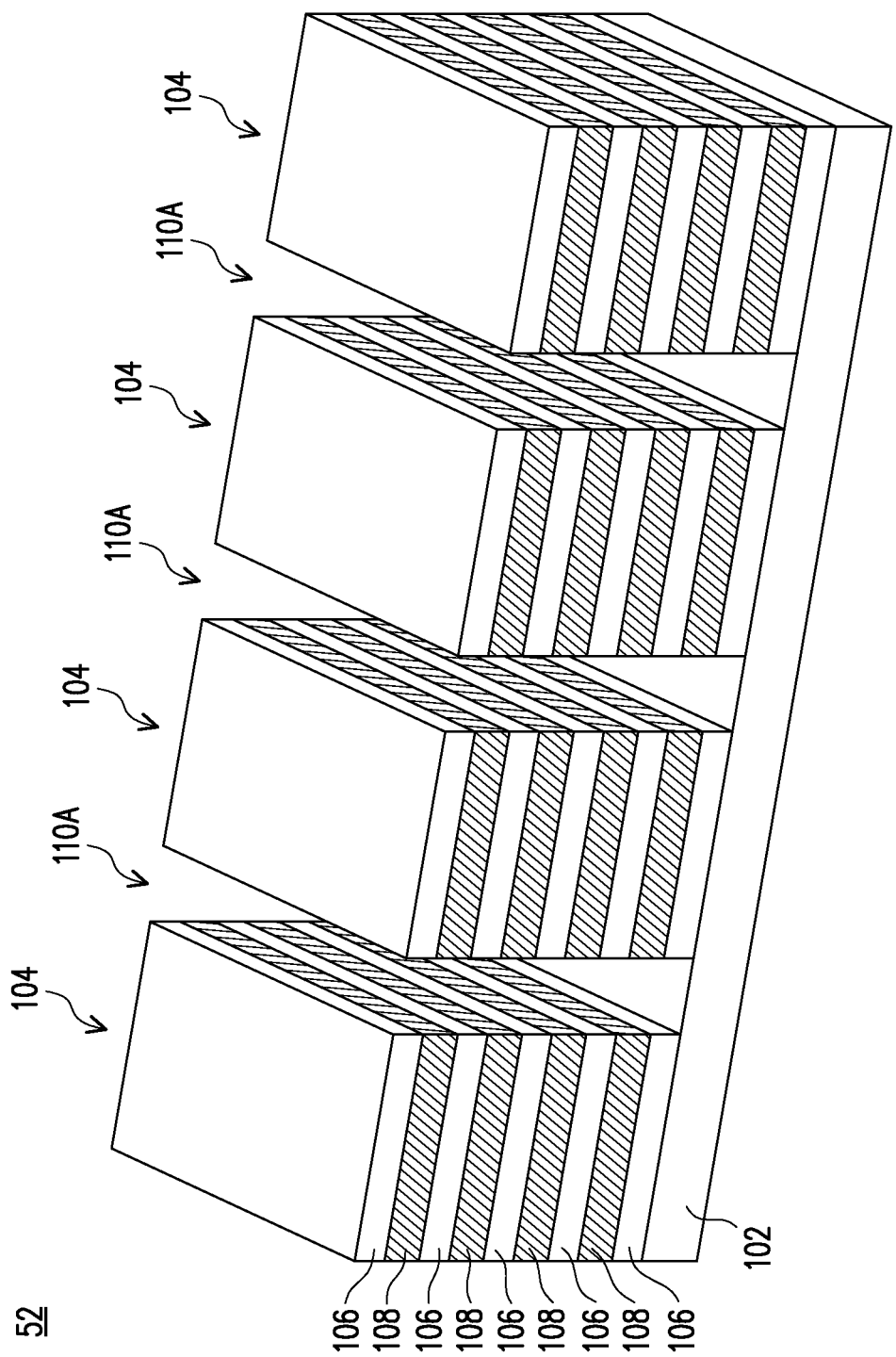
Figure 4B:
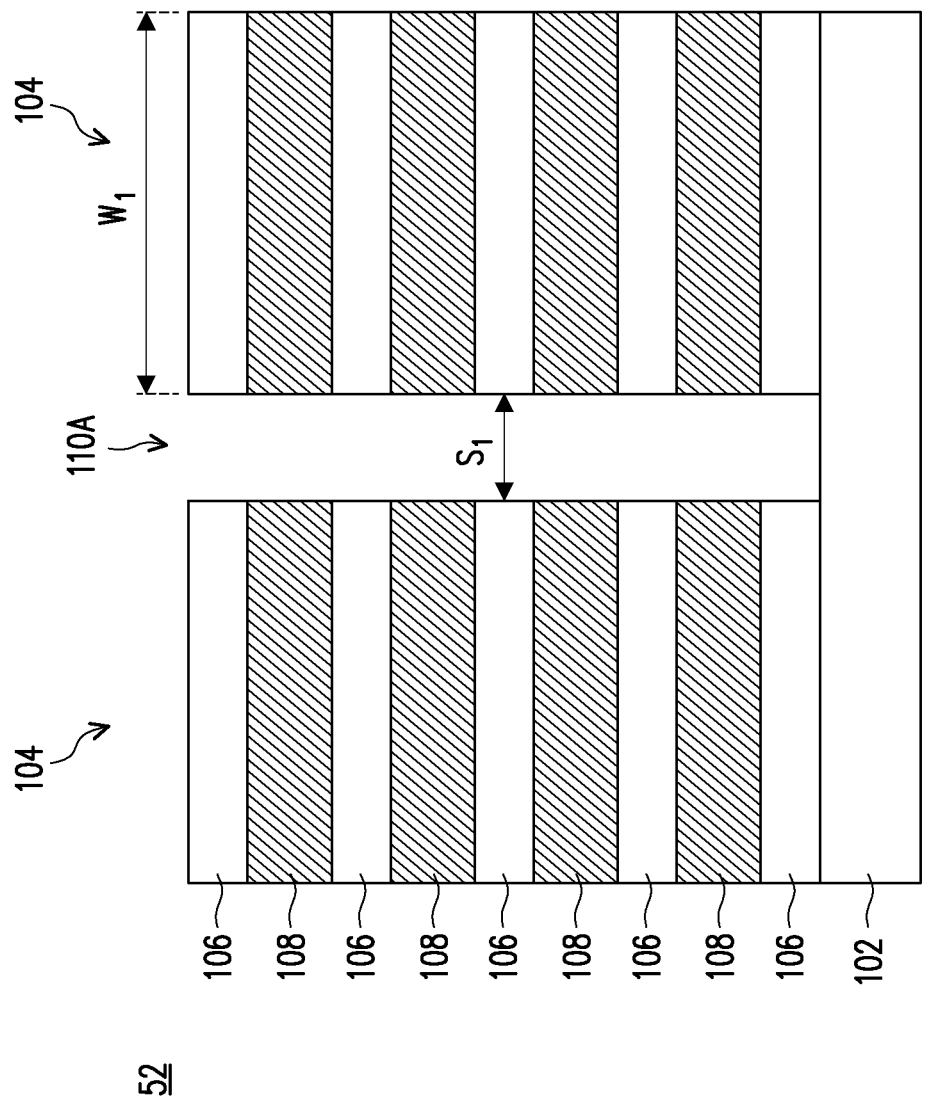

In FIGS. 4A and 4B, trenches 110A are patterned in the multilayer stack 104. In the illustrated embodiment, the trenches 110A extend through the multilayer stack 104 and expose the substrate 102. In another embodiment, the trenches 110A extend through some but not all layers of the multilayer stack 104. The trenches 110A may be patterned using acceptable photolithography and etching techniques, such as with an etching process that is selective to the multilayer stack 104 (e.g., selectively removes the dielectric materials of the dielectric layers 106 and the sacrificial layers 108 at a faster rate than the material of the substrate 102). The etching may be any acceptable etch process, such as a reactive ion etch (RIE), neutral beam etch (NBE), the like, or a combination thereof. The etching may be anisotropic. In embodiments where the substrate 102 is formed of silicon carbide, the dielectric layers 106 are formed of silicon oxide, and the sacrificial layers 108 are formed of silicon nitride, the trenches 110A can be formed by a dry etch using a fluorine-based gas (e.g., $C_4F_6$) mixed with hydrogen ($H_2$) or oxygen (O2) gas. After the patterning, respective portions of the multilayer stack 104 are disposed between respective ones of the trenches 110A. Each portion of the multilayer stack 104 has a width $W_1$ in the second direction $D_2$ (see FIGS. 2A and 2B), which can be in the range of about 50 nm to about 500 nm. Further, each portion of the multilayer stack 104 is separated by a separation distance $S_1$ in the second direction $D_2$, which can be in the range of about 50 nm to about 200 nm.

Figure 5A:
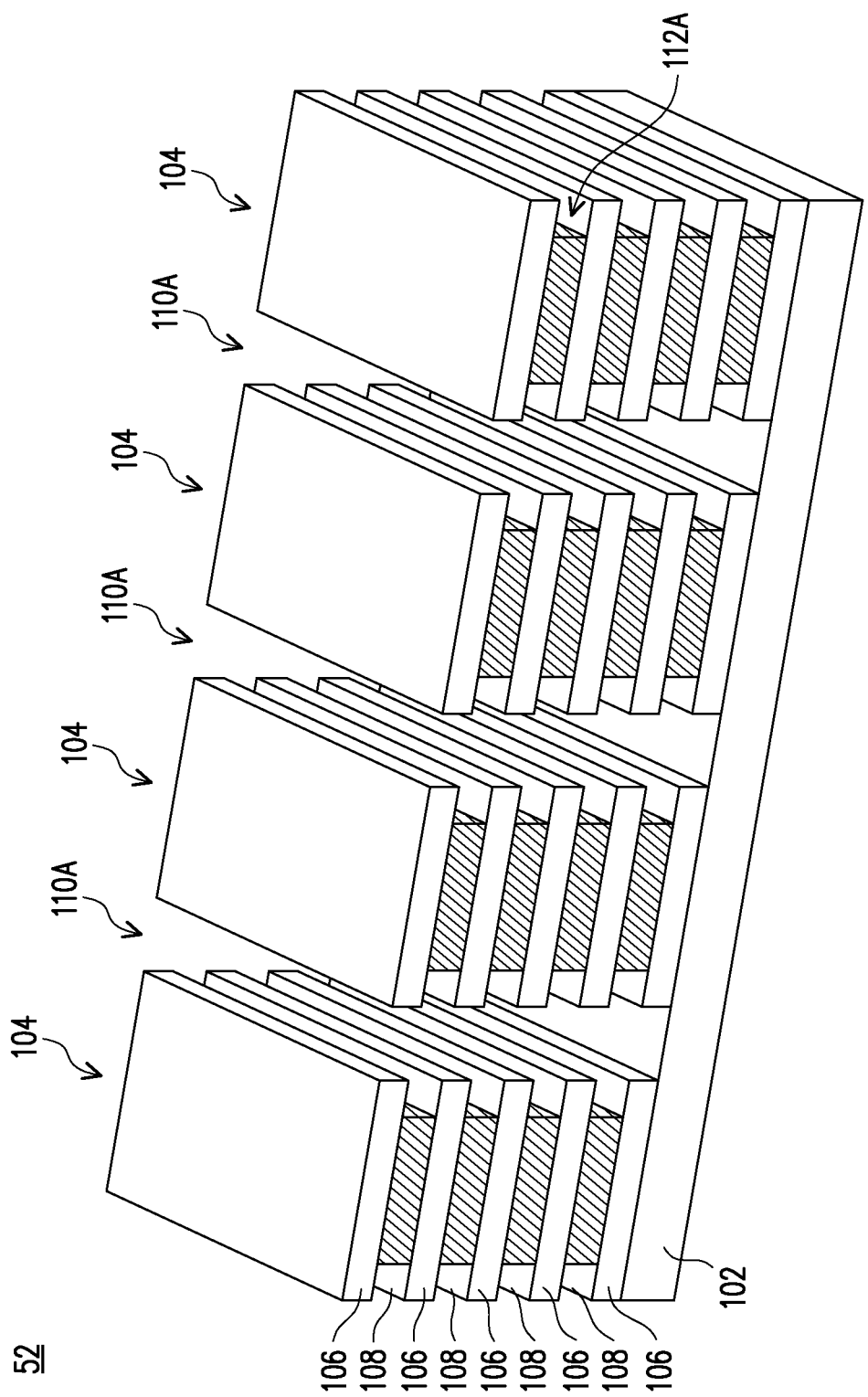
Figure 5B:
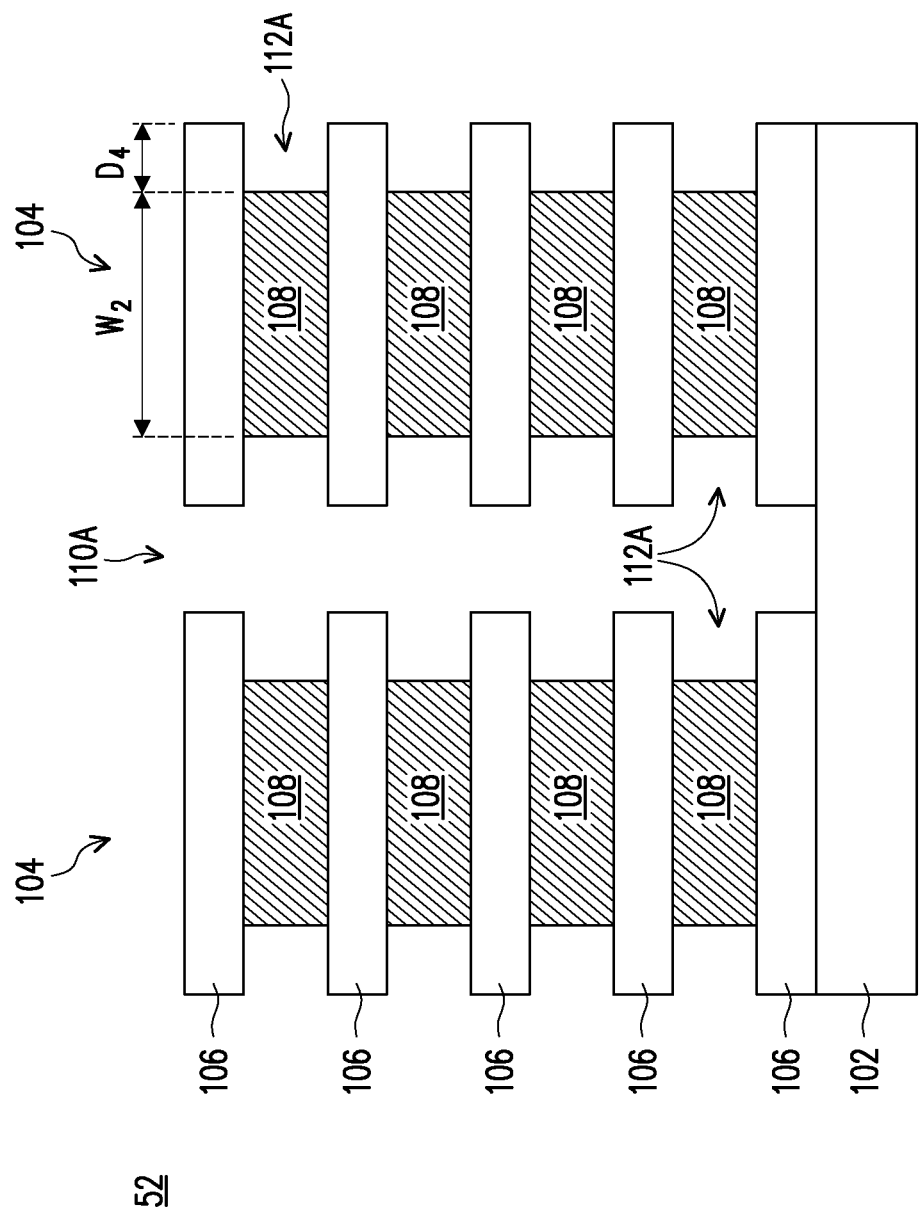

In FIGS. 5A and 5B, the trenches 110A are expanded to form sidewall recesses 112A. Specifically, portions of the sidewalls of the sacrificial layers 108 exposed by the trenches 110A are recessed from the portions of the sidewalls of the dielectric layers 106 exposed by the trenches 110A to form the sidewall recesses 112A. Although sidewalls of the sacrificial layers 108 are illustrated as being straight, the sidewalls may be concave or convex. The sidewall recesses 112A may be formed by an acceptable etching process, such as one that is selective to the material of the sacrificial layers 108 (e.g., selectively removes the material of the sacrificial layers 108 at a faster rate than the material(s) of the dielectric layers 106 and the substrate 102). The etching may be isotropic. In embodiments where the substrate 102 is formed of silicon carbide, the dielectric layers 106 are formed of silicon oxide, and the sacrificial layers 108 are formed of silicon nitride, the trenches 110A can be expanded by a wet etch using phosphoric acid ($H_3PO_4$). In another embodiment, a dry etch selective to the material of the sacrificial layers 108 may be used.

After formation, the sidewall recesses 112A have a depth $D_4$ in the second direction $D_2$ (see FIGS. 2A and 2B), extending past the sidewalls of the dielectric layers 106. Timed etch processes may be used to stop the etching of the sidewall recesses 112A after the sidewall recesses 112A reach a desired depth $D_4$. For example, the sidewall recesses 112A can have a depth $D_4$ in the range of about 10 nm to about 60 nm. Forming the sidewall recesses 112A can reduce the widths of the sacrificial layers 108 by about 5% to about 30%. Continuing the previous example, after the etching, the sacrificial layers 108 can have a width $W_2$ in the second direction $D_2$, which can be in the range of about 50 nm to about 450 nm.

Figure 6A:
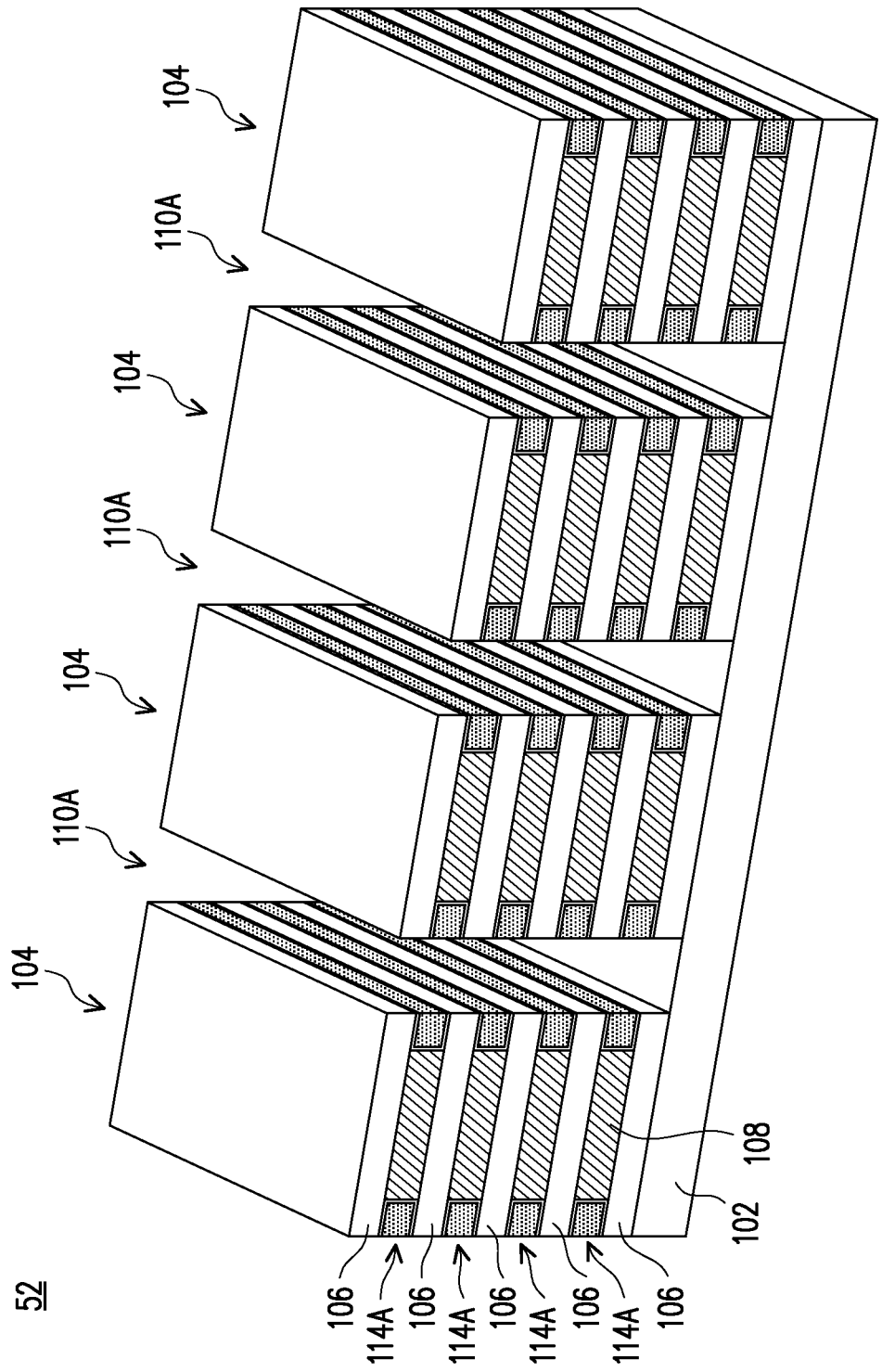
Figure 6B:
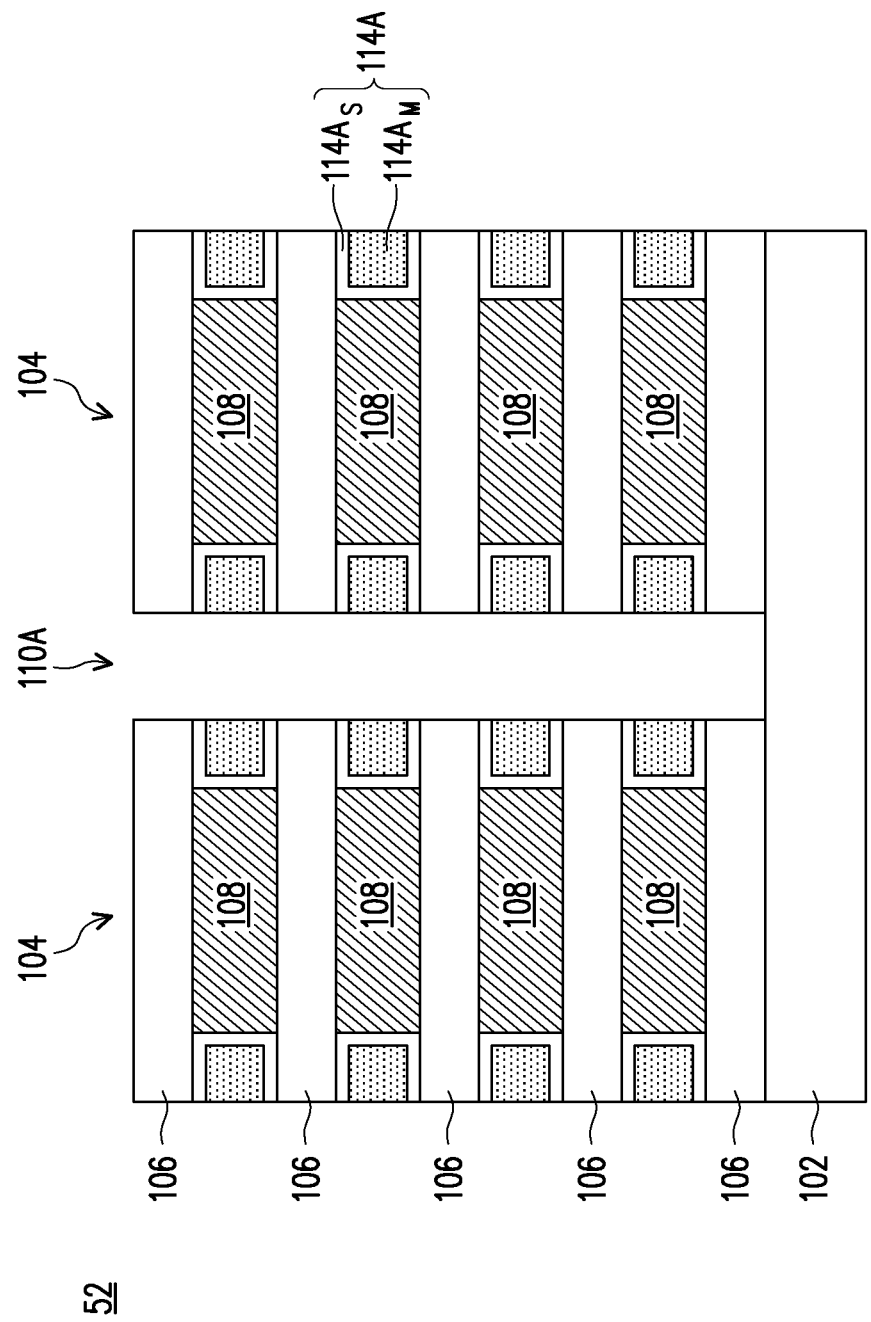

In FIGS. 6A and 6B, conductive features 114A (e.g., metal lines) are formed in the sidewall recesses 112A, thus completing a process for replacing first portions of the sacrificial layers 108. The conductive features 114A may each include one or more layers, such as seed layers, glue layers, barrier layers, diffusion layers, fill layers, and the like. In some embodiments, the conductive features 114A each include a seed layer $114A_S$ (or barrier layer) and a main layer $114A_M$. Each seed layer $114A_S$ extends along three sides (e.g., the top surface, a sidewall, and the bottom surface) of a corresponding main layer $114A_M$ located within a corresponding sidewall recesses 112A. The seed layers $114A_S$ are formed of a first conductive material that can be utilized to help grow or to help adhere a subsequently deposited material, such as a metal nitride, such as titanium nitride, tantalum nitride, molybdenum nitride, zirconium nitride, hafnium nitride, or the like. The main layers $114A_M$ may are formed of a second conductive material, such a metal, such as tungsten, ruthenium, molybdenum, cobalt, aluminum, nickel, copper, silver, gold, alloys thereof, or the like. The material of the seed layers $114A_S$ is one that has good adhesion to the material of the dielectric layers 106, and the material of the main layers $114A_M$ is one that has good adhesion to the material of the seed layers $114A_S$. In embodiments where the dielectric layers 106 are formed of an oxide such as silicon oxide, the seed layers $114A_S$ can be formed of titanium nitride or tantalum nitride, and the main layers $114A_M$ can be formed of tungsten. The materials of the seed layers $114A_S$ and main layers $114A_M$ may be formed by acceptable deposition processes such as chemical vapor deposition (CVD), atomic layer deposition (ALD), or the like. An acceptable etch process, such as a dry etch (e.g., a reactive ion etch (RIE), neutral beam etch (NBE), the like), a wet etch, the like, or a combination thereof, may be performed to remove excess material from the sidewalls of the dielectric layers 106 and the top surface of the substrate 102. The etching may be anisotropic. Each of the conductive features 114A can have a similar overall thickness as the sacrificial layers 108 (discussed above for FIGS. 3A and 3B), and can have a similar overall width as the depth $D_4$ of the sidewall recesses 112A (discussed above for FIGS. 5A and 5B). Each seed layer $114A_S$ can have a thickness in the range of about 1 nm to about 10 nm, and each main layer $114A_M$ can have a thickness in the range of about 15 nm to about 35 nm, with the thickness of the seed layer $114A_S$ being less than the thickness of the main layer $114A_M$.

Figure 7A:
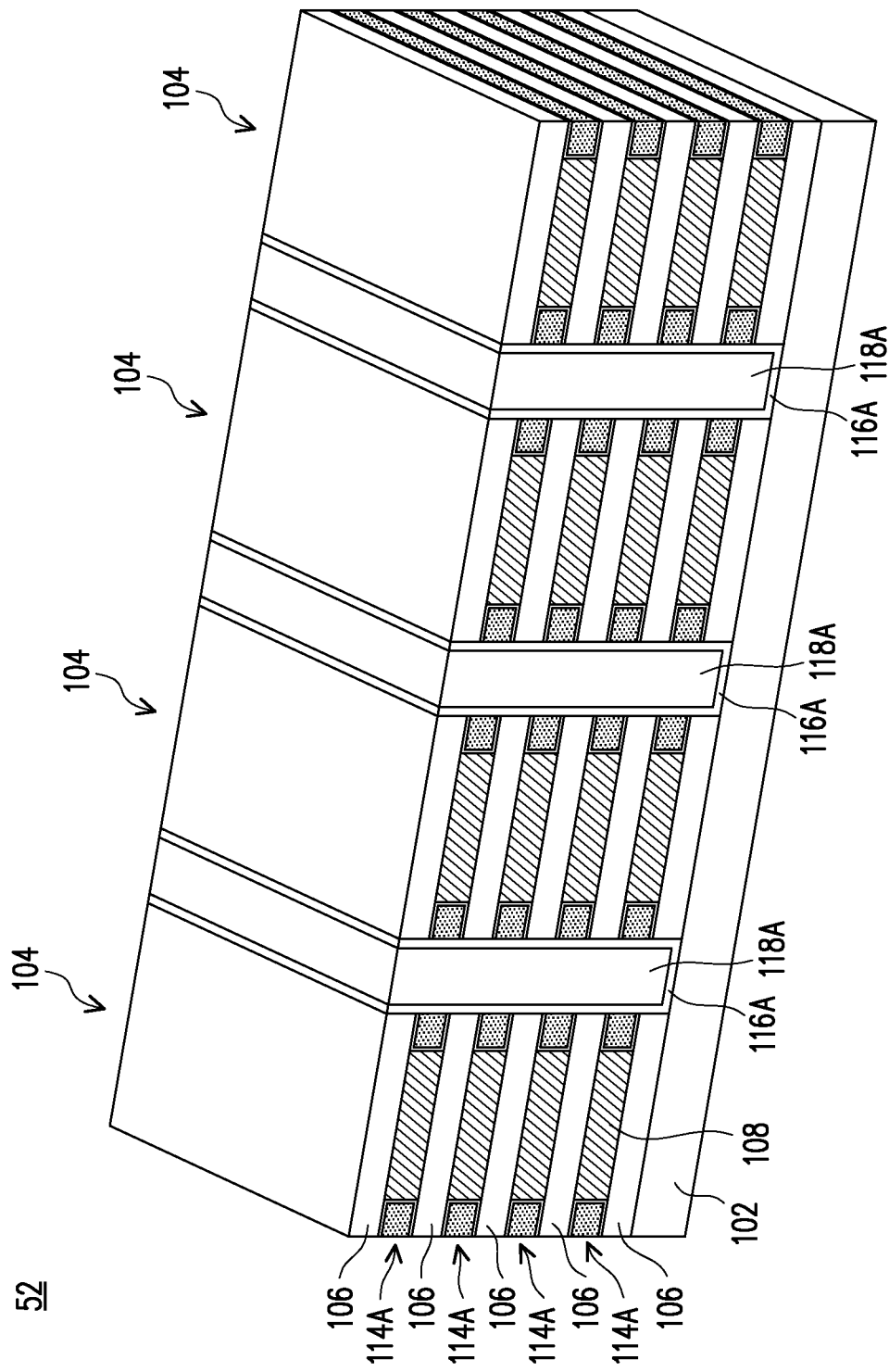
Figure 7B:
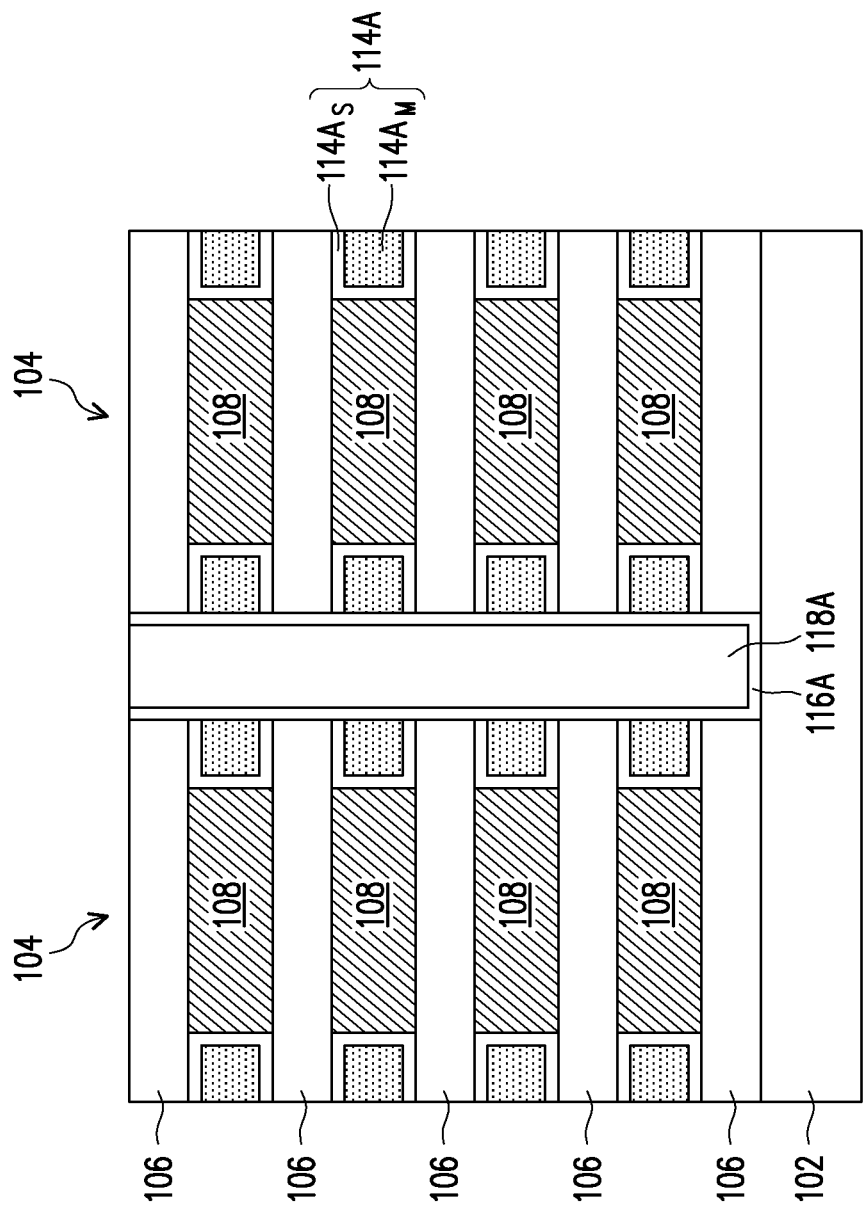

In FIGS. 7A and 7B, tunneling strips 116A and isolation regions 118A are formed in the trenches 110A. Specifically, one tunneling strip 116A and one isolation region 118A is formed in each trench 110A. No semiconductor strips are formed at this step of processing. Rather, as will be discussed in greater detail below, semiconductor strips will be formed through openings in the isolation regions 118A at a subsequent step of processing.

The tunneling strips 116A are formed of an acceptable material for storing digital values. In some embodiments, the tunneling strips 116A are formed of a high-k ferroelectric material, such as hafnium zirconium oxide (HfZrO); zirconium oxide (ZrO); hafnium oxide (HfO) doped with lanthanum (La), silicon (Si), aluminum (Al), or the like; undoped hafnium oxide (HfO); or the like. In some embodiments, the tunneling strips 116A include one or more low-k dielectric materials, such as silicon nitride, silicon oxide, silicon oxynitride, or the like. The material of the tunneling strips 116A may be formed by an acceptable deposition process such as ALD, CVD, physical vapor deposition (PVD), or the like. In some embodiments, the tunneling strips 116A are formed of HfZrO deposited by ALD.

The isolation regions 118A are formed of an acceptable material for protecting and electrically isolating the underlying tunneling strips 116A. Acceptable dielectric materials for the isolation regions 118A include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. The material of the isolation regions 118A may be formed by an acceptable deposition process such as ALD, CVD, flowable CVD (FCVD), or the like. In some embodiments, the isolation regions 118A are formed of an oxide such as silicon oxide deposited by FCVD.

The tunneling strips 116A and the isolation regions 118A may be formed by a combination of deposition, etching, and planarization. For example, a tunneling layer is conformally deposited on the multilayer stack 104 and in the trenches 110A (e.g., on the sidewalls of the conductive features 114A and the sidewalls of the dielectric layers 106). Specifically, the tunneling layer extends along the sidewalls of the dielectric layers 106 and the sidewalls of the conductive features 114A (e.g., the sidewalls of the seed layers $114A_S$ and the main layers $114A_M$ exposed by the trenches 110A). The tunneling layer can optionally be anisotropically etched to remove portions of the tunneling layer at the bottoms of the trenches 110A, thus exposing the substrate 102 and separating the tunneling strips of horizontally adjacent TFTs along the direction $D_2$ (see FIGS. 2A and 2B). An isolation material is then conformally deposited on the tunneling layer and in the remaining portions of the trenches 110A. A removal process is then applied to the various layers to remove excess materials over the topmost dielectric layers 106/sacrificial layers 108. The removal process may be a planarization process such as a chemical mechanical polish (CMP), an etch-back, combinations thereof, or the like. The portions of the tunneling layer and the isolation material remaining in the trenches 110A form the tunneling strips 116A and the isolation regions 118A, respectively. The planarization process exposes the topmost dielectric layers 106/sacrificial layers 108 such that top surfaces of the isolation regions 118A, the tunneling strips 116A, and the topmost dielectric layers 106/sacrificial layers 108 are coplanar (within process variations) after the planarization process.

Figure 8A:
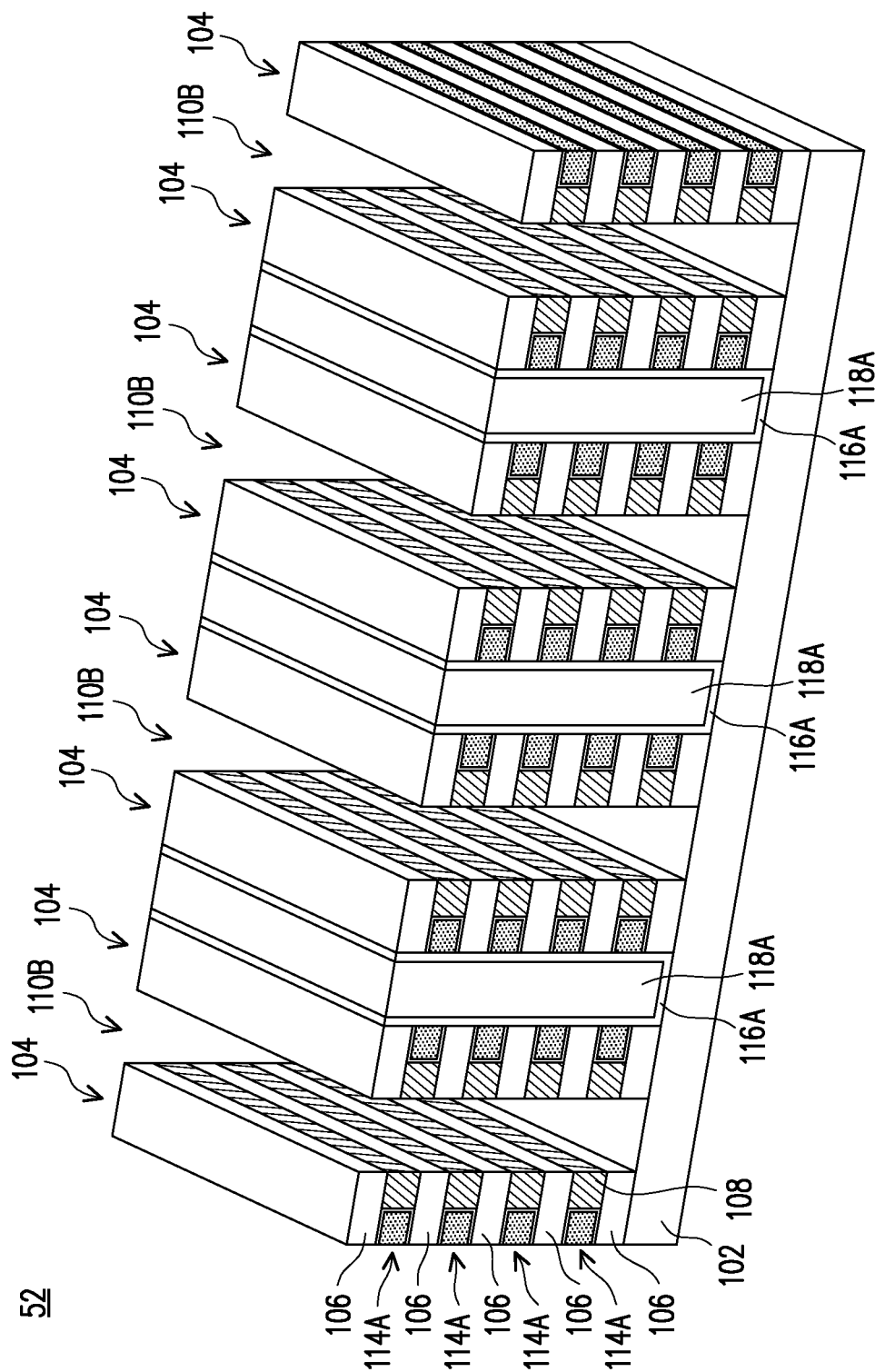
Figure 8B:
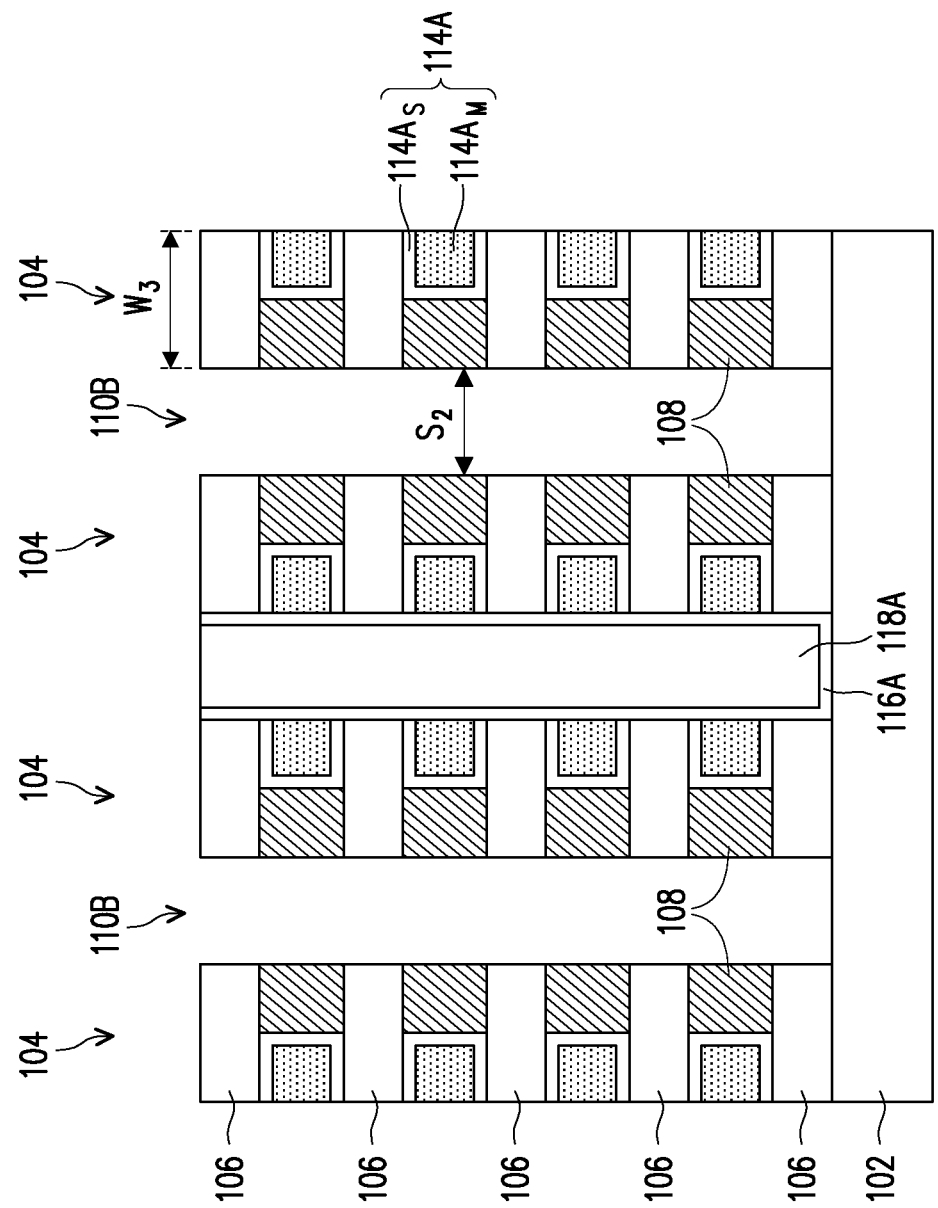

In FIGS. 8A and 8B, trenches 110B are patterned in the multilayer stack 104. In the illustrated embodiment, the trenches 110B extend through the multilayer stack 104 and expose the substrate 102. In another embodiment, the trenches 110B extend through some but not all layers of the multilayer stack 104. The trenches 110B may be patterned using acceptable photolithography and etching techniques, such as with an etching process that is selective to the multilayer stack 104 (e.g., selectively removes the dielectric materials of the dielectric layers 106 and the sacrificial layers 108 at a faster rate than the material of the substrate 102). The etching may be any acceptable etch process, and in some embodiments, may be similar to the etch used to form the trenches 110A (discussed above for FIGS. 4A and 4B).

After the patterning, respective portions of the multilayer stack 104 are disposed between respective pairs of the trenches 110A, 110B. Each portion of the multilayer stack 104 has a width $W_3$ in the second direction $D_2$ (see FIGS. 2A and 2B), which can be in the range of about 50 nm to about 500 nm. Further, each portion of the multilayer stack 104 is separated by a separation distance $S_2$ in the second direction $D_2$, which can be in the range of about 50 nm to about 200 nm. Misalignment may occur when patterning the trenches 110B. When misalignment occurs, the patterned portions of the multilayer stack 104 do not all have a same width $W_3$. When no misalignment occurs, the patterned portions of the multilayer stack 104 have a same width $W_3$.

Figure 9A:
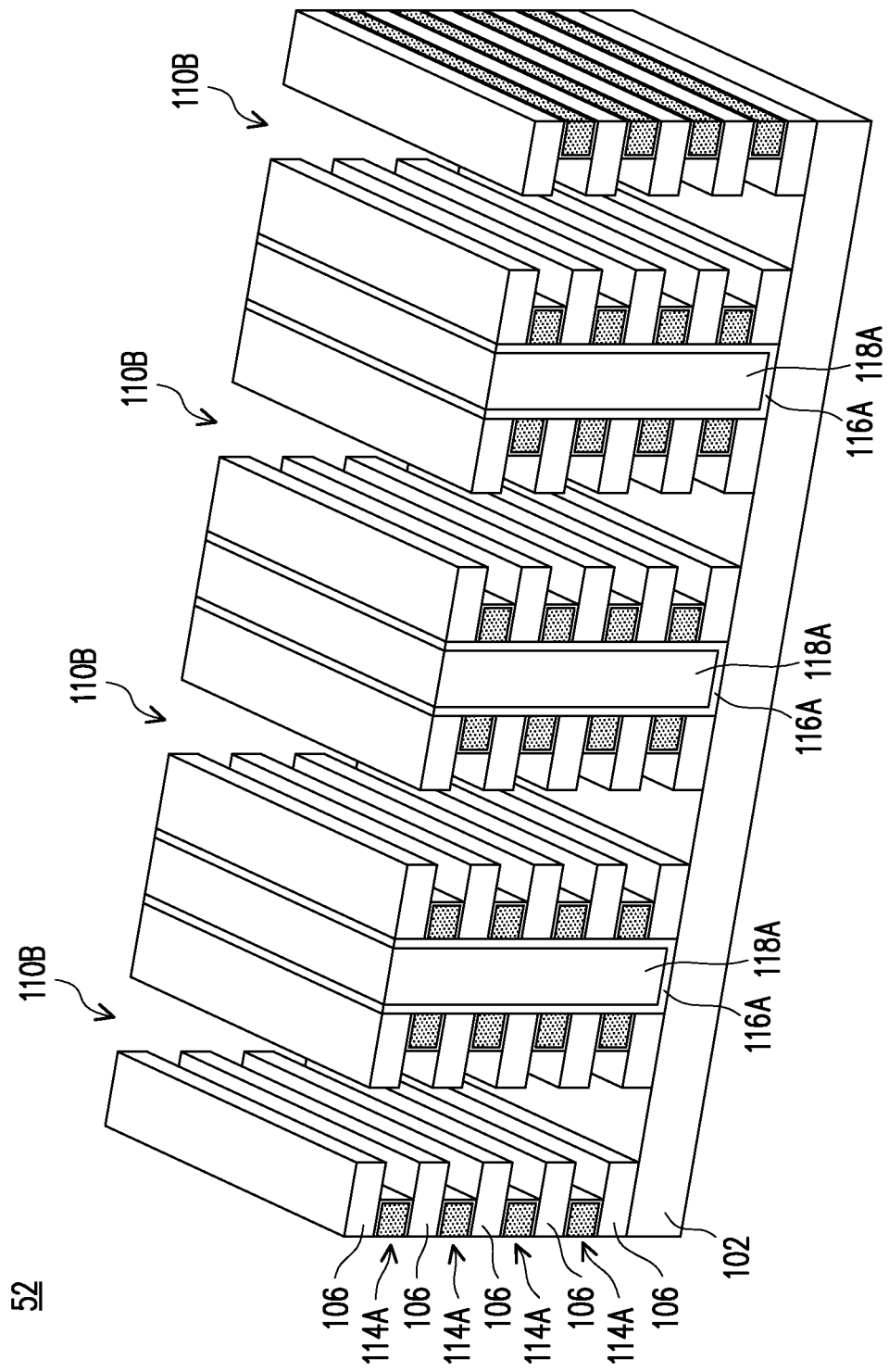
Figure 9B:
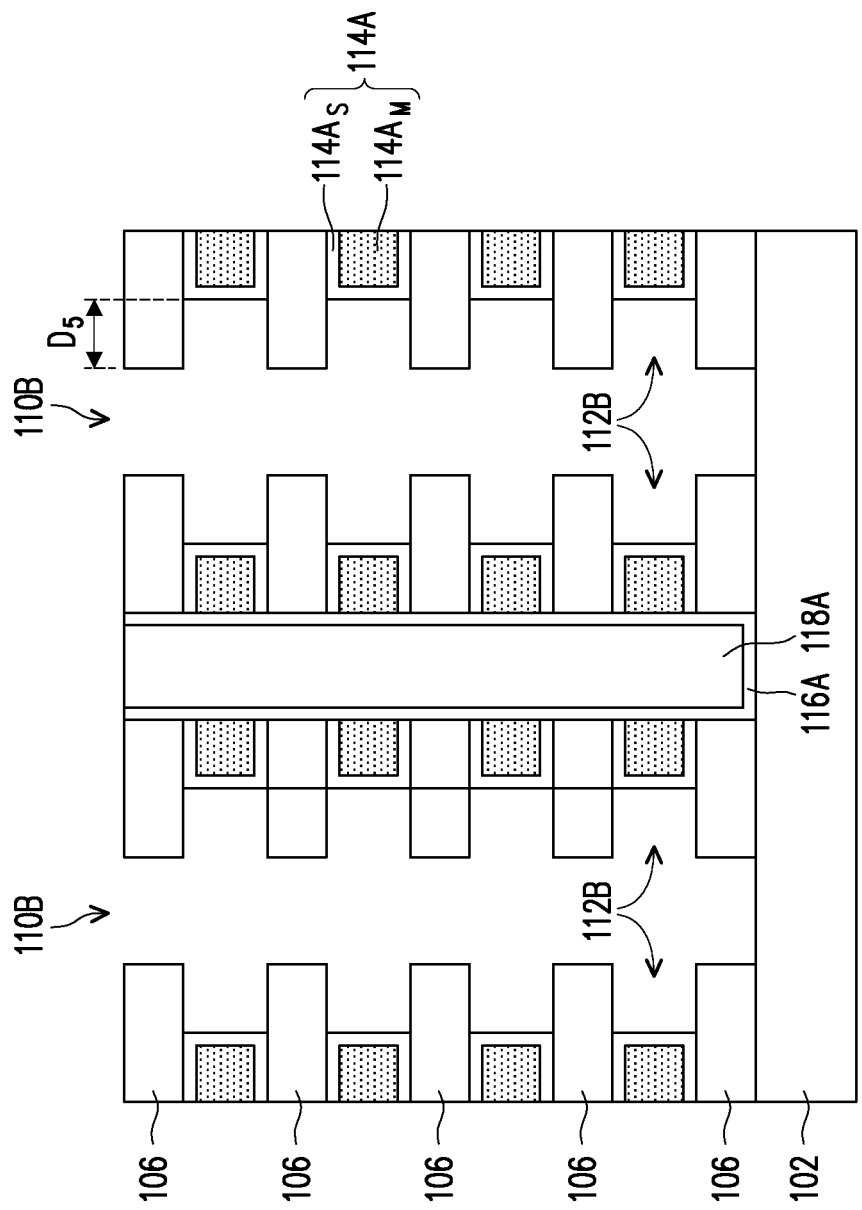

In FIGS. 9A and 9B, the trenches 110B are expanded to form sidewall recesses 112B. Specifically, the remaining portions of the sacrificial layers 108 are removed to form the sidewall recesses 112B. The sidewall recesses 112B thus expose the sidewalls of the conductive features 114A (e.g., the sidewalls of the seed layers $114A_S$). The sidewall recesses 112B may be formed by an acceptable etching process, such as one that is selective to the material of the sacrificial layers 108 (e.g., selectively removes the material of the sacrificial layers 108 at a faster rate than the material(s) of the dielectric layers 106 and the substrate 102). The etching may be any acceptable etch process, and in some embodiments, may be similar to the etch used to form the sidewall recesses 112A (discussed above for FIGS. 5A and 5B).

After formation, the sidewall recesses 112B have a depth $D_5$ in the second direction $D_2$ (see FIGS. 2A and 2B), extending past the sidewalls of the dielectric layers 106. Timed etch processes may be used to stop the etching of the sidewall recesses 112B after the sidewall recesses 112B reach a desired depth $D_5$. As noted above, misalignment may occur when patterning the trenches 110B. When misalignment occurs, the depth $D_5$ is different from (e.g., greater than or less than) the depth $D_4$ (discussed above for FIGS. 5A and 5B). When no misalignment occurs, the depth $D_5$ is similar to the depth $D_4$.

Figure 10A:
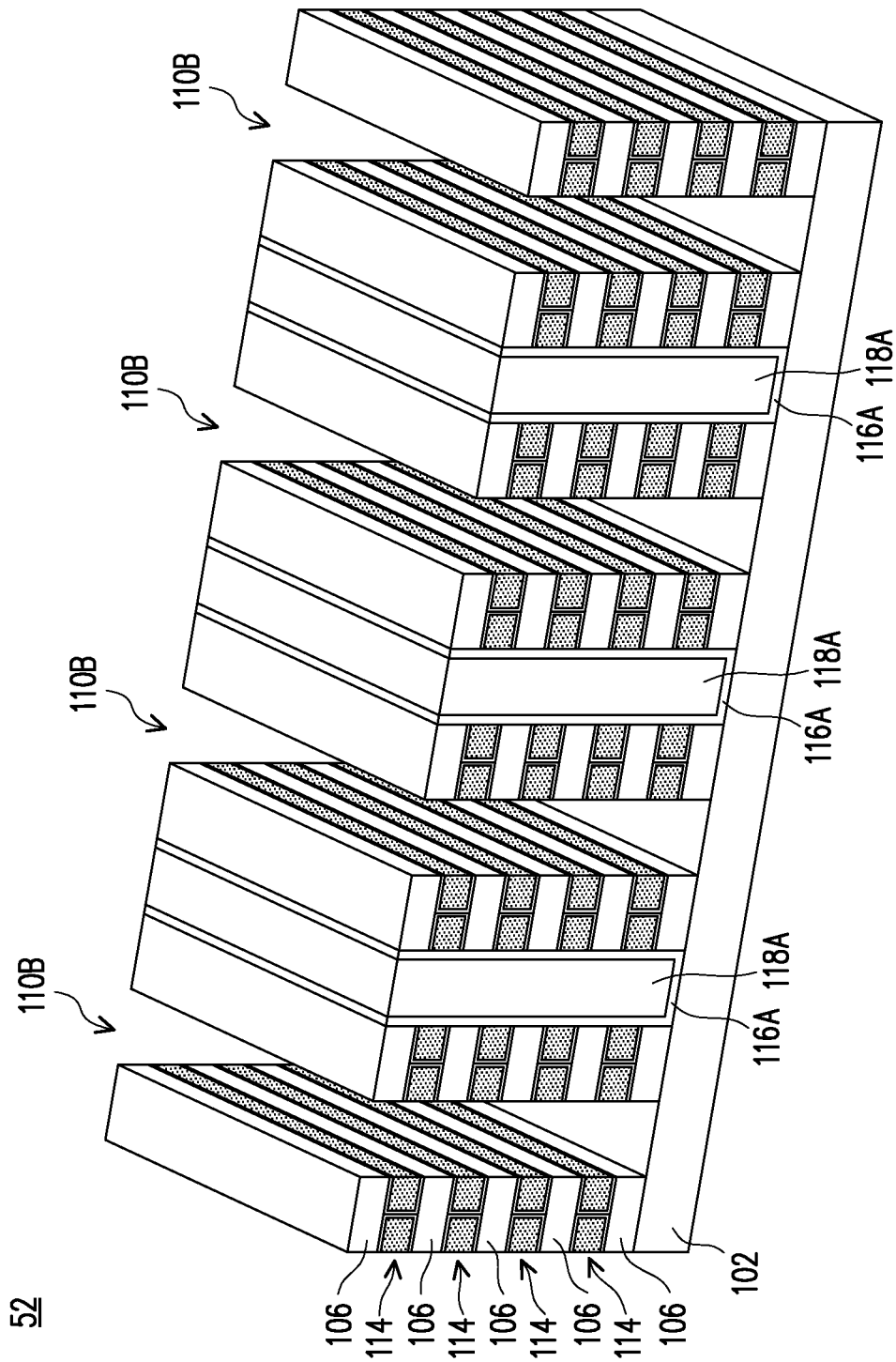
Figure 10B:
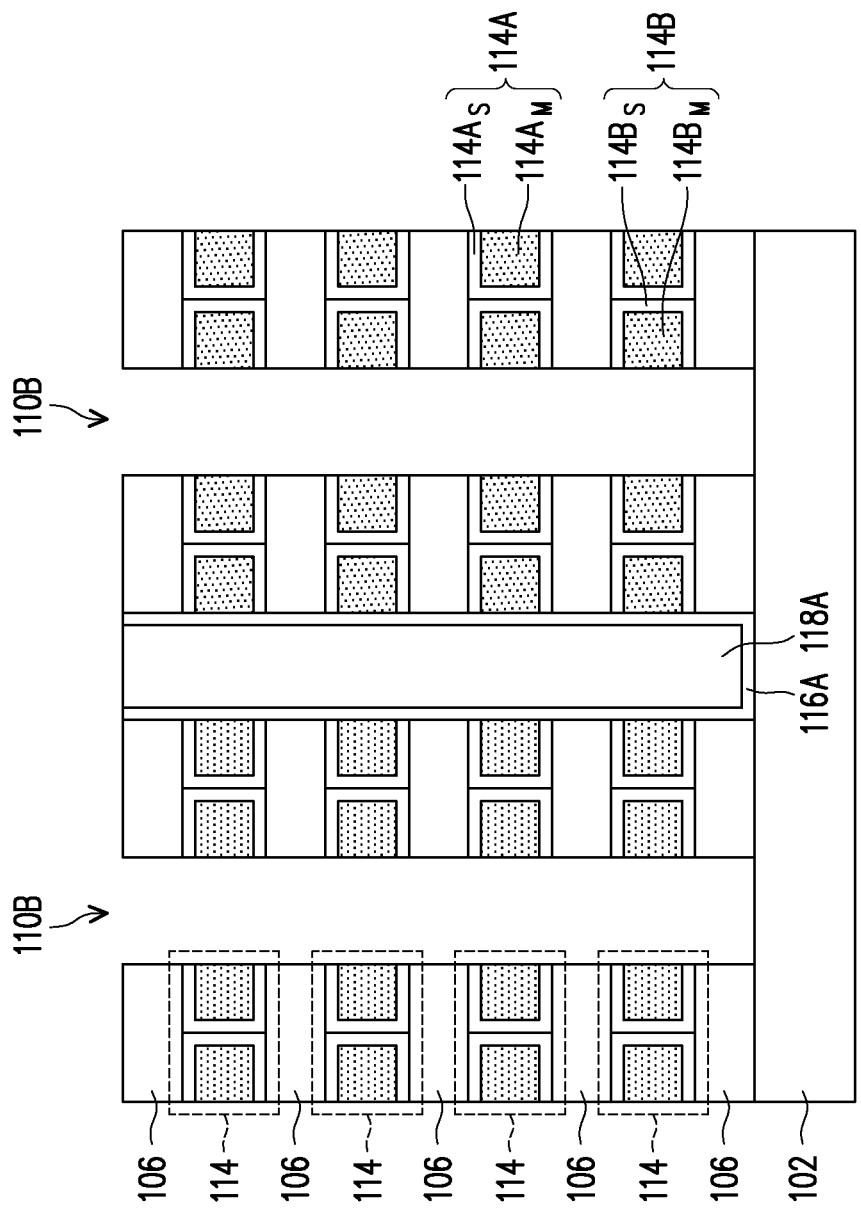

In FIGS. 10A and 10B, conductive features 114B are formed in the sidewall recesses 112B, thus completing a process for replacing second portions of the sacrificial layers 108. The conductive features 114B may be formed of materials that are selected from the same group of candidate materials of the conductive features 114A, which may be formed using methods that are selected from the same group of candidate methods for forming the materials of the conductive features 114A. The conductive features 114A and the conductive features 114B may be formed from the same material, or may include different materials. In some embodiments, the conductive features 114B each include a seed layer $114B_S$ (or barrier layer) and a main layer $114B_M$. The seed layers $114B_S$ and the main layers $114B_M$ can have similar thicknesses as the seed layers $114A_S$ and the main layers $114A_M$, respectively. In some embodiments, the seed layers $114A_S$ and the seed layers $114B_S$ are formed of similar materials, in which case the seed layers $114A_S$ and the seed layers $114B_S$ may merge during formation such that no discernable interfaces exist between them. In another embodiment, the seed layers $114A_S$ and the seed layers $114B_S$ are formed of different materials, in which case the seed layers $114A_S$ and the seed layers $114B_S$ may not merge during formation such that discernable interfaces exist between them. As noted above, misalignment may occur when patterning the trenches 110B. When misalignment occurs, the main layers $114A_M$ have different widths from the main layers $114B_M$ along the second direction $D_2$ (see FIGS. 2A and 2B). When no misalignment occurs, the main layers $114A_M$ have the same width as the main layers $114B_M$ along the second direction $D_2$. Portions of each seed layer $114A_S$. $114B_S$ are laterally disposed between a main layer $114A_M$ and a main layer $114B_M$.

The conductive features 114A and the conductive features 114B are collectively referred to as word lines 114 of the memory array 52. Adjacent pairs of the conductive features 114A and the conductive features 114B are in physical contact with one another and are electrically coupled to one another. Thus, each pair of conductive features 114A, 114B functions as a single word line 114.

Figure 11A:
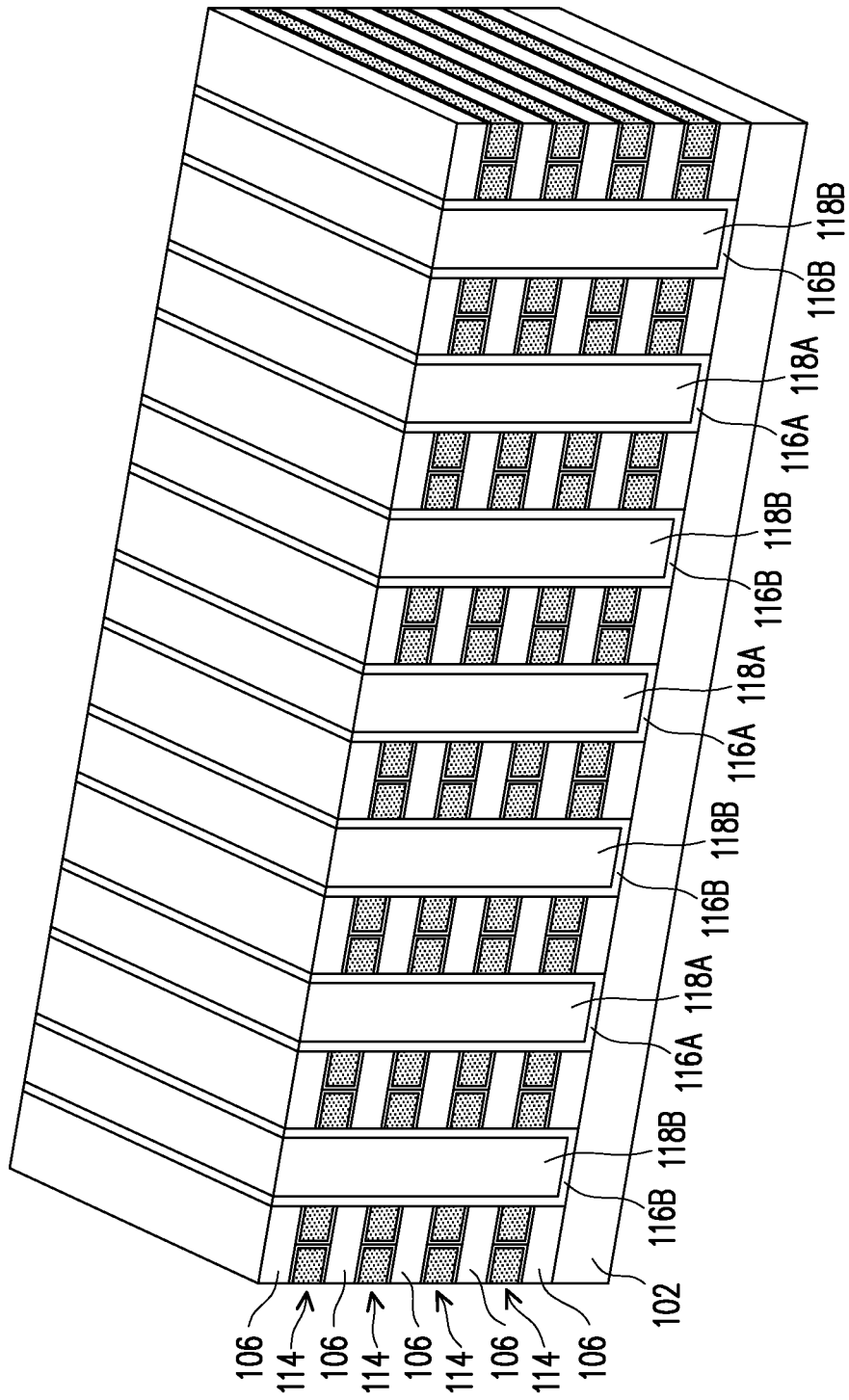
Figure 11B:
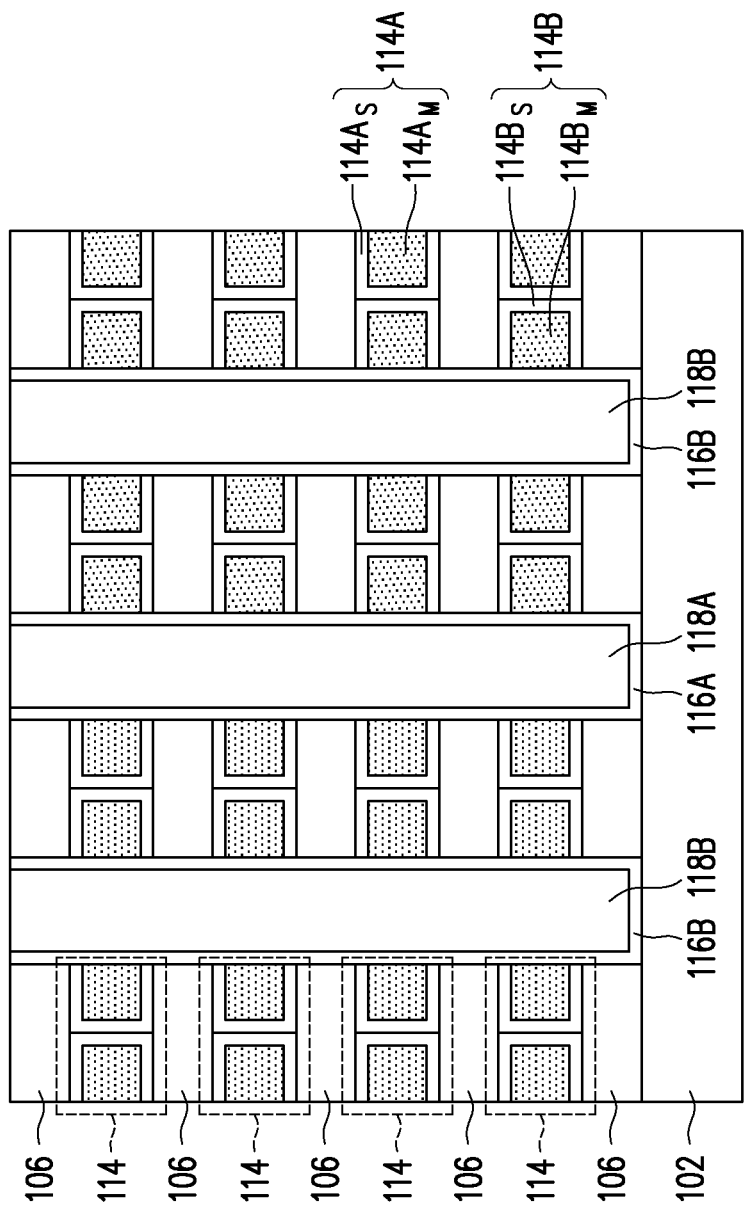

In FIGS. 11A and 11B, tunneling strips 116B and isolation regions 118B are formed in the trenches 110B. Specifically, one tunneling strip 116B and one isolation region 118B is formed in each trench 110B. No semiconductor strips are formed at this step of processing. Rather, as will be discussed in greater detail below, semiconductor strips will be formed through openings in the isolation regions 118B at a subsequent step of processing.

The tunneling strips 116B may be formed of a material that is selected from the same group of candidate materials of the tunneling strips 116A, and may be formed using a method that is selected from the same group of candidate methods for forming the material of the tunneling strips 116A. The tunneling strips 116A and the tunneling strips 116B may be formed from the same material, or may include different materials. The tunneling strips 116A and the tunneling strips 116B are collectively referred to as tunneling strips 116. A thickness of the tunneling strips 116 can be in the range of about 2 nm to about 20 nm.

The isolation regions 118B may be formed of a material that is selected from the same group of candidate materials of the isolation regions 118A, and may be formed using a method that is selected from the same group of candidate methods for forming the material of the isolation regions 118A. The isolation regions 118A and the isolation regions 118B may be formed from the same material, or may include different materials. The isolation regions 118A and the isolation regions 118B are collectively referred to as isolation regions 118. A thickness of the isolation regions 118 can be in the range of about 42 nm to about 192 nm.

The tunneling strips 116B and the isolation regions 118B may be formed by a combination of deposition, etching, and planarization. For example, the tunneling strips 116B and the isolation regions 118B may be formed by similar steps (discussed above for FIGS. 7A and 7B) as those used to form the tunneling strips 116A and the isolation regions 118A.

Figure 12A:
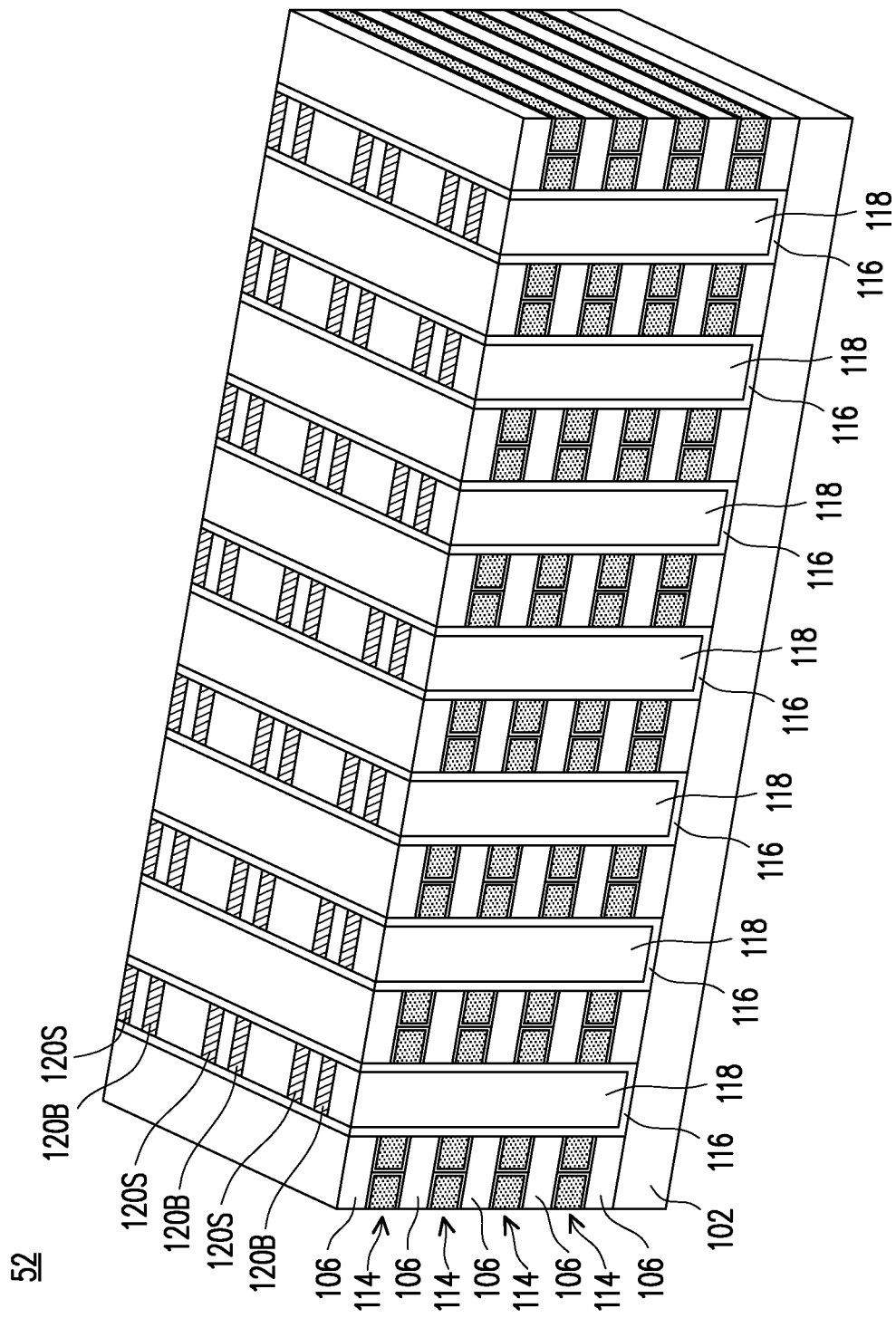
Figure 12B:
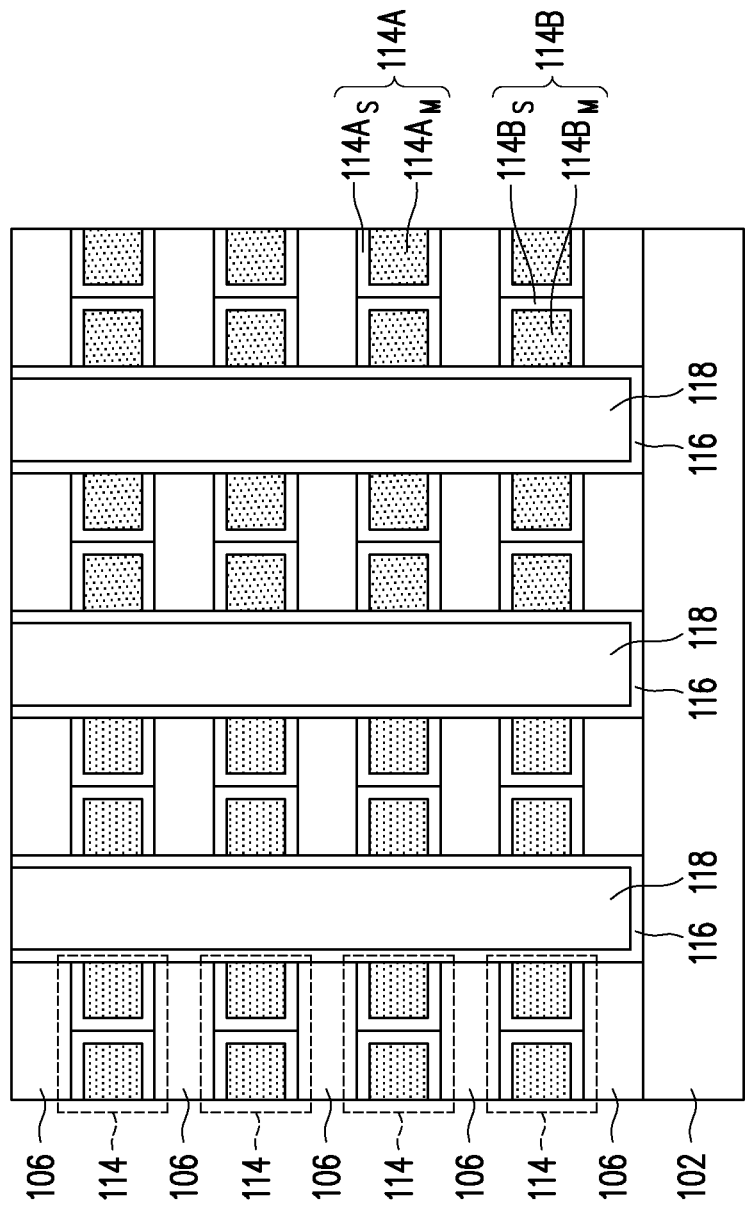

In FIGS. 12A and 12B, conductive lines (including bit lines 120B and source lines 120S) are formed extending through the isolation regions 118. The bit lines 120B and the source lines 120S are conductive pillars, and may also be referred to as bit line pillars and source line pillars. Each TFT will include a bit line 120B and a source line 120S. The bit lines 120B and the source lines 120S also act as source/drain regions of the TFTs. As such, semiconductor strips including channel regions of the TFTs will be formed in contact with the bit lines 120B/source lines 120S at a subsequent step of processing, so that the bit lines 120B/source lines 120S adjoin the channel regions of the TFTs.

As an example to form the bit lines 120B/source lines 120S, openings are formed through the isolation regions 118. The openings may be formed with an etching process that is selective to the isolation regions 118 (e.g., selectively removes the material of the isolation regions 118 at a faster rate than the material of the tunneling strips 116). For example, the openings may be formed through the isolation regions 118 by a dry etch using ammonia ($NH_3$) and hydrogen fluoride (HF) gas, which may be performed using an etching mask having a pattern of the bit lines 120B/source lines 120S. A liner, such as a diffusion barrier layer, an adhesion layer, or the like, and a main layer are then formed in the openings. The liner may be formed of a conductive material such as titanium, titanium nitride, tantalum, tantalum nitride, or the like, which may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The main layer may be formed of a conductive material such as tungsten, cobalt, ruthenium, aluminum, nickel, copper, a copper alloy, silver, gold, or the like, which may be deposited by ALD, CVD, PVD, or the like. In some embodiments, the bit lines 120B/source lines 120S include a liner formed of titanium nitride and a main layer formed of tungsten. A removal process is then applied to the various layers to remove excess material(s) of the bit lines 120B/source lines 120S over the isolation regions 118, the tunneling strips 116, and the topmost dielectric layers 106/word lines 114. The removal process may be a planarization process such as a chemical mechanical polish (CMP), an etch-back, combinations thereof, or the like. The remaining material(s) in the openings form the bit lines 120B/source lines 120S. The planarization process exposes the topmost dielectric layers 106/word lines 114 such that top surfaces of the bit lines 120B/source lines 120S, the isolation regions 118, the tunneling strips 116, and the topmost dielectric layers 106/word lines 114 are coplanar (within process variations) after the planarization process.

As will be discussed in greater detail below, FIGS. 13A through 19B illustrate a process in which portions of the isolation regions 118 are replaced with the remaining features of the TFTs. Specifically, portions of the isolation regions 118 are replaced with isolation regions 136 (see FIGS. 16A and 16B), semiconductor strips 138 (see FIGS. 17A and 17B), and back gates 144 (see FIGS. 19A and 19B) for the TFTs. The semiconductor strips 138 include channel regions of the TFTs. The isolation regions 136 surround the back gates 144 and separate the back gates 144 from the semiconductor strips 138, e.g., the channel regions. The remaining portions of the isolation regions 118 separate the features of horizontally adjacent TFTs along the direction $D_1$ (see FIGS. 2A and 2B). As noted above, the back gates 144 are used to provide a biasing voltage during write operations (e.g., erase or programming operations) of the TFTs. The back gates 144 can also help control the surface potential of the semiconductor strips 138 (particularly the portions of the semiconductor strips 138 distal the word lines 114) during write operations.

Figure 13A:
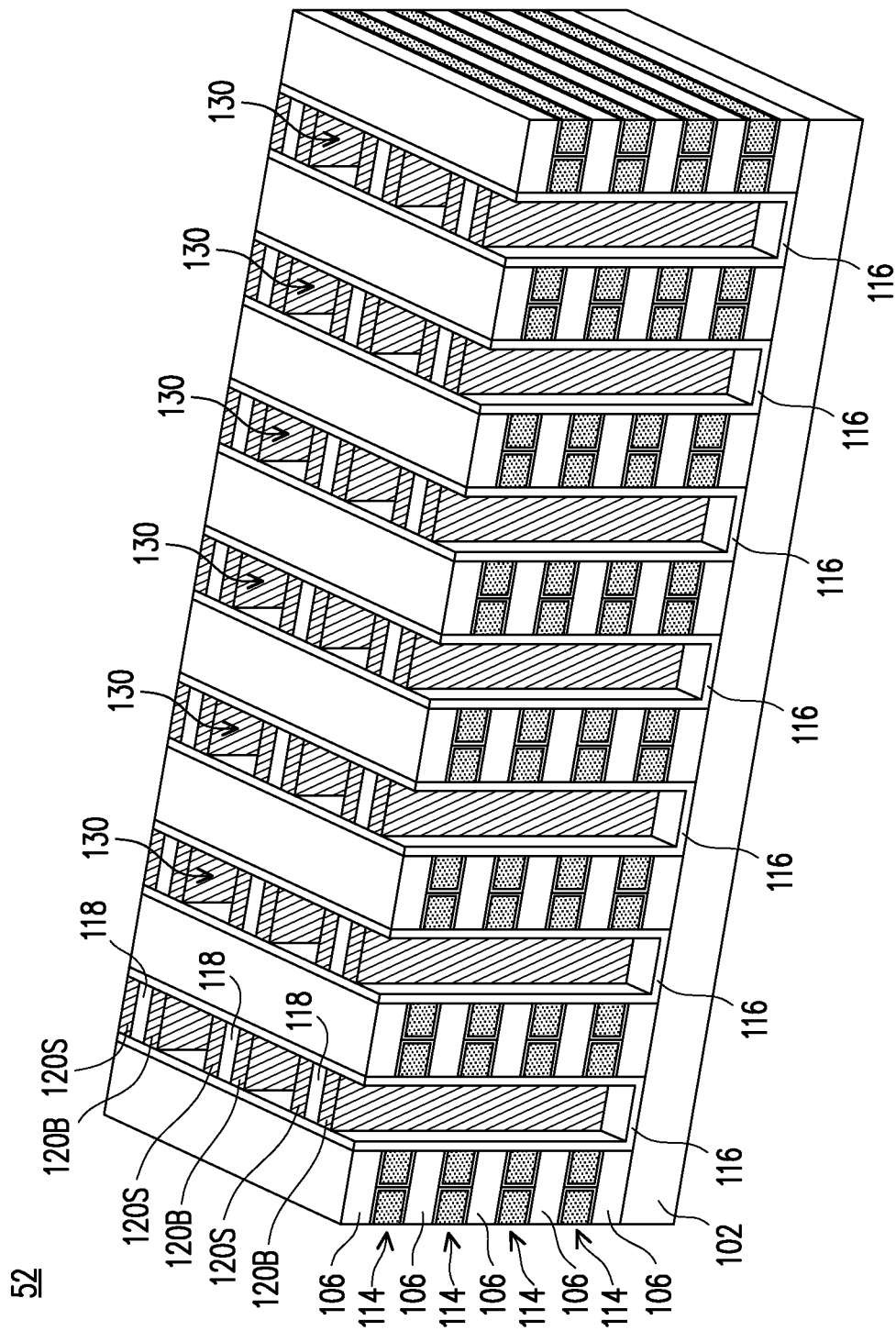
Figure 13B:
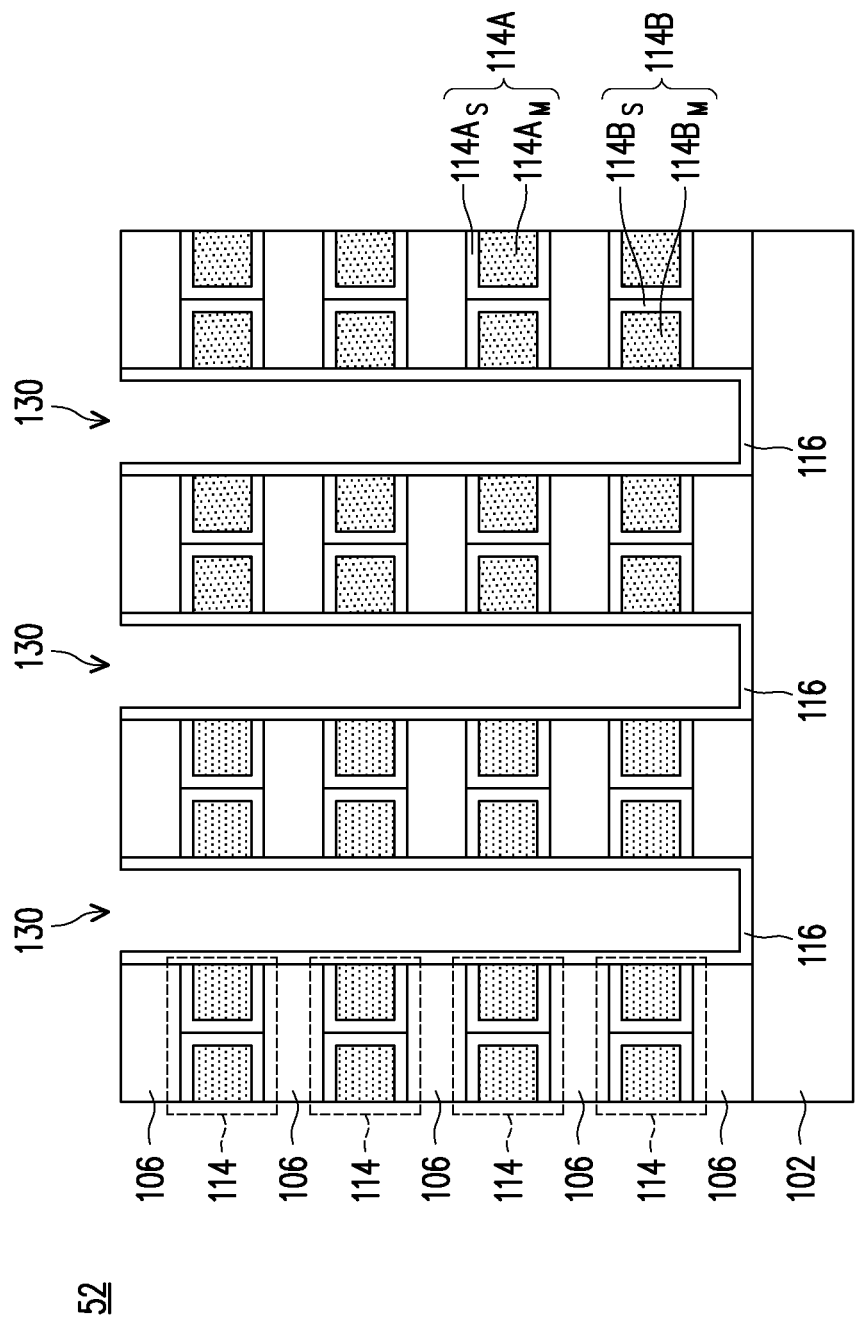

In FIGS. 13A and 13B, portions of the isolation regions 118 are removed to form openings 130. The openings 130 may be formed with an etching process that is selective to the isolation regions 118 (e.g., selectively removes the material of the isolation regions 118 at a faster rate than the materials of the tunneling strips 116 and the bit lines 120B/source lines 120S). For example, the openings 130 may be formed through the isolation regions 118 by a dry etch using ammonia ($NH_3$) and hydrogen fluoride (HF) gas, which may be performed using an etching mask having a pattern of the openings 130.

Figure 14A:
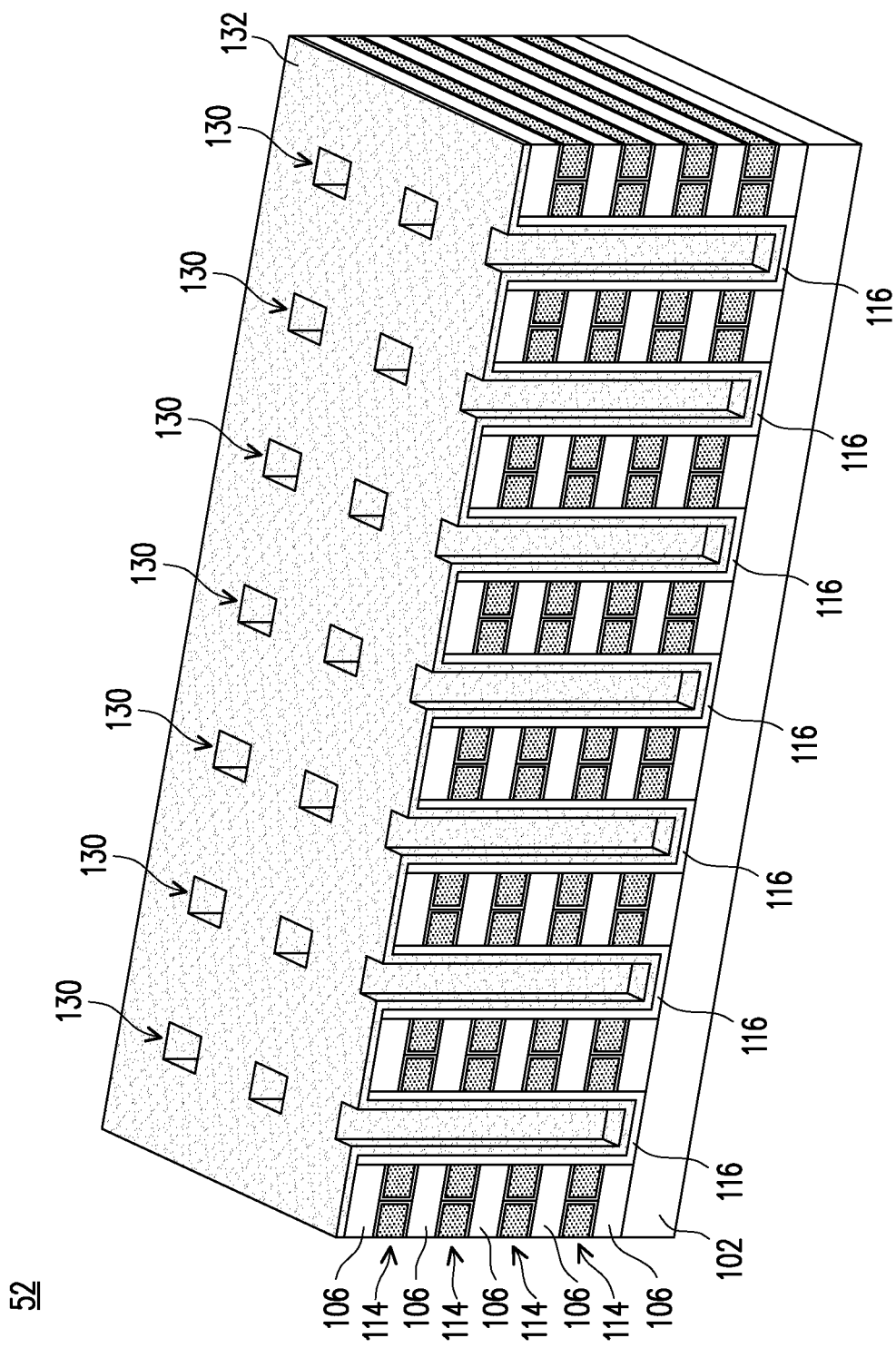
Figure 14B:
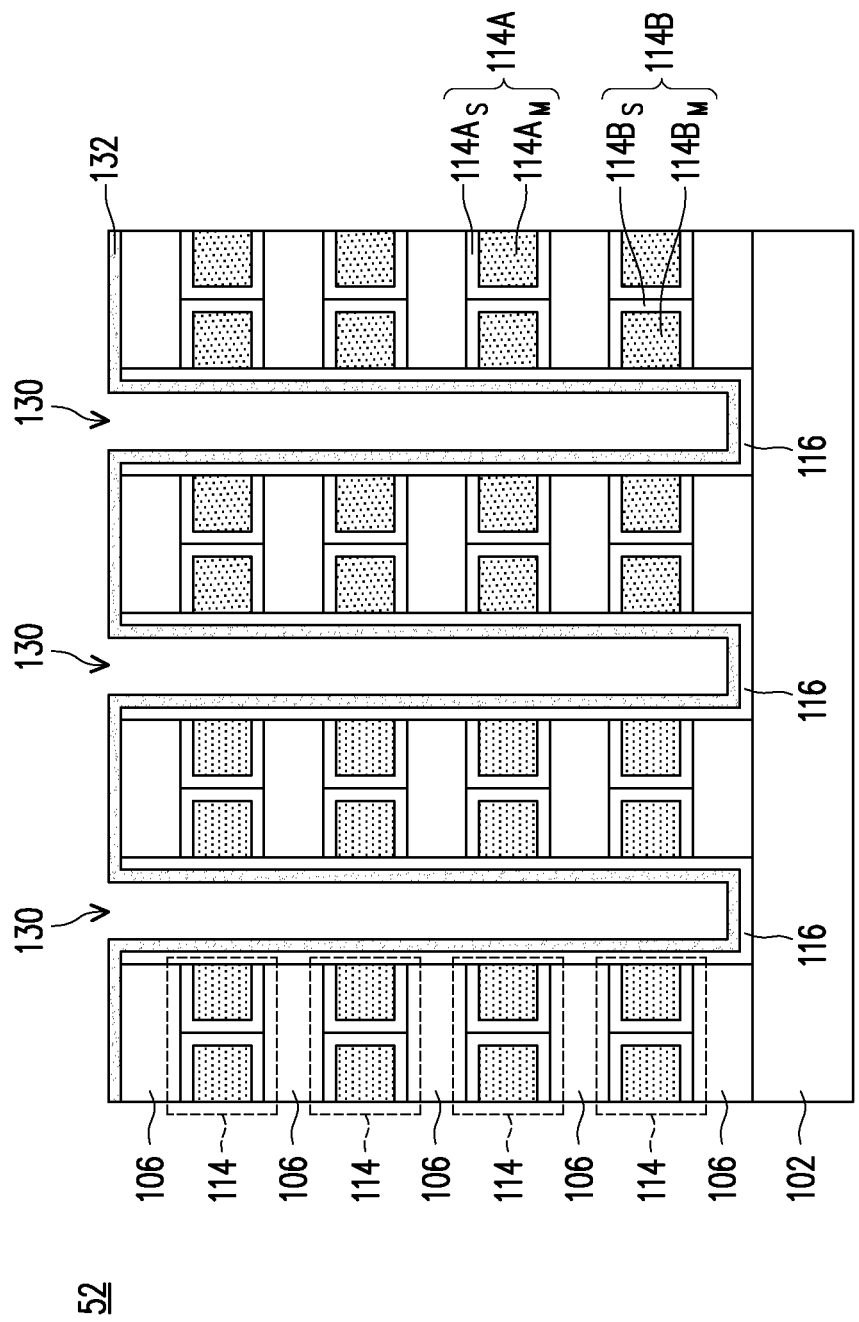

In FIGS. 14A and 14B, a semiconductor layer 132 is conformally deposited in the openings 130 and on the topmost dielectric layers 106/word lines 114, the isolation regions 118, and the bit lines 120B/source lines 120S. The semiconductor layer 132 will be subsequently patterned to form semiconductor strips that include channel regions of the TFTs. The semiconductor layer 132 is formed of an acceptable material for providing channel regions for the TFTs, such as indium gallium zinc oxide (IGZO), indium tin oxide (ITO), indium gallium zinc tin oxide (IGZTO), zinc oxide (ZnO), polysilicon, amorphous silicon, or the like. The material of the semiconductor layer 132 may be formed by an acceptable deposition process such as ALD, CVD, PVD, or the like. In some embodiments, the semiconductor layer 132 is IGZTO deposited by ALD. The semiconductor layer 132 can have a thickness in the range of about 9 nm to about 11 nm.

Figure 15A:
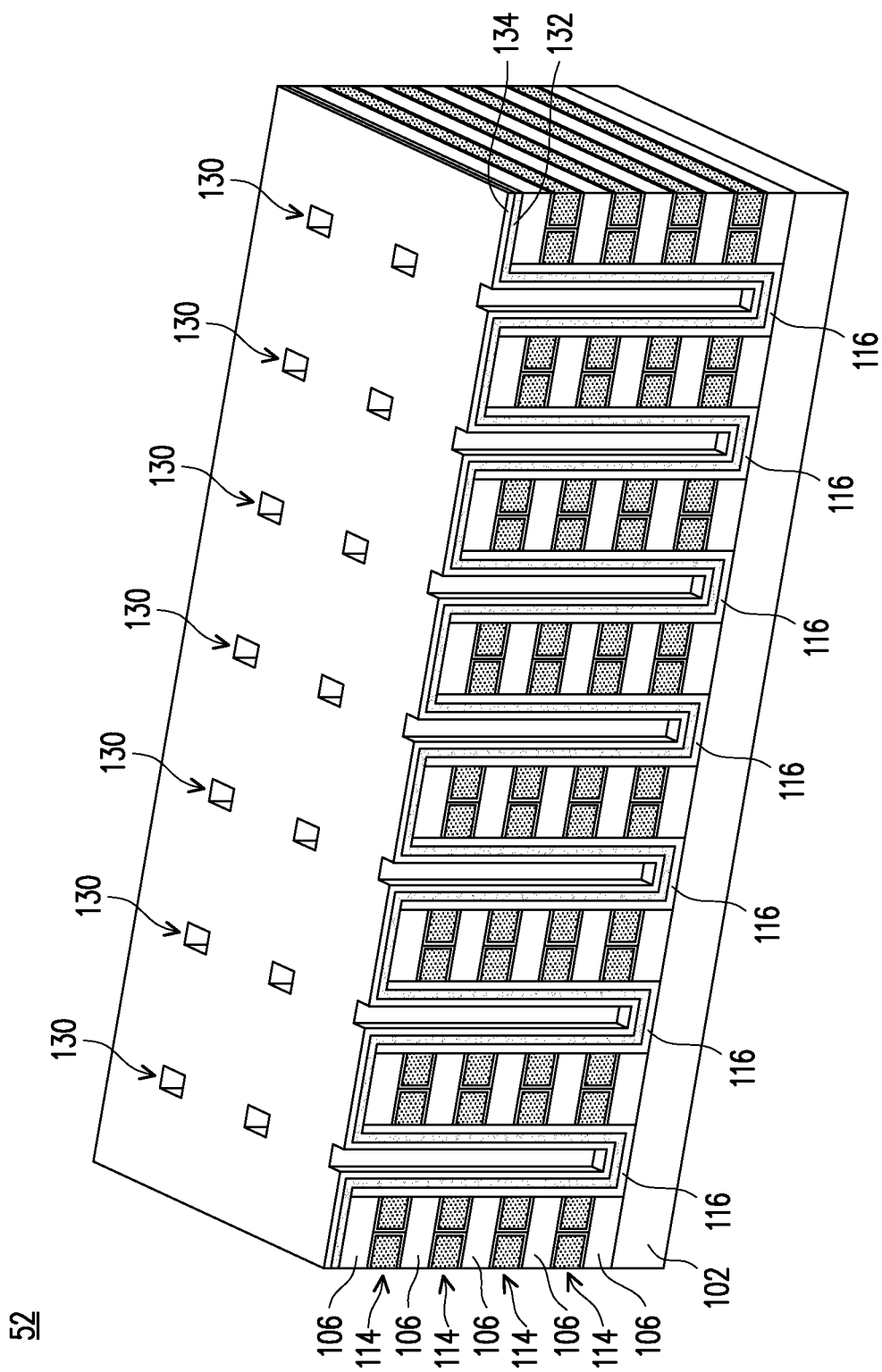
Figure 15B:
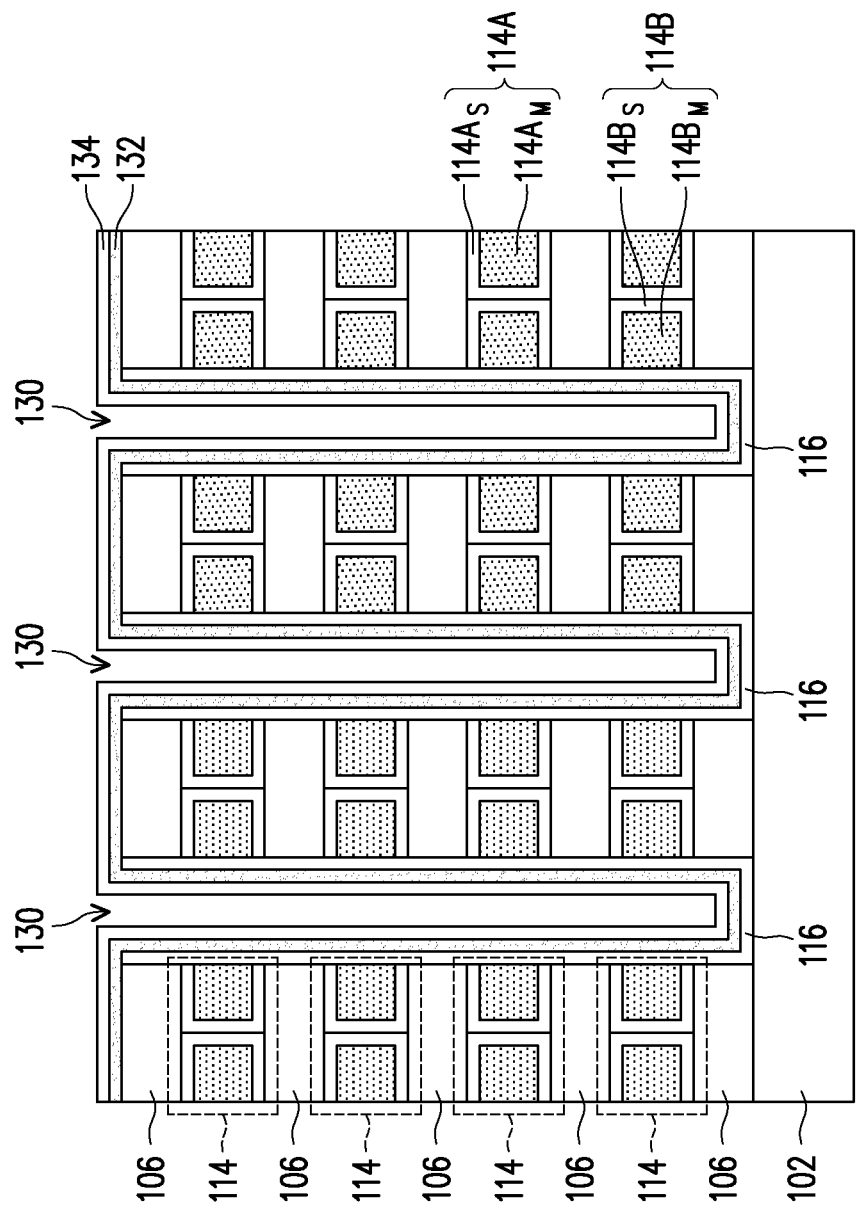

In FIGS. 15A and 15B, a dielectric layer 134 is conformally deposited on the semiconductor layer 132 and in the openings 130. The dielectric layer 134 may be formed of materials that are selected from the same group of candidate materials of the dielectric layer 106, and may be formed using methods that are selected from the same group of candidate methods for forming the materials of the dielectric layer 106. The dielectric layer 106 and the dielectric layer 134 may be formed from the same material, or may include different materials. In some embodiments, the dielectric layer 134 is an oxide such as silicon oxide deposited by ALD. In another embodiment, the dielectric layer 134 can be formed of a high-k ferroelectric material, such as a material that is selected from the same group of candidate materials of the tunneling strips 116. The dielectric layer 134 can have a thickness in the range of about 1 nm to about 100 nm.

Figure 16A:
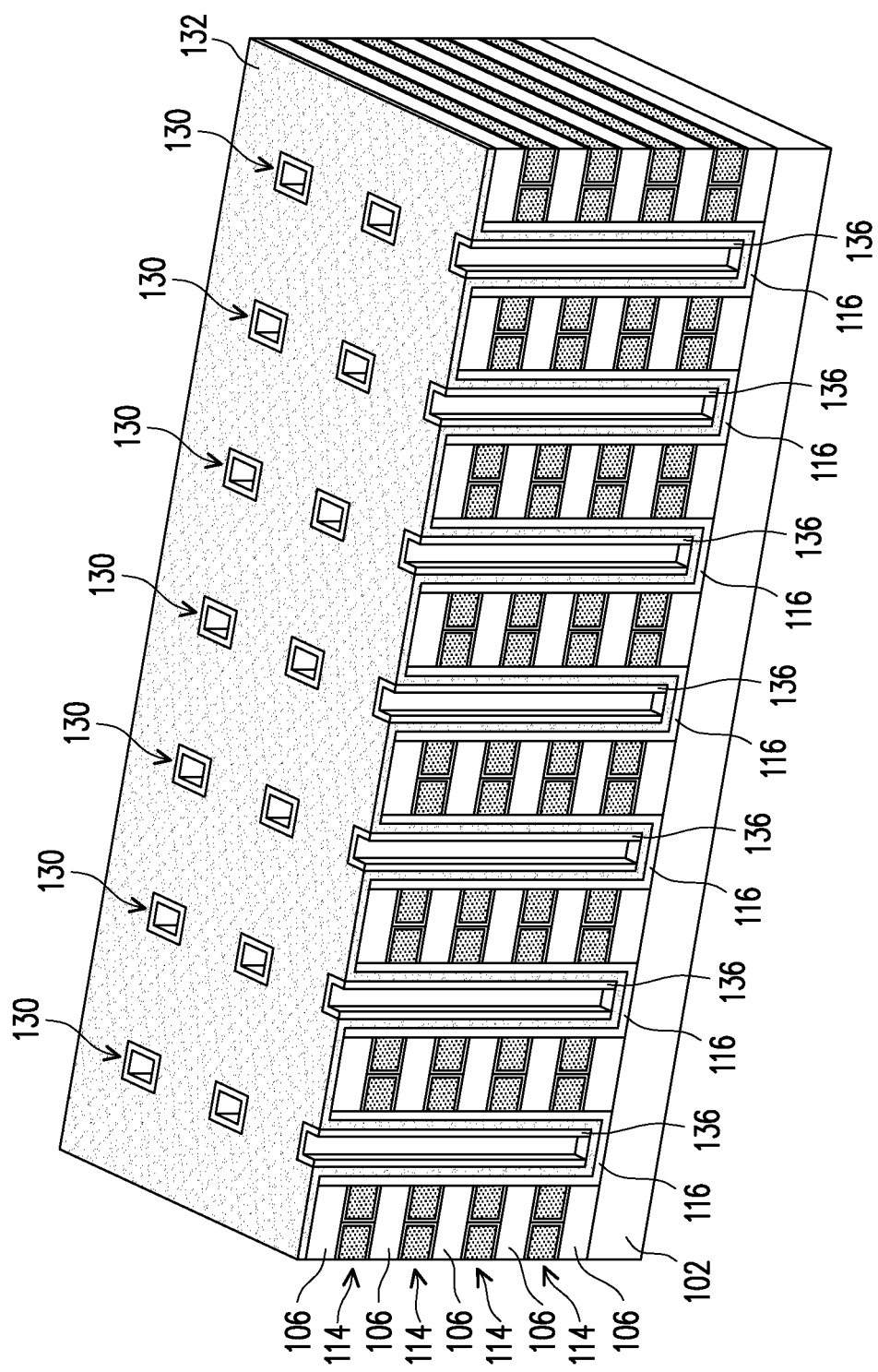
Figure 16B:
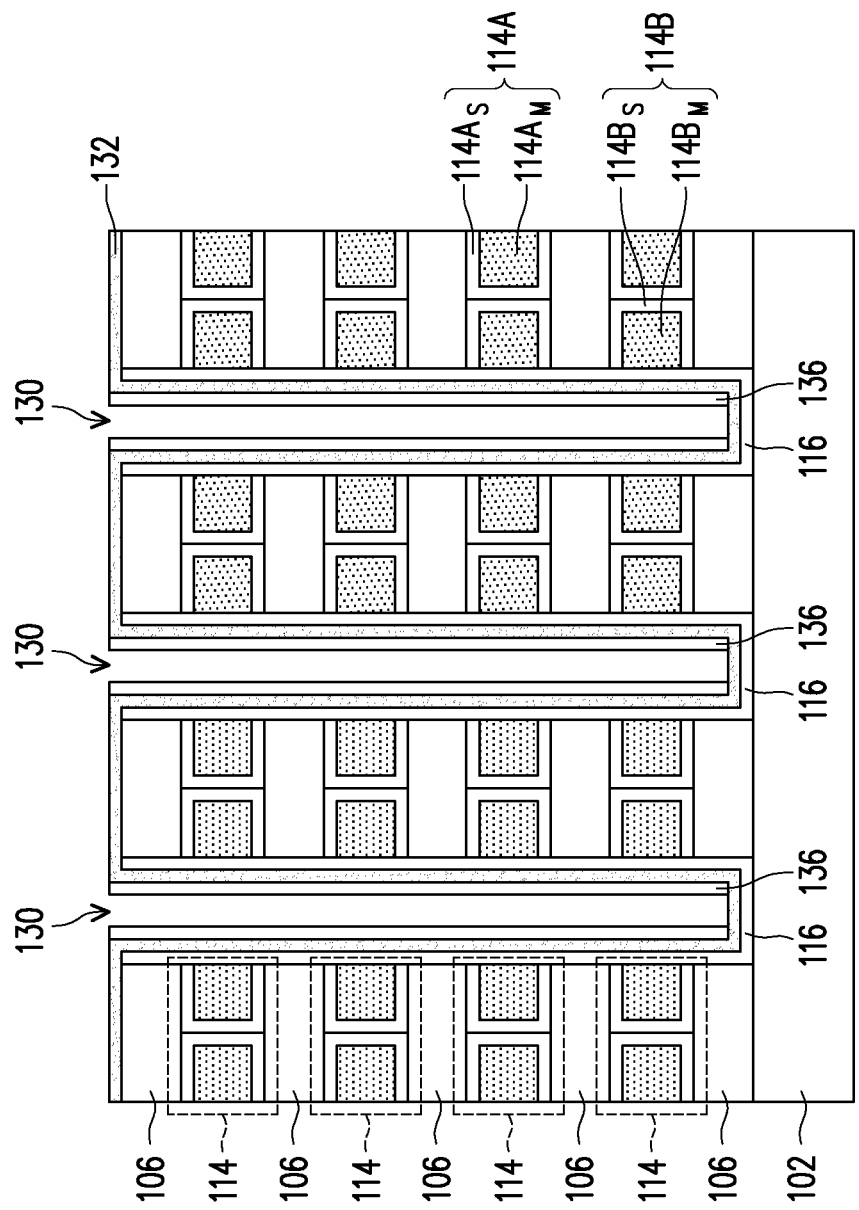

In FIGS. 16A and 16B, the dielectric layer 134 is patterned to form isolation regions 136 in the openings 130. A suitable etching process is performed on the dielectric layer 134 using the semiconductor layer 132 as an etch stop layer. The etching process is selective to the dielectric layer 134 (e.g., selectively removes the material of the dielectric layer 134 at a faster rate than the material of the semiconductor layer 132). The etch may be anisotropic. The etching process removes the horizontal portions of the dielectric layer 134, thus extending the openings 130 through the dielectric layer 134 and exposing the semiconductor layer 132. After the etching process, the isolation regions 136 include the remaining vertical portions of the dielectric layer 134.

Figure 17A:
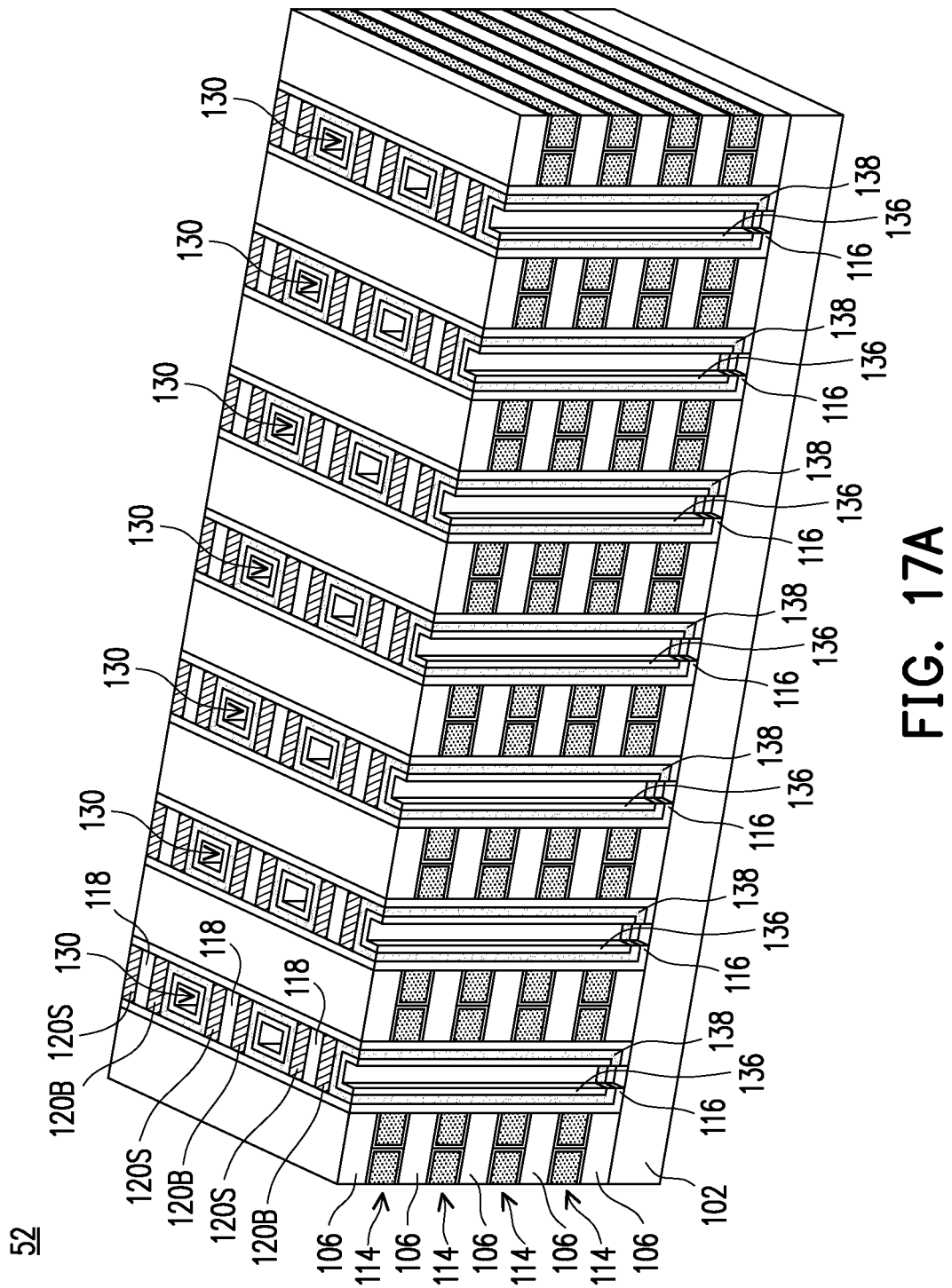
Figure 17B:
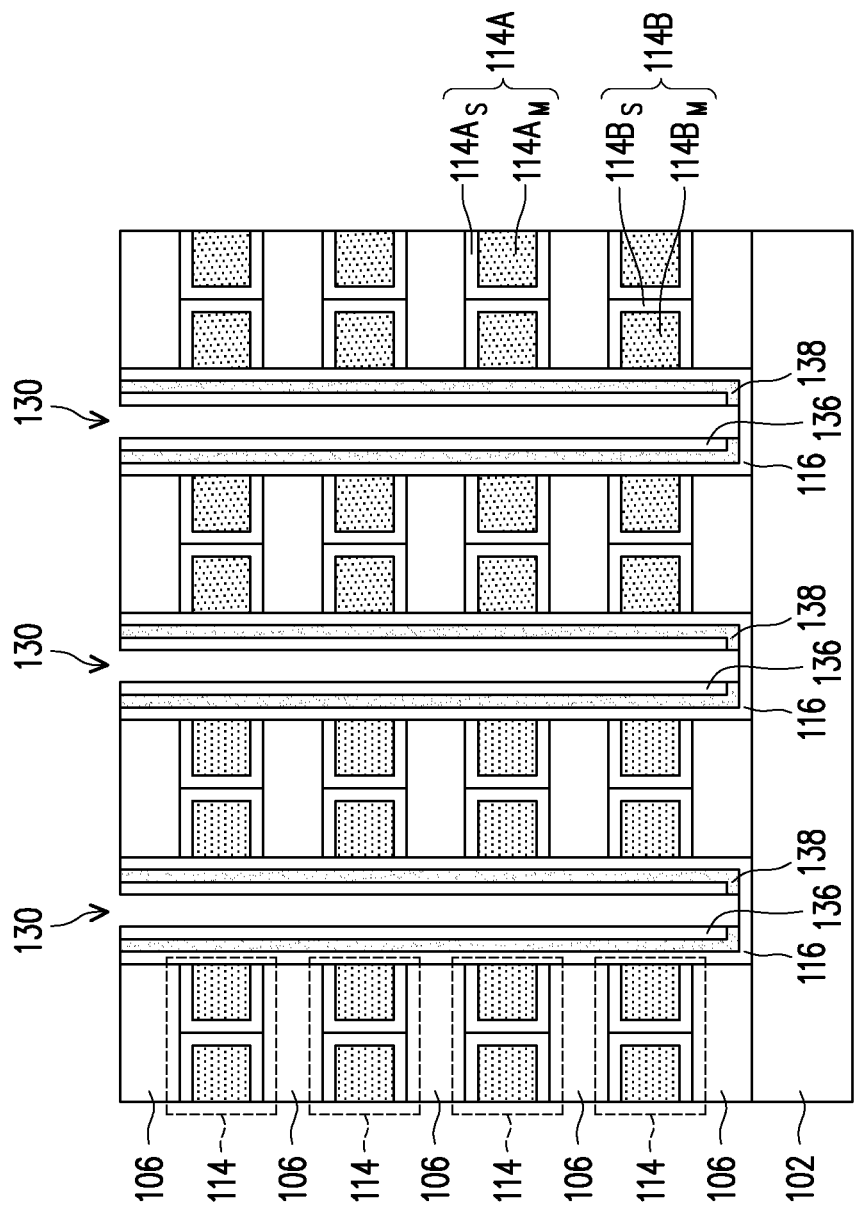

In FIGS. 17A and 17B, the semiconductor layer 132 is patterned to form semiconductor strips 138 in the openings 130. A suitable etching process is performed on the semiconductor layer 132 using the isolation regions 136 as an etching mask. The etching process is selective to the semiconductor layer 132 (e.g., selectively removes the material of the semiconductor layer 132 at a faster rate than the material(s) of the dielectric layer 134 and the tunneling strips 116). The etch may be anisotropic. The etching process removes the horizontal portions of the semiconductor layer 132 that are not masked by the isolation regions 136, thus extending the openings 130 through the semiconductor layer 132 and exposing the tunneling strips 116.

Optionally, the openings 130 can be further extended through the tunneling strips 116 and the substrate 102. As will be discussed in greater detail below, in some embodiments, the memory array 52 is embedded in another semiconductor device. Specifically, the memory array 52 can be formed in the interconnect structure of the semiconductor device. In such embodiments, the openings 130 are extended through the tunneling strips 116 and the substrate 102 so that subsequently formed back gates can be connected to metallization layers of the interconnect structure underlying the memory array 52. A suitable etching process can be performed on the tunneling strips 116 and the substrate 102 using the isolation regions 136 and the semiconductor strips 138 as an etching mask. The etching process is selective to the tunneling strips 116 and the substrate 102 (e.g., selectively removes the material(s) of the tunneling strips 116 and the substrate 102 at a faster rate than the material(s) of the isolation regions 136 and the semiconductor strips 138). The etch may be anisotropic. In some embodiments, the etching process includes multiple etches. For example, a first etch can be performed to extend the openings 130 through the tunneling strips 116, and a second etch can be performed to extend the openings 130 through the substrate 102.

Figure 18A:
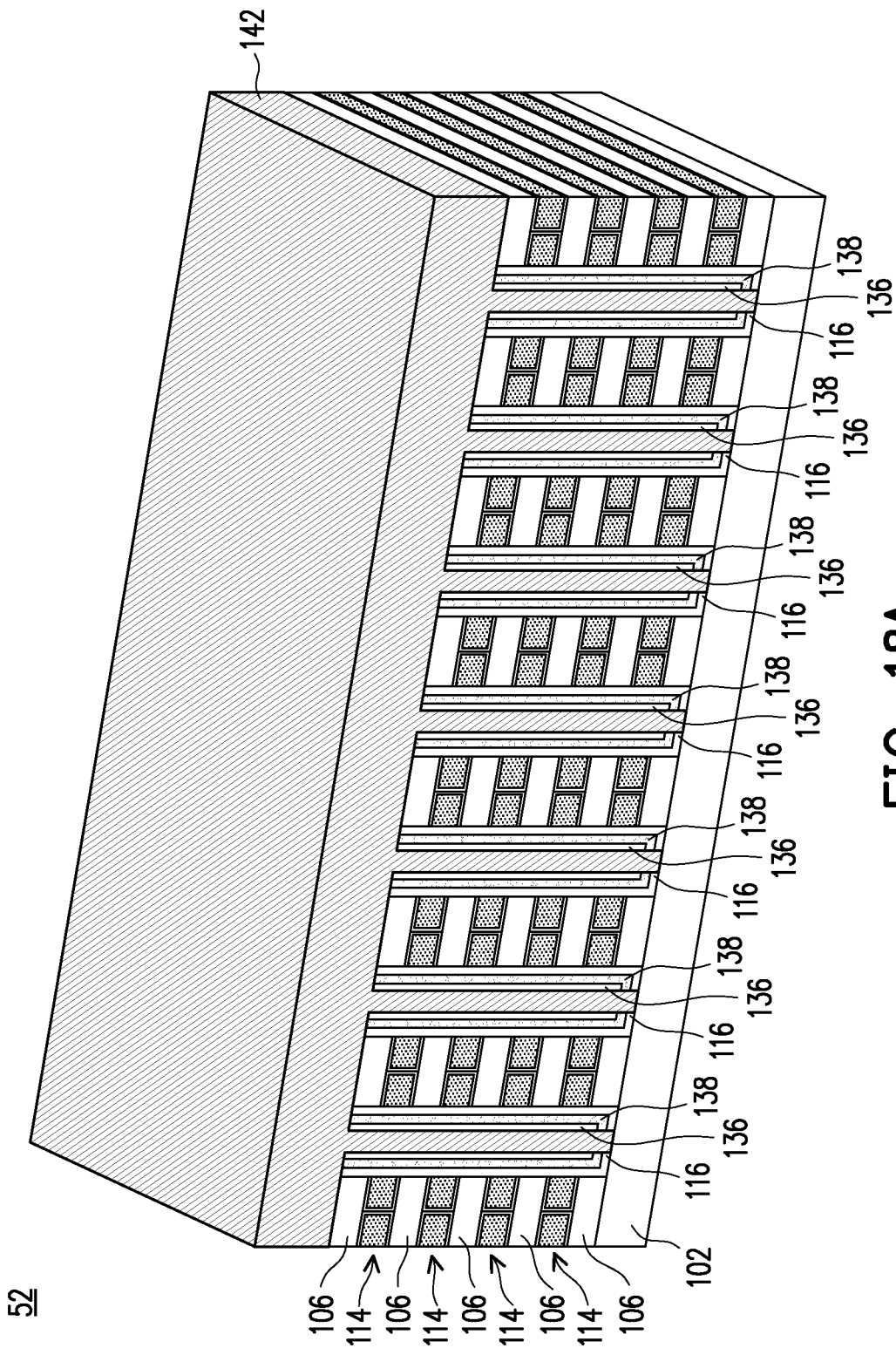
Figure 18B:
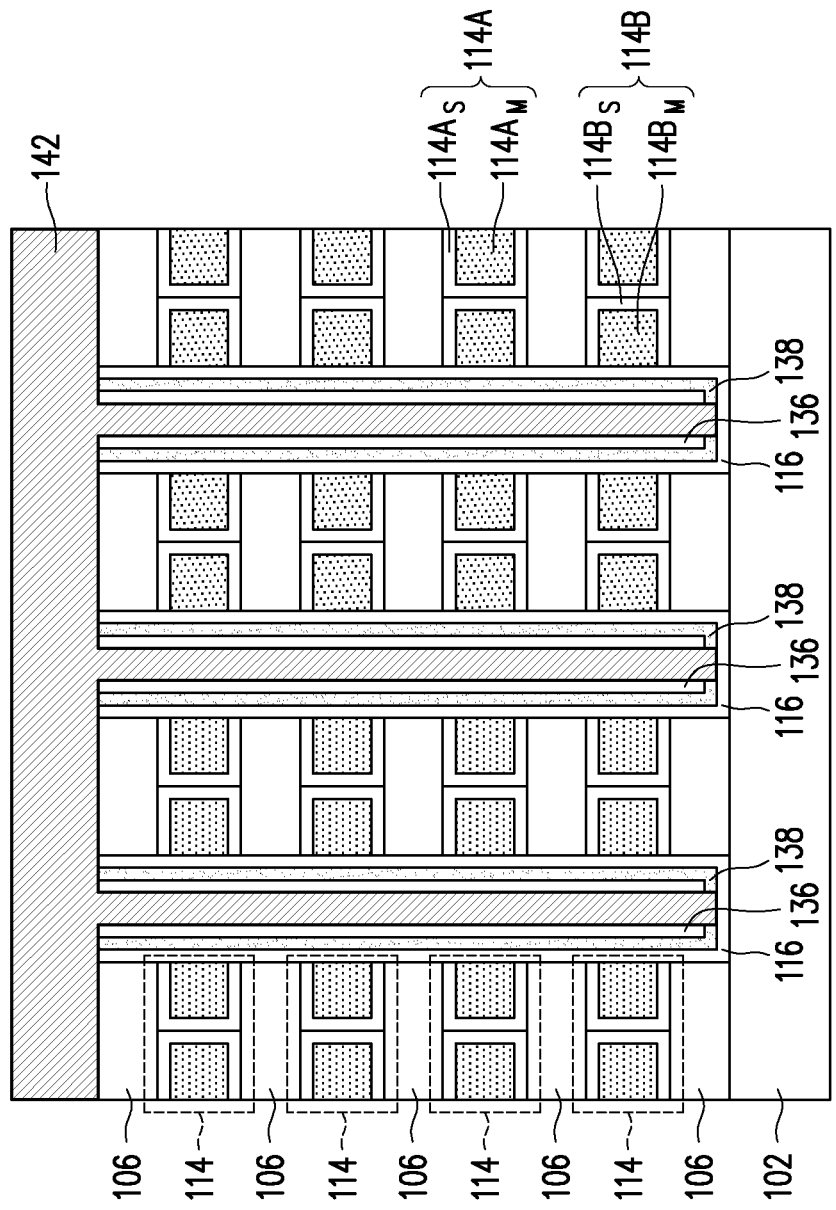

In FIGS. 18A and 18B, a conductive layer 142 is formed in the openings 130 and on the topmost dielectric layers 106/word lines 114, the isolation regions 118, the bit lines 120B/source lines 120S, the isolation regions 136, and the semiconductor strips 138. The conductive layer 142 may be formed of a conductive material such as tungsten, cobalt, ruthenium, aluminum, nickel, copper, a copper alloy, silver, gold, or the like, which may be deposited by ALD, CVD, PVD, or the like. The conductive layer 142 may be conformally deposited. In some embodiments, the conductive layer 142 is a layer of tungsten.

Figure 19A:
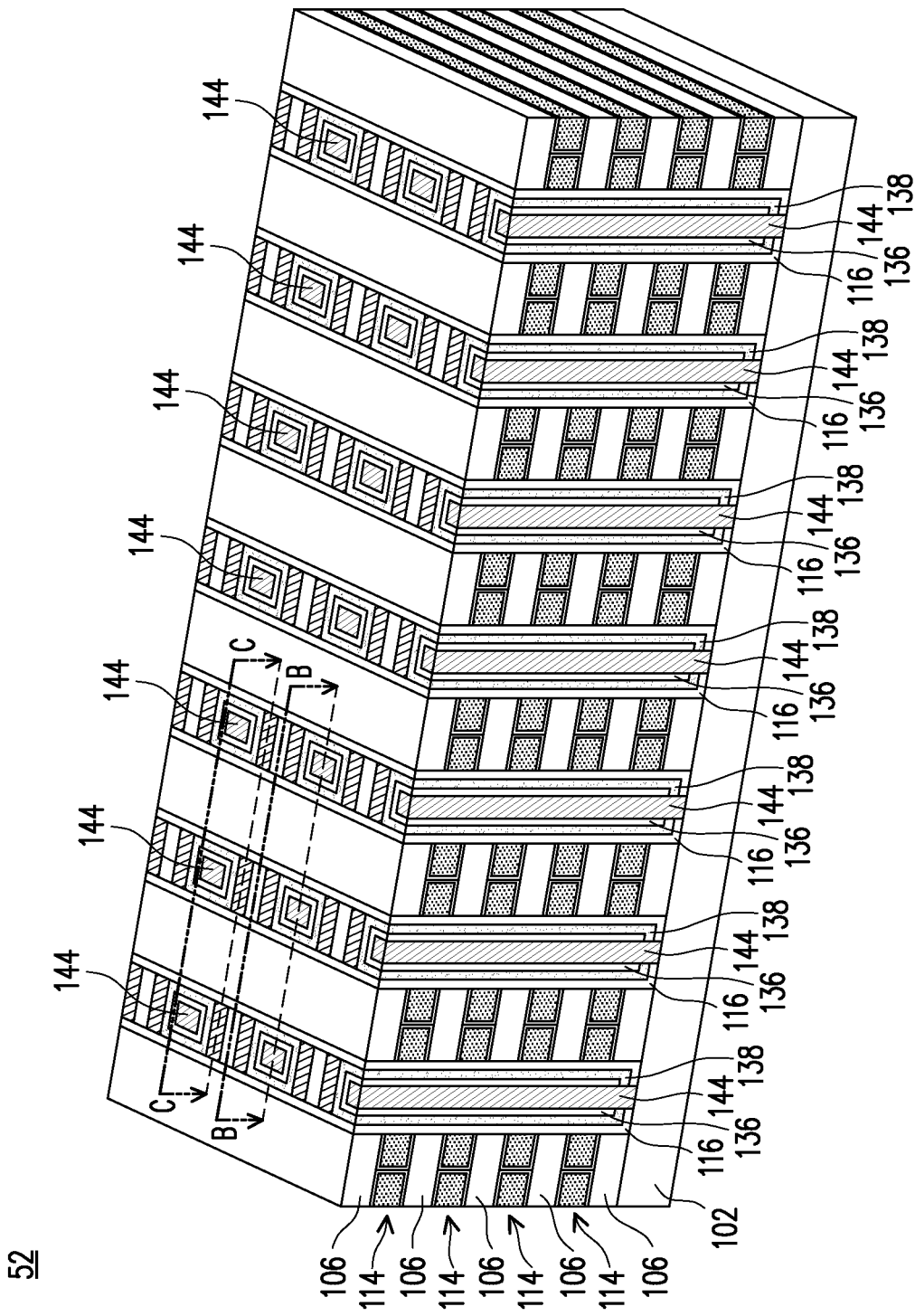
Figure 19B:
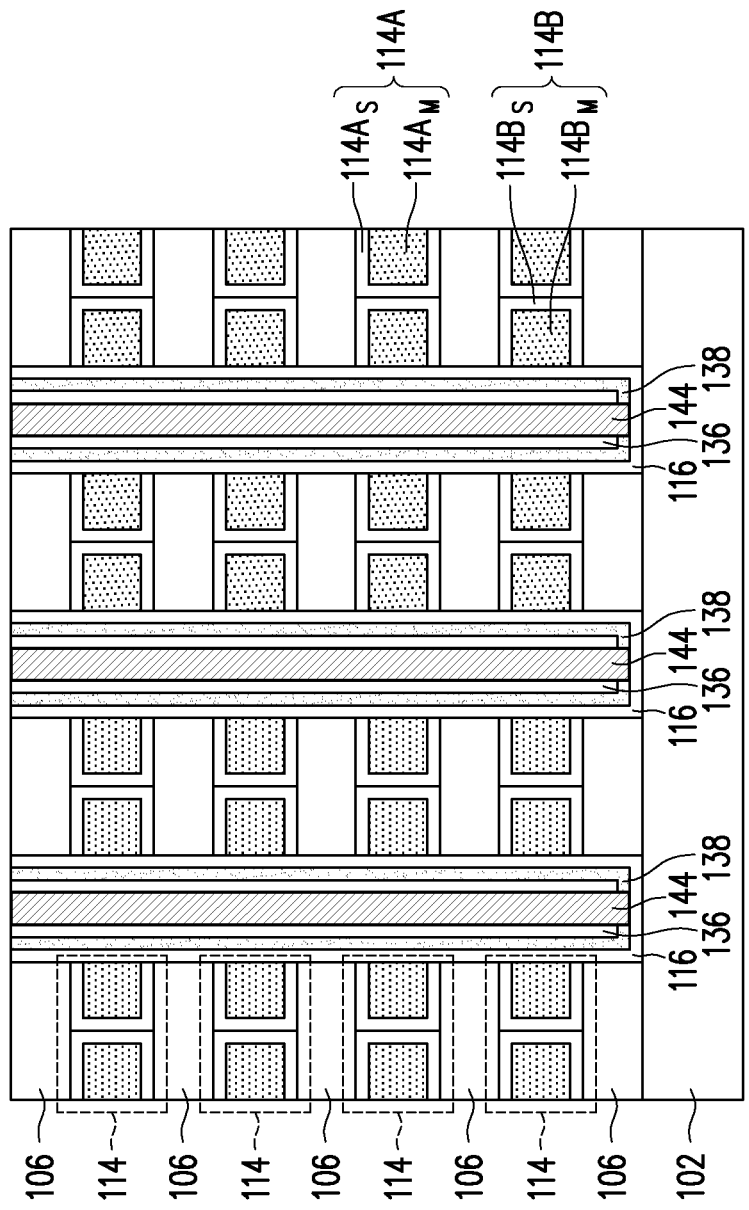

In FIGS. 19A and 19B, a removal process is performed on the conductive layer 142 to form back gates 144. The removal process removes excess material of the conductive layer 142 over the topmost dielectric layers 106/word lines 114, the isolation regions 118, the bit lines 120B/source lines 120S, the isolation regions 136, and the semiconductor strips 138. The removal process can also remove excess materials of the semiconductor layer 132 (see FIGS. 14A and 14B) and/or the dielectric layer 134 (see FIGS. 15A and 15B) that may remain over the topmost dielectric layers 106/word lines 114, the isolation regions 118, and the bit lines 120B/source lines 120S. The removal process may be a planarization process such as a chemical mechanical polish (CMP), an etch-back, combinations thereof, or the like. The remaining material of the conductive layer 142 in the openings 130 forms the back gates 144. The back gates 144 are conductive pillars that are disposed between and parallel to the bit lines 120B and the source lines 120S. The planarization process exposes the topmost dielectric layers 106/word lines 114 such that top surfaces of the topmost dielectric layers 106/word lines 114, the isolation regions 118, the bit lines 120B/source lines 120S, the isolation regions 136, the semiconductor strips 138, and the back gates 144 are coplanar (within process variations) after the planarization process.

Figure 20A:
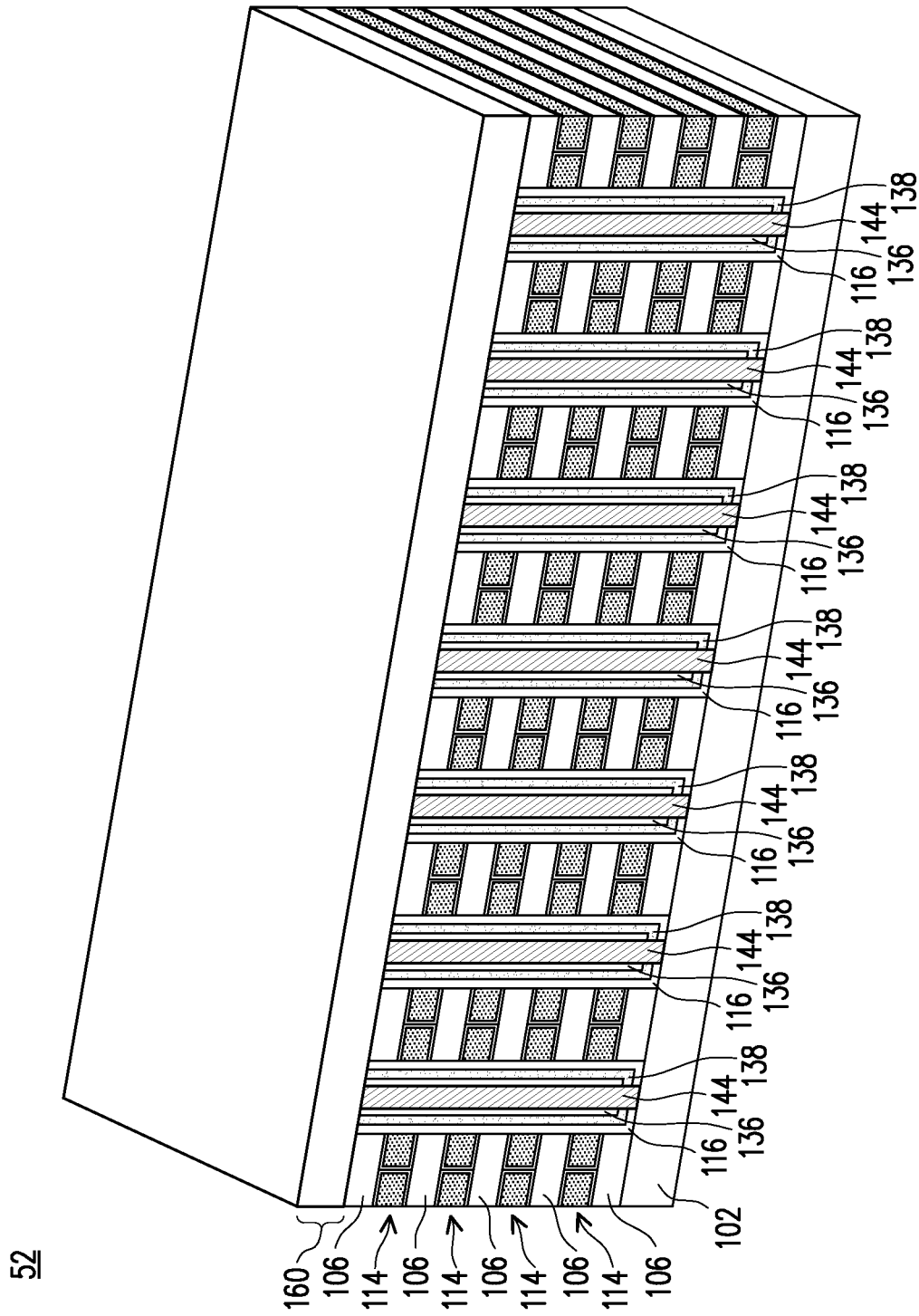
Figure 20B:
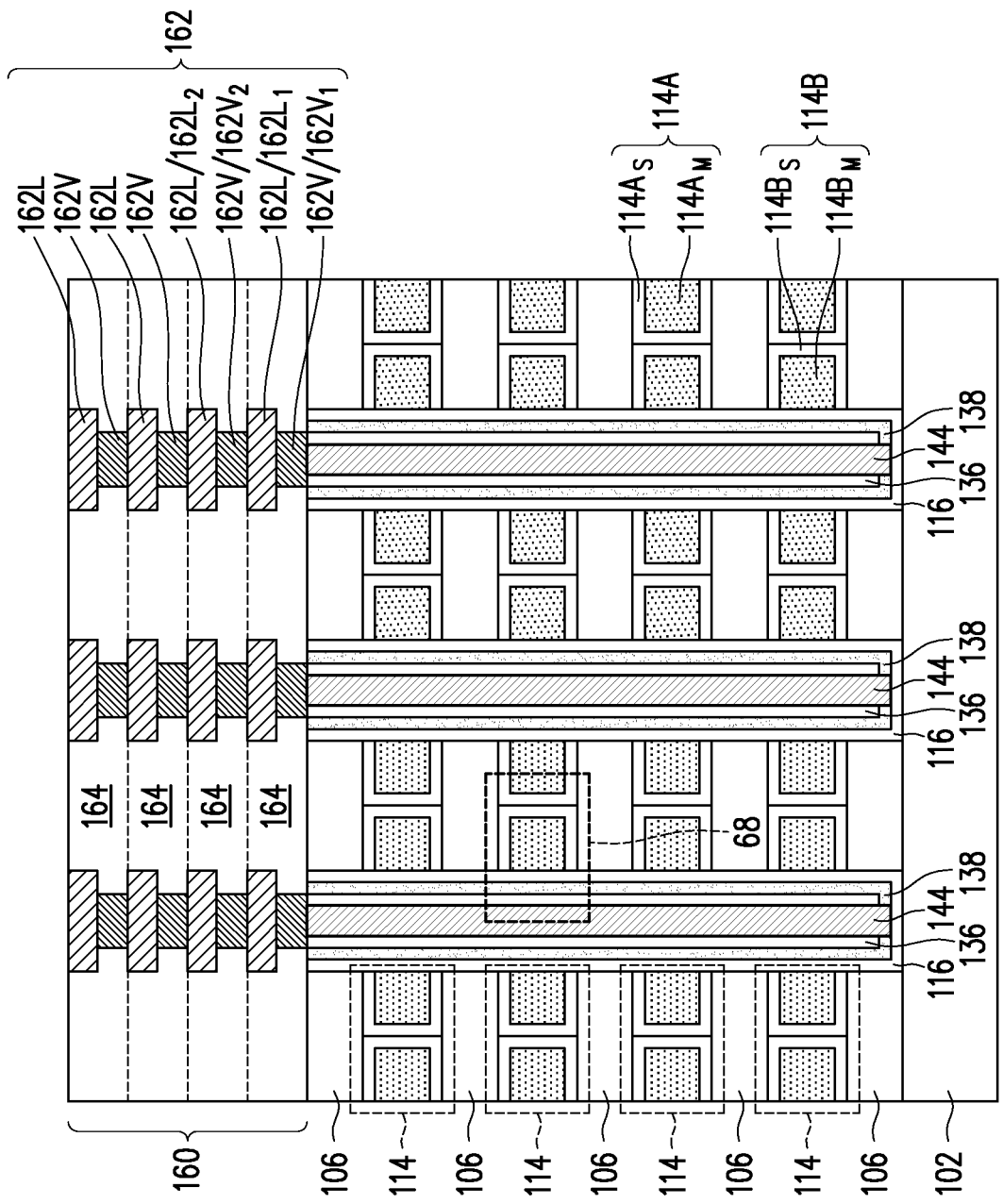
Figure 20C:
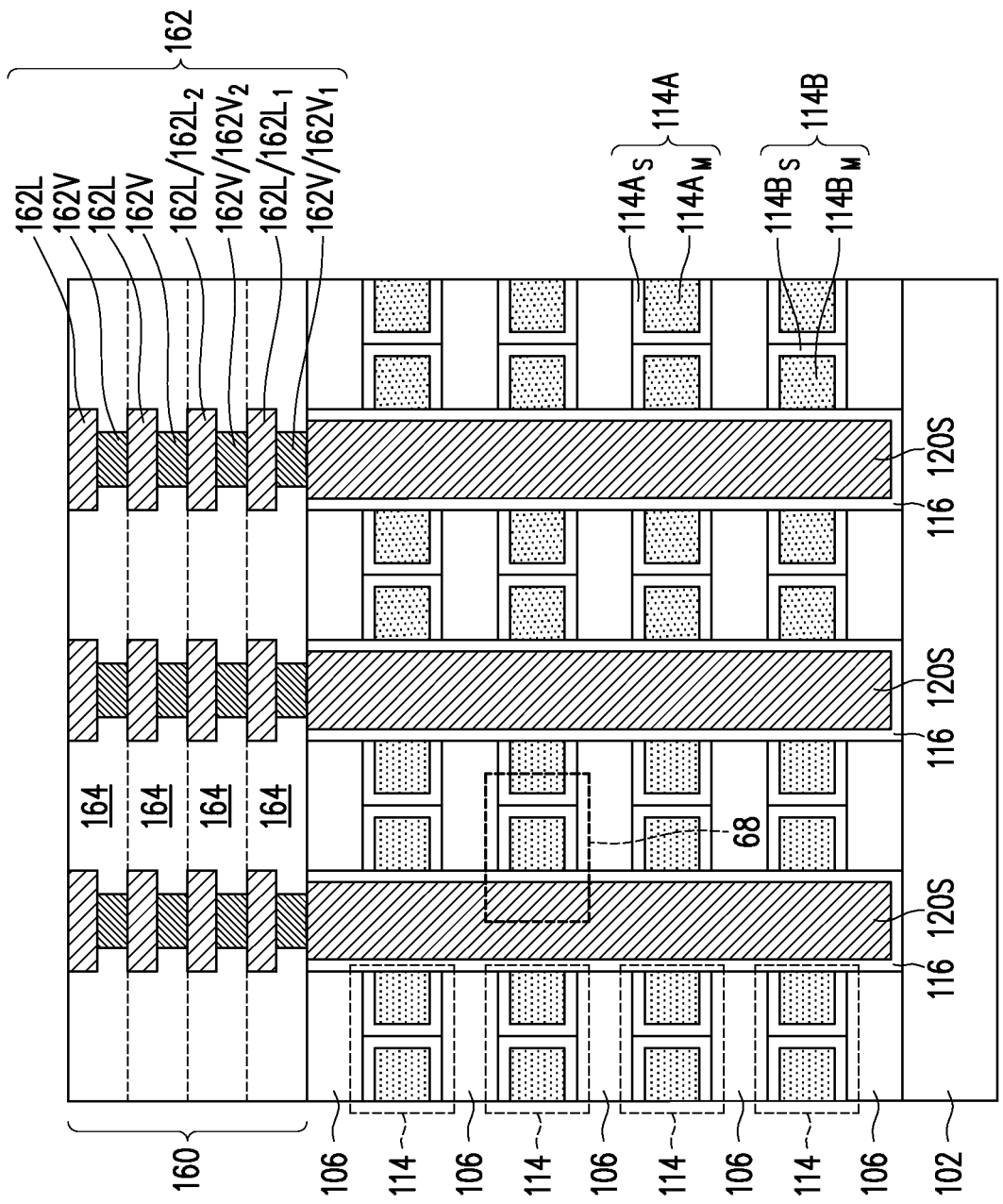

In FIGS. 20A, 20B, and 20C, an interconnect structure 160 is formed over the intermediate structure. The interconnect structure 160 may include, e.g., metallization patterns 162 in a dielectric material 164 (not shown in FIG. 20A, see FIGS. 20B and 20C). The dielectric material 164 may include one or more dielectric layers, such as one or more layers of a low-k (LK) or an extra low-K (ELK) dielectric material. The metallization patterns 162 may be metal interconnects (e.g., conductive lines 162L, conductive vias 162V, etc.) formed in the one or more dielectric layers. The interconnect structure 160 may be formed by a damascene process, such as a single damascene process, a dual damascene process, or the like. The metallization patterns 162 of the interconnect structure 160 are electrically connected to the bit lines 120B/source lines 120S, and interconnect the TFTs 68 to form functional memories.

Figure 21A:
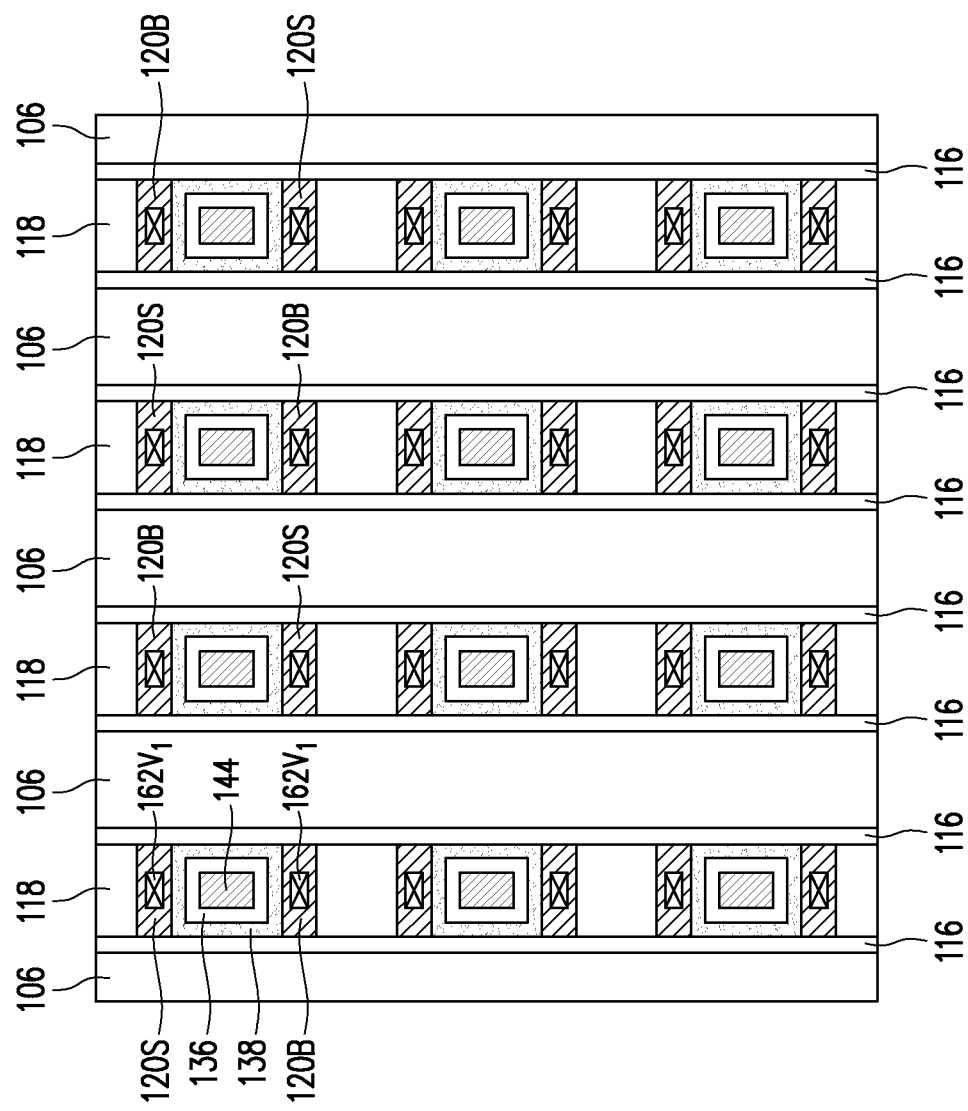
FIGS. 21A through 21D are top-down views of a memory array, in accordance with some embodiments.
Figure 21B:
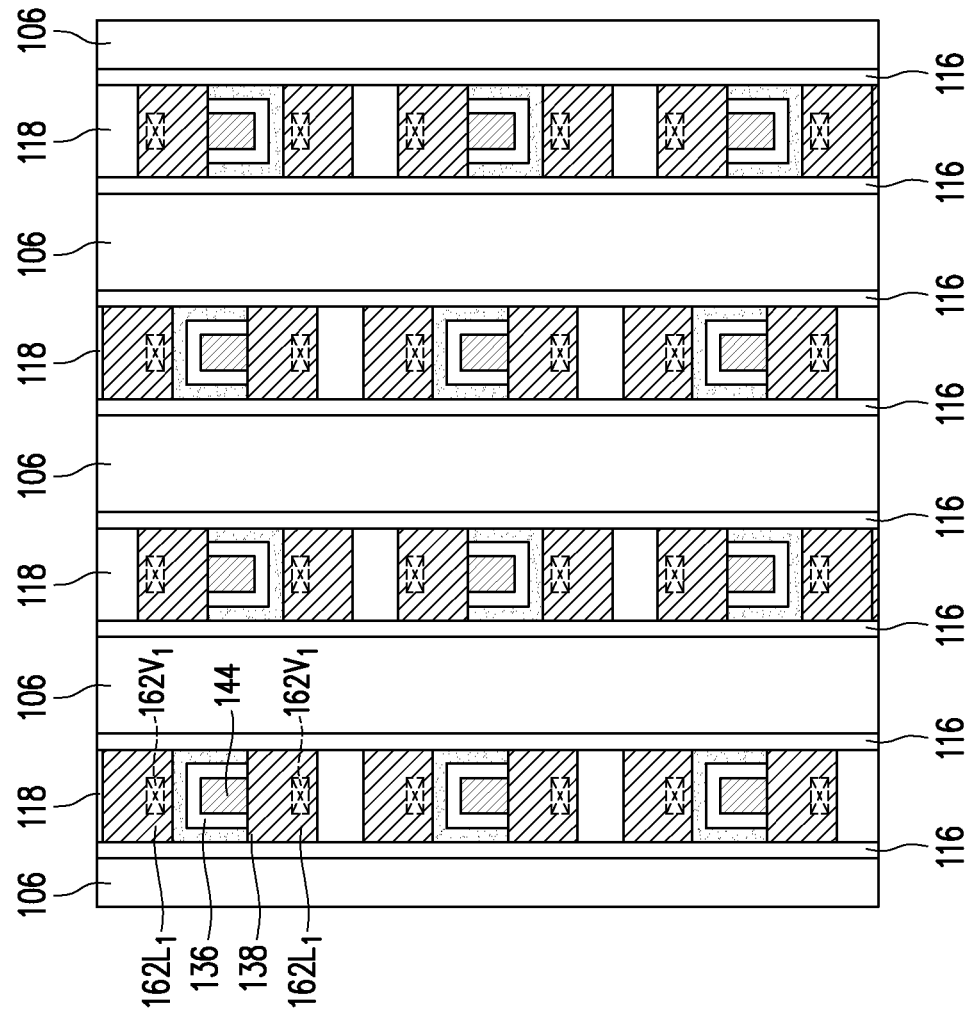
Figure 21C:
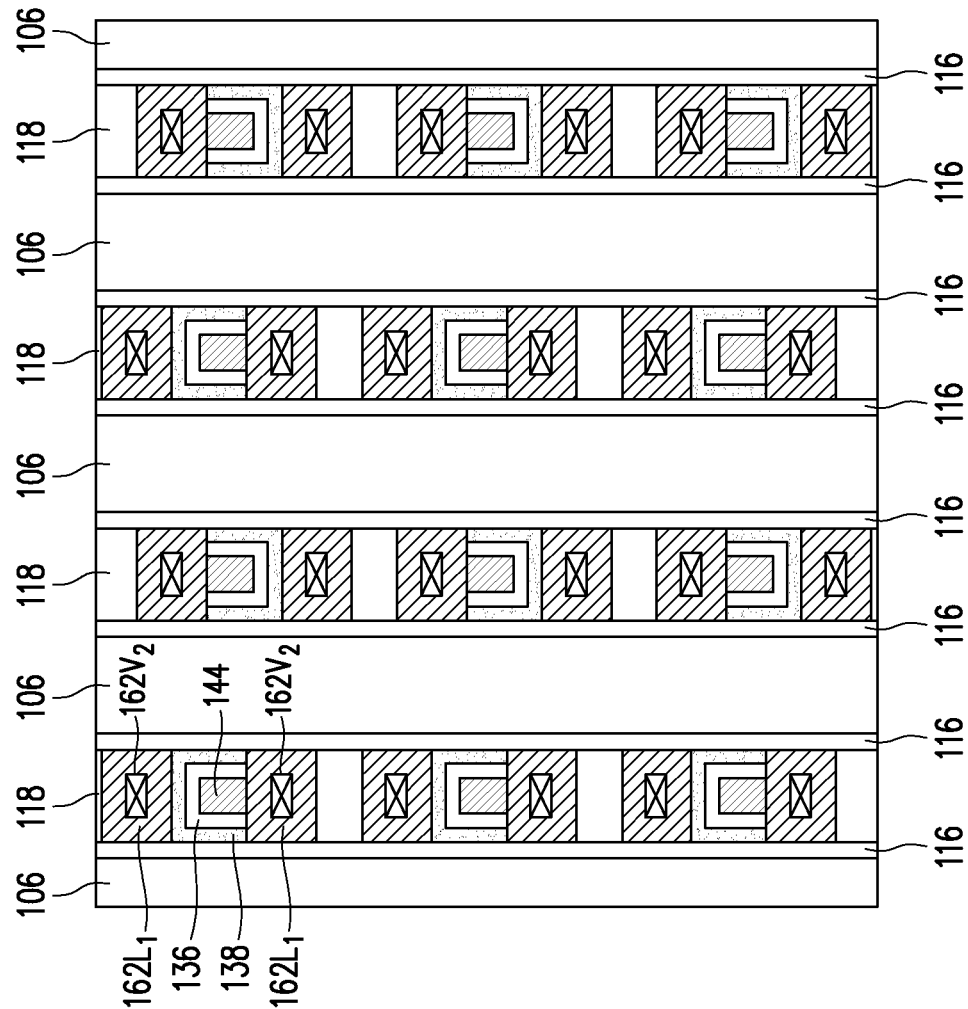
Figure 21D:
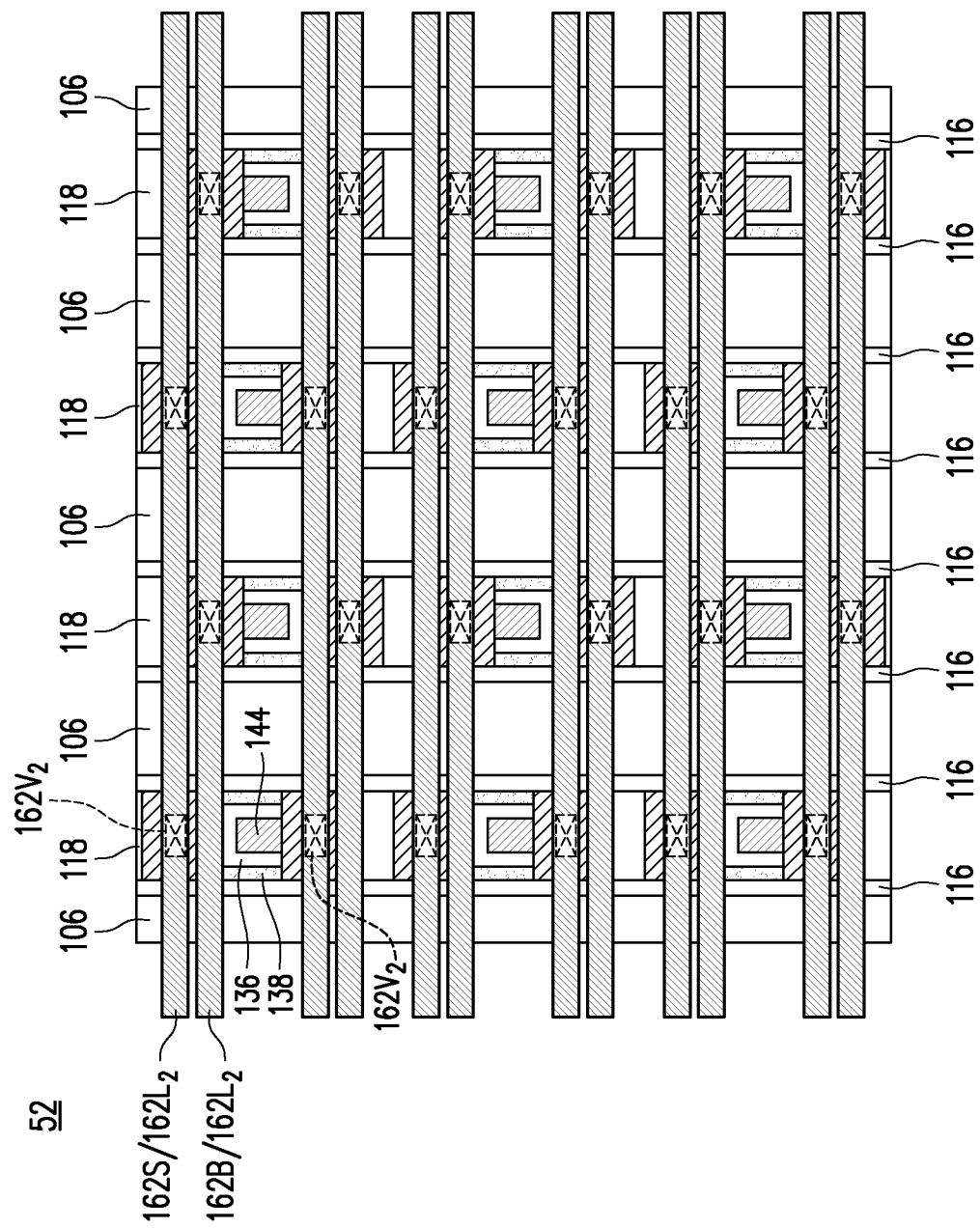

FIGS. 21A through 21D are top-down views of a memory array 52, in accordance with some embodiments. Some features of an interconnect structure are illustrated. FIG. 21A illustrates conductive vias at a first level of an interconnect structure (e.g., first-level conductive vias $162V_1$ in FIGS. 20B and 20C). FIG. 21B illustrates conductive lines at a first level of an interconnect structure (e.g., first-level conductive lines $162L_1$ in FIGS. 20B and 20C). FIG. 21C illustrates conductive vias at a second level of an interconnect structure (e.g., second-level conductive vias $162V_2$ in FIGS. 20B and 20C). FIG. 21D illustrates conductive lines at a second level of an interconnect structure (e.g., second-level conductive lines $162L_2$ in FIGS. 20B and 20C).

Referring to FIG. 21A, the conductive vias $162V_1$ are over and connected to the bit lines 120B/source lines 120S. The bit lines 120B and the source lines 120S are formed in an alternating pattern along rows and columns of the memory array 52, in the top-down view. Forming the bit lines 120B and the source lines 120S in an alternating pattern helps avoid shorting of adjacent bit lines 120B/source lines 120S when a word line 114 (see FIGS. 20B and 20C) is activated. In this embodiment, adjacent bit lines 120B and adjacent source lines 120S are laterally aligned with one another along the first direction $D_1$ (see FIGS. 2A and 2B). In some embodiments, the center of each conductive via $162V_1$ is laterally aligned with the center of the respective underlying bit line 120B/source line 120S.

Referring to FIG. 21B, the conductive lines $162L_1$ are over and connected to the conductive vias $162V_1$. The conductive lines $162L_1$ extend in the first direction $D_1$ (see FIGS. 2A and 2B) and laterally offset the interconnection to the underlying bit lines/source lines. In other words, the conductive lines $162L_1$ connected to the bit lines 120B (see FIG. 21A) are laterally offset from the conductive lines $162L_1$ connected to the source lines 120S (see FIG. 21A) along the second direction $D_2$ (see FIGS. 2A and 2B).

Referring to FIG. 21C, the conductive vias $162V_2$ are over and connected to the conductive lines $162L_1$. Because the conductive lines $162L_1$ laterally offset the interconnection to the underlying bit lines/source lines, the center of each conductive via $162V_2$ is thus laterally offset from the center of the respective underlying bit line/source line and from the center of the respective underlying conductive via $162V_1$. The conductive vias $162V_2$ can be larger than (e.g., have greater widths than) the conductive vias $162V_1$.

Referring to FIG. 21D, the conductive lines $162L_2$ are over and connected to the conductive vias $162V_2$. The conductive lines $162L_2$ include bit line interconnects 162B (which are connected to the bit lines 120B, see FIG. 21A) and source line interconnects 162S (which are connected to the source lines 120S, see FIG. 21A). Because the conductive lines $162L_1$ (see FIG. 21C) laterally offset the interconnection to the underlying bit lines/source lines, the bit line interconnects 162B and the source line interconnects 162S can thus be straight conductive segments that extend in the second direction $D_2$ (see FIGS. 2A and 2B).

Figure 22A:
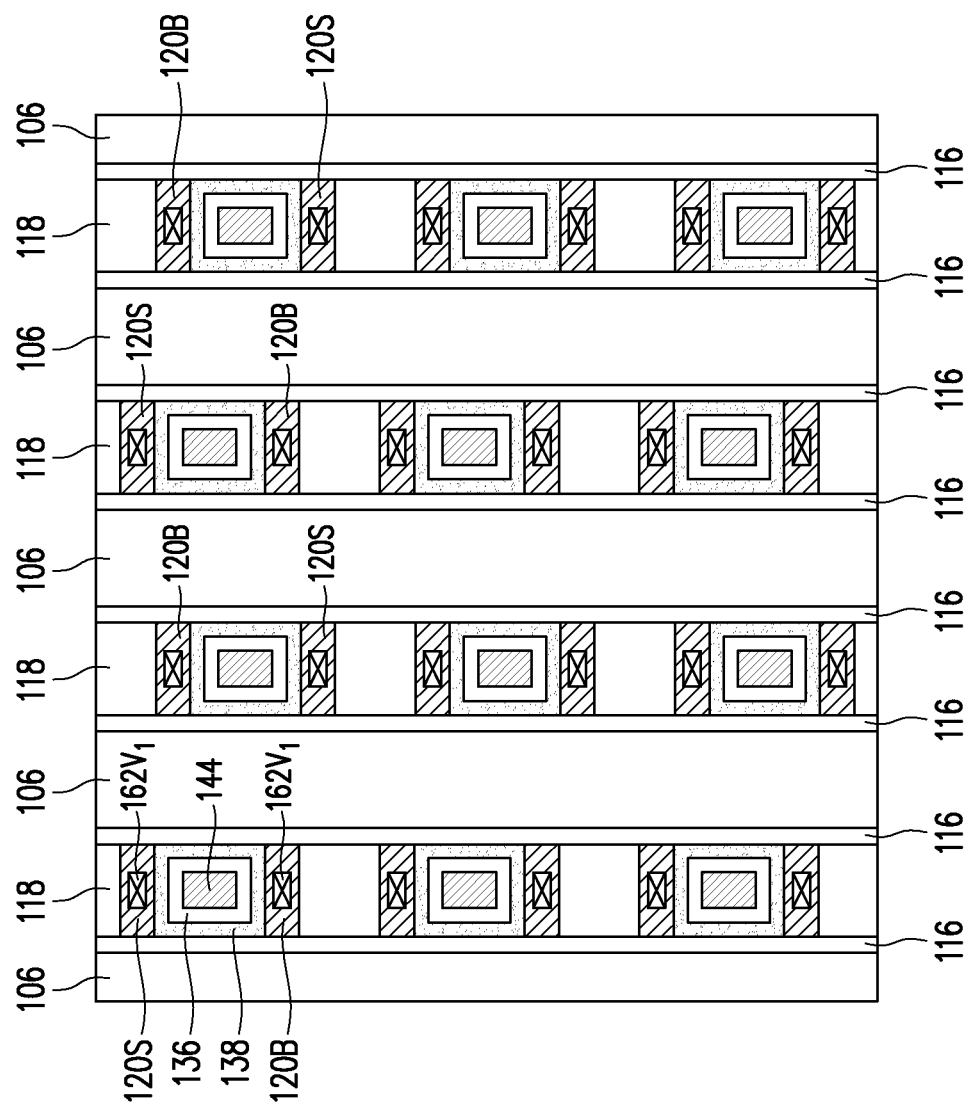
FIGS. 22A and 22B are top-down views of a memory array, in accordance with some embodiments.
Figure 22B:
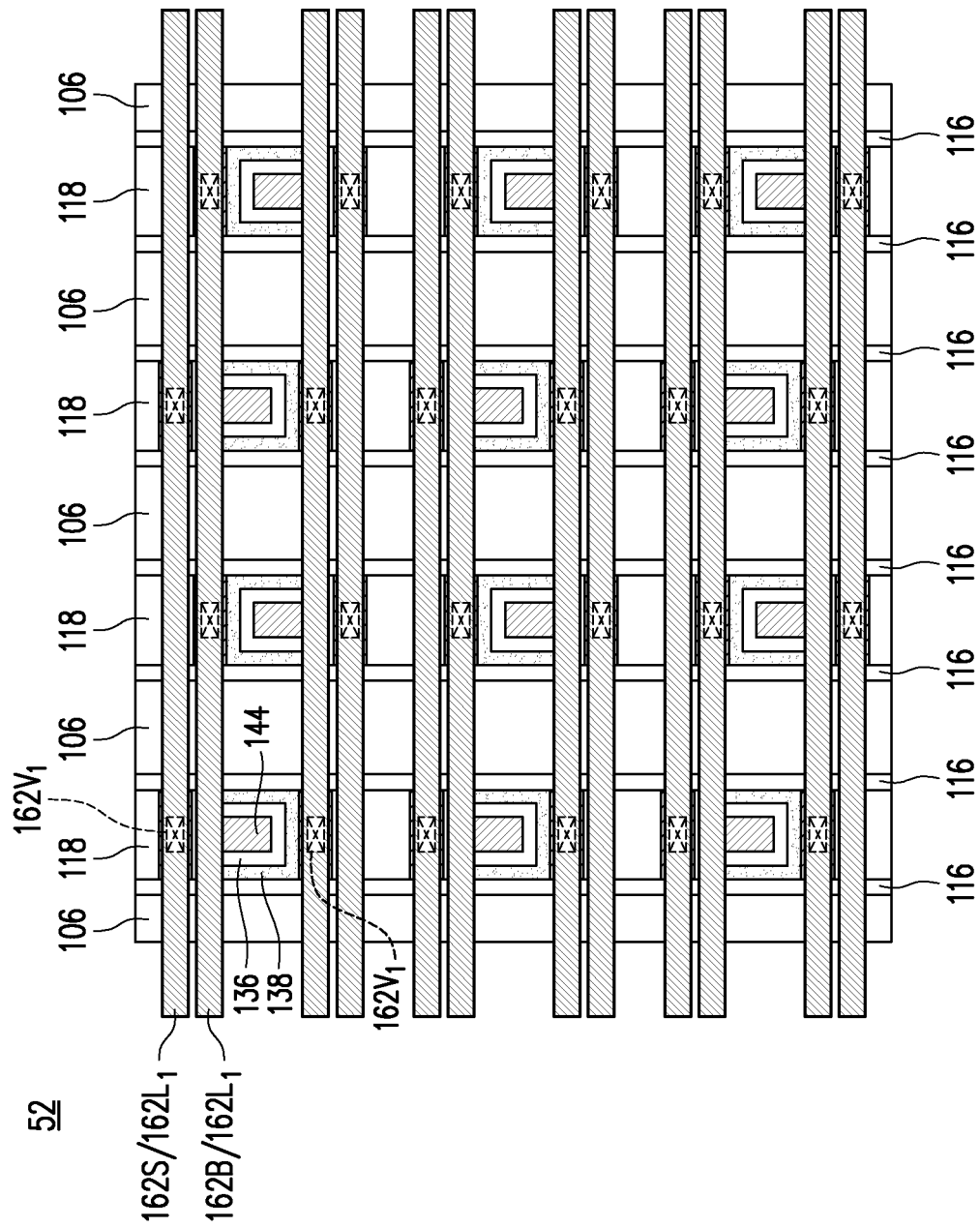

FIGS. 22A and 22B are top-down views of a memory array 52, in accordance with some embodiments. Some features of an interconnect structure are illustrated. FIG. 22A illustrates conductive vias at a first level of an interconnect structure (e.g., first-level conductive vias $162V_1$ in FIGS. 20B and 20C). FIG. 22B illustrates conductive lines at a first level of an interconnect structure (e.g., first-level conductive lines $162L_1$ in FIGS. 20B and 20C).

Referring to FIG. 22A, in this embodiment, the bit lines 120B and the source lines 120S are formed in a staggered layout. In other words, the bit lines 120B and the source lines 120S are still formed in an alternating pattern, but adjacent bit lines 120B and adjacent source lines 120S are also laterally offset from one another along the first direction $D_1$ (see FIGS. 2A and 2B). The conductive vias $162V_1$ are over and connected to the bit lines 120B/source lines 120S.

Referring to FIG. 22B, the conductive lines $162L_1$ are over and connected to the conductive vias $162V_1$. The conductive lines $162L_1$ include bit line interconnects 162B (which are connected to the bit lines 120B, see FIG. 22A) and source line interconnects 162S (which are connected to the source lines 120S, see FIG. 22A). Because the bit lines 120B and the source lines 120S are formed in a staggered layout, lateral interconnects may be omitted from the interconnect structure, and so the bit line interconnects 162B and the source line interconnects 162S can be formed at a lowest level of the interconnect structure over the bit lines 120B/source lines 120S.

In the embodiments described above for FIGS. 3A through 20C, the memory array 52 is formed over a substrate 102, such as a dielectric substrate. In some embodiments, the memory array 52 is formed as part of a standalone device (e.g., a memory die), which is integrated with other devices (e.g., a logic die) through device packaging. In some embodiments, the memory array 52 is embedded in another device, such as a logic die. In such embodiments, the substrate 102 may be omitted, or may be an underlying layer, such as an underlying dielectric layer, an underlying semiconductor substrate, or the like.

Figure 23A:
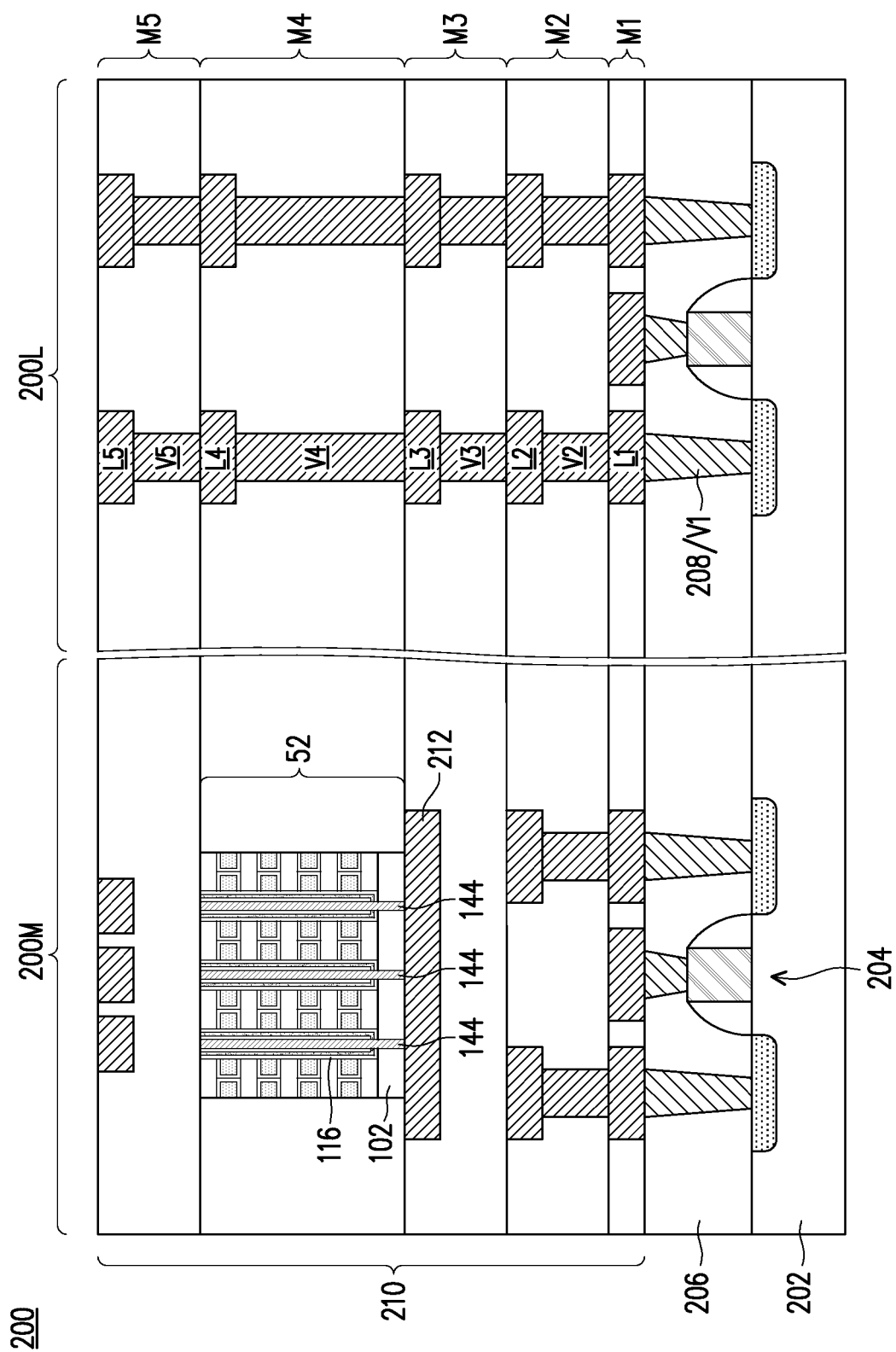
FIGS. 23A, 23B, and 24 are cross-sectional views of a semiconductor device, in accordance with some embodiments.
Figure 23B:
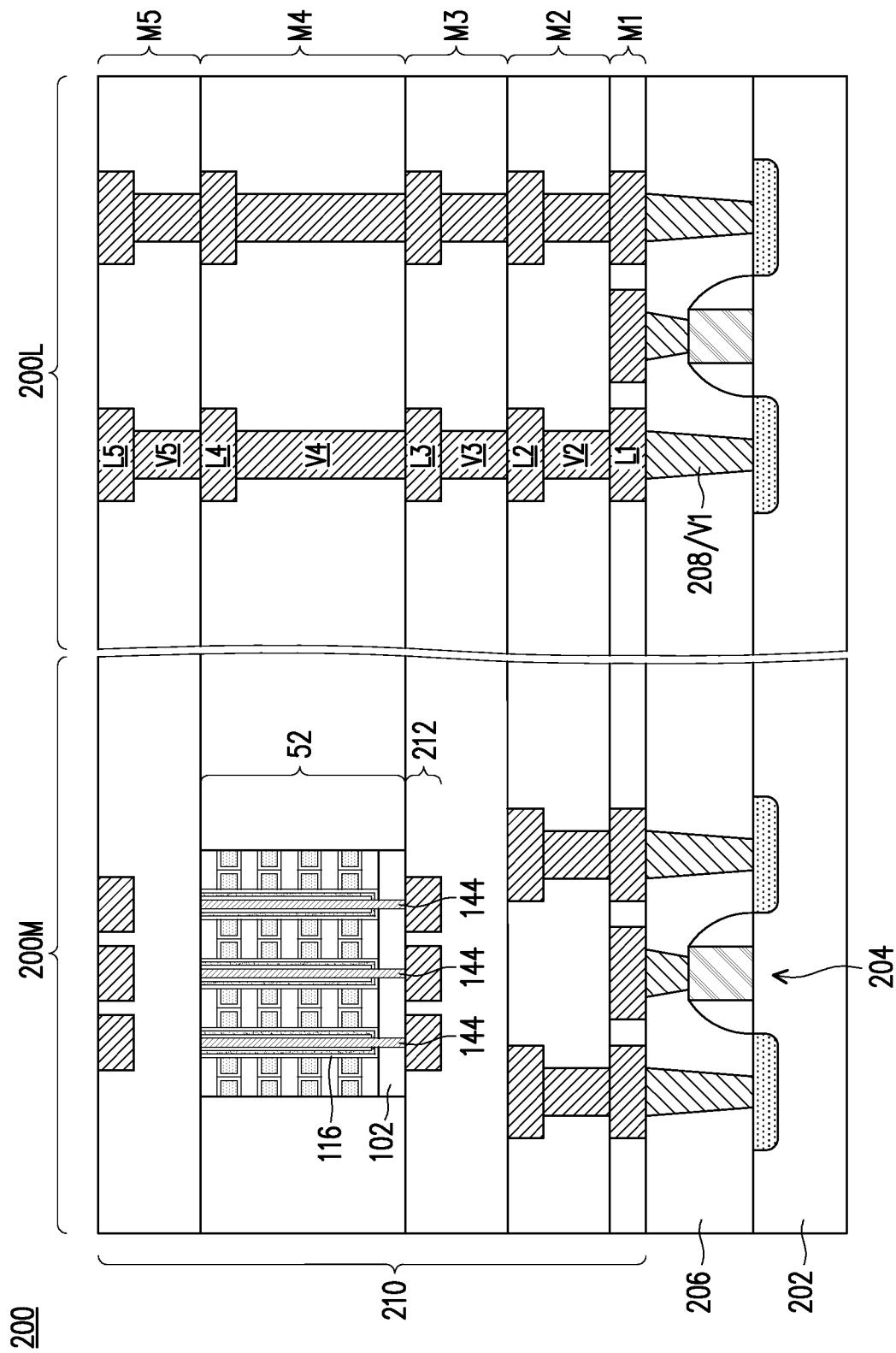
Figure 24:
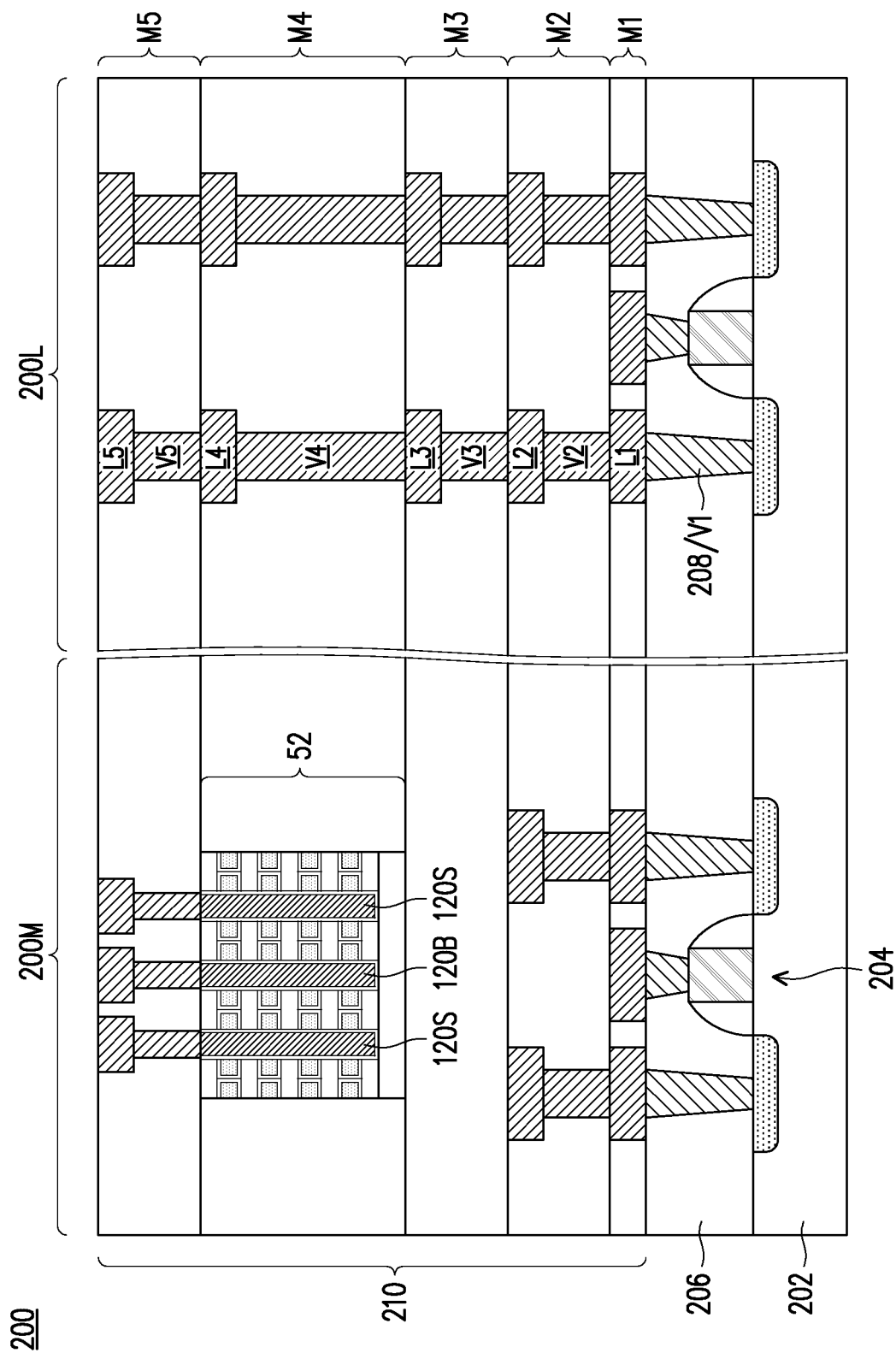

FIGS. 23A, 23B, and 24 are cross-sectional views of a semiconductor device 200, in accordance with some embodiments. FIGS. 23A and 23B are shown along a similar cross-section as FIG. 20B. FIG. 24 is shown along a similar cross-section as FIG. 20C. FIGS. 23, 24A, and 24B are simplified views, and some features are omitted for clarity of illustration. The semiconductor device 200 includes a logic region 200L and a memory region 200M. Memory devices (e.g., flash memories) are formed in the memory region 200M and logic devices (e.g., logic circuits) are formed in the logic region 200L. For example, a memory array 52 (see FIG. 1) can be formed in the memory region 200M, and the row decoder 54 and the column decoder 56 (see FIG. 1) can be formed in the logic region 200L. The memory region 200M can be disposed at an edge of the logic region 200L, or the logic region 200L can surround the memory region 200M.

The logic region 200L and the memory region 200M are formed over a same semiconductor substrate 202. The semiconductor substrate 202 may be silicon, doped or undoped, or an active layer of a semiconductor-on-insulator (SOI) substrate. The semiconductor substrate 202 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 204 are formed at the active surface of the semiconductor substrate 202. The devices 204 may be active devices or passive devices. For example, the electrical components may be transistors, diodes, capacitors, resistors, or the like, formed by any suitable formation method. The devices 204 are interconnected to form the memory devices and logic devices of the semiconductor device 200.

One or more inter-layer dielectric (ILD) layer(s) 206 are formed on the semiconductor substrate 202, and electrically conductive features, such as contact plugs 208, are formed electrically connected to the devices 204. The ILD layer(s) 206 may be formed of any suitable dielectric material, for example, a an oxide such as silicon oxide, phosphosilicate glass (PSG), borosilicate glass (BSG), boron-doped phosphosilicate glass (BPSG), or the like; nitride such as silicon nitride; or the like. The ILD layer(s) may be formed by any acceptable deposition process, such as spin coating, physical vapor deposition (PVD), chemical vapor deposition (CVD), the like, or a combination thereof. The electrically conductive features in the ILD layer(s) may be formed through any suitable process, such as deposition, damascene (e.g., single damascene, dual damascene, etc.), the like, or combinations thereof.

An interconnect structure 210 is formed over the semiconductor substrate 202. The interconnect structure 210 interconnects the devices 204 to form integrated circuits in each of the logic region 200L and memory region 200M. The interconnect structure 210 includes multiple metallization layers M1-M5. Although five metallization layers are illustrated, it should be appreciated that more or less metallization layers may be included. Each of the metallization layers M1-M5 includes metallization patterns in dielectric layers. The metallization patterns are connected to the devices 204 of the semiconductor substrate 202, and include, respectively, metal lines L1-L5 and metal vias V1-V5 formed in one or more inter-metal dielectric (IMD) layers. The interconnect structure 210 may formed by a damascene process, such as a single damascene process, a dual damascene process, or the like. In some embodiments, the contact plugs 208 are also part of the metallization patterns, such as part of the lowest layer of metal vias V1.

In this embodiment, the memory array 52 is formed in the interconnect structure 210. The memory array 52 can be formed in any of the metallization layers M1-M5, and is illustrated as being formed in an intermediate metallization layer M4, although it could also be formed in lower metallization layers M1-M3 or an upper metallization layer M5. The memory array 52 is electrically connected to the devices 204. For example, a metallization layer overlying the memory array 52 (e.g., the metallization layer M5) may contain interconnects to the source lines 120S and the bit lines 120B (see FIG. 24) of the memory array 52. Similarly, a metallization layer underlying the memory array 52 (e.g., the metallization layer M3) may contain interconnects to the back gates 144 (see FIGS. 23A and 2B) of the memory array 52.

In some embodiments, the interconnect structure 210 may be formed by first forming the layers underlying the memory array 52, e.g., the metallization layers M1-M3. The memory array 52 can then be formed on the metallization layer M3, with the substrate 102 being an etch stop layer on the IMD of the metallization layer M3. After formation of the memory array 52, the remainder of the metallization layer M4 can be formed, such as by depositing and planarizing the IMD for the metallization layer M4, and then forming metal lines L4 and metal vias V4. The layers overlying the memory array 52, e.g., the metallization layer M5, can then be formed.

The back gates 144 are connected to underlying conductive lines by extending the openings for the back gates 144 through the tunneling strips 116 and the substrate 102, in a similar manner as discussed above for FIGS. 17A and 17B. In the embodiment of FIG. 23A, multiple back gates 144 are connected to a single underlying conductive line (e.g., a back gate interconnect 212), and thus multiple back gates 144 can be connected to and controlled by a single device 204, e.g., a single transistor. In the embodiment of FIG. 23B, each back gate 144 is connected to a different underlying conductive line (e.g., back gate interconnects 212), and thus each back gate 144 can be connected to and controlled by its own device 204, e.g., its own transistor. In other words, each back gate 144 can be the only back gate 144 connected to an underlying back gate interconnect 212, or can be one of a plurality of back gates 144 connected to an underlying back gate interconnect 212.

Embodiments may achieve advantages. The back gates 144 can help control the surface potential of the semiconductor strips 138 (particularly the portions of the semiconductor strips 138 distal the word lines 114) during write operations. For example, the work function of the material (e.g., tungsten) of the back gates 144 can help reduce the surface potential of the semiconductor strips 138. The window for write operations may thus be widened. Further, during a write operation, a biasing voltage can be applied to a back gate 144, thereby increasing the write voltage applied across a corresponding tunneling strip 116 during the write operation. The performance of the memory array 52 may thus be improved.

In an embodiment, a method includes: forming a word line between a pair of first dielectric layers; depositing a data storage layer on sidewalls of the first dielectric layers and a sidewall of the word line; forming a first isolation region on the data storage layer; patterning a first opening in the first isolation region; and forming a channel layer and a back gate in the first opening, the back gate surrounded by the channel layer.

In some embodiments of the method, forming the channel layer and the back gate includes: forming the channel layer in a first portion of the first opening; and after forming the channel layer, forming the back gate in a second portion of the first opening. In some embodiments of the method, forming the channel layer includes: depositing a semiconductor layer in the first opening; depositing a second dielectric layer over the semiconductor layer; patterning the second dielectric layer with a first etching process to form an second isolation region, the first etching process using the semiconductor layer as an etch stop layer; and patterning the semiconductor layer with a second etching process to form the channel layer, the second etching process using the second isolation region as an etching mask. In some embodiments, the method further includes: after patterning the semiconductor layer, extending the first opening through the data storage layer. In some embodiments of the method, forming the back gate includes: depositing a conductive layer over the channel layer and in the first opening; and removing portions of the conductive layer over the channel layer, the back gate including portions of the conductive layer remaining in the first opening. In some embodiments of the method, the conductive layer is formed of tungsten. In some embodiments of the method, forming the word line includes: etching a first trench in a multilayer stack, the multilayer stack including the first dielectric layers and a sacrificial layer between the first dielectric layers; replacing a first portion of the sacrificial layer exposed by the first trench with a first conductive feature; etching a second trench in the multilayer stack; and replacing a second portion of the sacrificial layer exposed by the second trench with a second conductive feature, the word line including the first conductive feature and the second conductive feature. In some embodiments of the method, depositing the data storage layer includes: before etching the second trench in the multilayer stack, depositing the data storage layer in the first trench.

In an embodiment, a device includes: a source line extending in a first direction; a bit line extending in the first direction; a back gate between the source line and the bit line, the back gate extending in the first direction; a channel layer surrounding the back gate; a word line extending in a second direction, the second direction perpendicular to the first direction; and a data storage layer extending along the word line, the data storage layer between the word line and the channel layer, the data storage layer between the word line and the bit line, the data storage layer between the word line and the source line.

In some embodiments, the device further includes: an isolation region surrounding the back gate, the isolation region separating the back gate from the channel layer. In some embodiments of the device, the data storage layer includes a ferroelectric material, and each of the back gate, the bit line, the source line, and the word line include a metal. In some embodiments of the device, the back gate extends through the channel layer. In some embodiments, the device further includes: a source line interconnect over and connected to the source line; a bit line interconnect over and connected to the bit line; and a back gate interconnect under and connected to the back gate. In some embodiments of the device, the back gate is the only back gate connected to the back gate interconnect. In some embodiments of the device, the back gate is one of a plurality of back gates connected to the back gate interconnect.

In an embodiment, a device includes: a back gate extending in a first direction; an isolation region surrounding the back gate; a channel layer surrounding the isolation region;

a data storage layer contacting the channel layer; and a word line extending in a second direction, the second direction perpendicular to the first direction, the word line including a first main layer, a second main layer, and a seed layer, the seed layer laterally disposed between the first main layer and the second main layer, the first main layer contacting the data storage layer.

In some embodiments, the device further includes: a source line extending in the first direction, the source line contacting the data storage layer; and a bit line extending in the first direction, the bit line contacting the data storage layer, where each of the back gate, the isolation region, and the channel layer are disposed between the bit line and the source line. In some embodiments, the device further includes: a source line interconnect over and connected to the source line; a bit line interconnect over and connected to the bit line; and a back gate interconnect under and connected to the back gate. In some embodiments of the device, the first main layer and the second main layer have different widths. In some embodiments of the device, the first main layer and the second main layer have the same width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a word line between a pair of first dielectric layers;
    depositing a data storage layer on sidewalls of the first dielectric layers and a sidewall of the word line;
    forming a first isolation region on the data storage layer;
    forming a source line and a bit line through the first isolation region;
    after forming the source line and the bit line, removing a portion of the first isolation region between the source line and the bit line to form an opening; and
    forming a channel layer and a back gate in the opening between the source line and the bit line, the back gate surrounded by the channel layer.

2. The method of claim 1, wherein forming the channel layer and the back gate comprises:
    forming the channel layer in a first portion of the opening; and
    forming the back gate in a second portion of the opening.

3. The method of claim 2, wherein forming the channel layer comprises:
    depositing a semiconductor layer in the opening;
    depositing a second dielectric layer over the semiconductor layer;
    patterning the second dielectric layer with a first etching process to form a second isolation region, the first etching process using the semiconductor layer as an etch stop layer; and
    patterning the semiconductor layer with a second etching process to form the channel layer, the second etching process using the second isolation region as an etching mask.

4. The method of claim 3 further comprising:
    after patterning the semiconductor layer, extending the opening through the data storage layer.

5. The method of claim 2, wherein forming the back gate comprises:
    depositing a conductive layer over the channel layer and in the opening; and
    removing portions of the conductive layer over the channel layer, the back gate comprising portions of the conductive layer remaining in the opening.

6. The method of claim 5, wherein the conductive layer is formed of tungsten.

7. The method of claim 1, wherein forming the word line comprises:
    etching a first trench in a multilayer stack, the multilayer stack comprising the first dielectric layers and a sacrificial layer between the first dielectric layers;
    replacing a first portion of the sacrificial layer exposed by the first trench with a first conductive feature;
    after replacing the first portion of the sacrificial layer, etching a second trench in the multilayer stack; and
    replacing a second portion of the sacrificial layer exposed by the second trench with a second conductive feature, the word line comprising the first conductive feature and the second conductive feature.

8. A method comprising:
    depositing a tunneling strip on a sidewall of a word line;
    forming an isolation region on the tunneling strip;
    forming a source line and a bit line in the isolation region, the tunneling strip disposed between the source line and the word line, the tunneling strip disposed between the bit line and the word line;
    removing a portion of the isolation region between the source line and the bit line to form an opening; and
    forming a semiconductor strip and a back gate in the opening, the back gate surrounded by the semiconductor strip, the tunneling strip disposed between the semiconductor strip and the word line.

9. The method of claim 8, wherein forming the semiconductor strip and the back gate comprises:
    depositing a semiconductor layer in the opening;
    patterning the semiconductor layer to form the semiconductor strip;
    depositing a conductive layer on the semiconductor strip and in the opening; and
    patterning the conductive layer to form the back gate.

10. The method of claim 9, wherein the conductive layer is deposited after the semiconductor layer is patterned.

11. The method of claim 8 further comprising:
    interconnecting the word line, the source line, the bit line, and the back gate.

12. The method of claim 8 further comprising:
    forming a dielectric layer in the opening, the dielectric layer disposed between the back gate and the semiconductor strip.

13. The method of claim 8, wherein the semiconductor strip is formed on a sidewall of the source line and on a sidewall of the bit line.

14. A method comprising:
    forming a first portion of a word line;
    depositing a first tunneling strip on a first sidewall of the first portion of the word line;
    after depositing the first tunneling strip, forming a second portion of the word line;
    depositing a second tunneling strip on a second sidewall of the second portion of the word line;

forming a first semiconductor strip and a second semiconductor strip on the first tunneling strip and the second tunneling strip, respectively; and after forming the first semiconductor strip and the second semiconductor strip, forming a first back gate and a second back gate, the first back gate surrounded by the first semiconductor strip, the second back gate surrounded by the second semiconductor strip.

15. The method of claim 14, wherein the first back gate is laterally aligned with the second back gate.

16. The method of claim 14, wherein the first back gate is laterally offset from the second back gate.

17. The method of claim 14 further comprising:
interconnecting the word line, the first back gate, and the second back gate.

18. The method of claim 14, wherein the first tunneling strip and the second tunneling strip are formed of a ferroelectric material, and wherein the word line, the first back gate, and the second back gate are formed of tungsten.

19. The method of claim 14, wherein the first semiconductor strip and the second semiconductor strip are formed simultaneously.

20. The method of claim 14, further comprising:
forming a first isolation region and a second isolation region on the first tunneling strip and the second tunneling strip, respectively; and forming a first opening and a second opening in the first isolation region and the second isolation region, respectively, the first semiconductor strip formed in the first opening, the second semiconductor strip formed in the second opening.

\* \* \* \* \*